United States Patent
Kuwajima et al.

(10) Patent No.: US 10,553,734 B2
(45) Date of Patent: Feb. 4, 2020

(54) SEMICONDUCTOR DEVICE AND MANUFACTURING METHOD THEREOF

(71) Applicant: Renesas Electronics Corporation, Koutou-ku, Tokyo (JP)

(72) Inventors: Teruhiro Kuwajima, Ibaraki (JP); Shinichi Watanuki, Ibaraki (JP); Futoshi Komatsu, Ibaraki (JP); Tomoo Nakayama, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/980,661

(22) Filed: May 15, 2018

(65) Prior Publication Data

US 2019/0006535 A1    Jan. 3, 2019

(30) Foreign Application Priority Data

Jun. 29, 2017 (JP) .................................. 2017-127366

(51) Int. Cl.
*H01L 31/02* (2006.01)
*H01L 31/028* (2006.01)
(Continued)

(52) U.S. Cl.
CPC .......... *H01L 31/02327* (2013.01); *G02B 6/43* (2013.01); *G02F 1/025* (2013.01);
(Continued)

(58) Field of Classification Search
CPC ......... H01L 31/02002; H01L 31/02005; H01L 31/02013; H01L 31/02024;
(Continued)

(56) References Cited

U.S. PATENT DOCUMENTS

2009/0022500 A1* 1/2009 Pinguet ................ G02B 6/1228
                                                                398/164
2010/0054653 A1* 3/2010 Carothers .............. G02B 6/122
                                                                 385/1
(Continued)

OTHER PUBLICATIONS

Andy Eu-Jin Lim et al., "Review of Silicon Photonics Foundry Efforts", IEEE Journal of Selected Topics in Quantum Electronics, vol. 20, No. 4, Jul./Aug. 2014, 8300112.

*Primary Examiner* — Natalia A Gondarenko
(74) *Attorney, Agent, or Firm* — Shapiro, Gabor and Rosenberger, PLLC

(57) ABSTRACT

An improvement is achieved in the reliability of a semiconductor device. Over an insulating layer, an optical waveguide and a p-type semiconductor portion are formed. Over the p-type semiconductor portion, a multi-layer body including an n-type semiconductor portion and a cap layer is formed. Over a first interlayer insulating film covering the optical waveguide, the p-type semiconductor portion, and the multi-layer body, a heater located over the optical waveguide is formed. In the first interlayer insulating film, first and second contact holes are formed. A first contact portion electrically coupled with the p-type semiconductor portion is formed continuously in the first contact hole and over the first interlayer insulating film. A second contact portion electrically coupled with the cap layer is formed continuously in the second contact hole and over the first interlayer insulating film. A wire formed over a second interlayer insulating film is electrically coupled with the heater and the first and second contact portions via plugs embedded in the second interlayer insulating film.

20 Claims, 29 Drawing Sheets

(51) Int. Cl.
*H01L 31/18* (2006.01)
*H01L 23/48* (2006.01)
*H01L 23/522* (2006.01)
*H01L 31/024* (2014.01)
*H01L 31/0232* (2014.01)
*H01L 31/0352* (2006.01)
*H01L 27/12* (2006.01)
*G02B 6/122* (2006.01)
*G02F 1/025* (2006.01)
*G02B 6/43* (2006.01)

(52) U.S. Cl.
CPC ...... *H01L 31/024* (2013.01); *H01L 31/02005* (2013.01); *H01L 31/028* (2013.01); *H01L 31/1808* (2013.01)

(58) Field of Classification Search
CPC ....... H01L 31/02161; H01L 31/022433; H01L 31/024; H01L 31/0248; H01L 31/0256; H01L 31/0264; H01L 31/1808; H01L 31/028; H01L 31/02327; H01L 31/035272; H01L 31/03682; H01L 31/03762; H01L 31/03765; H01L 31/05; H01L 31/14; H01L 31/145; H01L 31/16; H01L 31/167; H01L 33/0012; H01L 33/0016; H01L 33/0054; H01L 27/307; H01L 27/301; H01L 27/281; H01L 27/144; H01L 27/1443; H01L 27/146; H01L 27/14601; H01L 27/14603; H01L 27/14607; H01L 27/1461; H01L 27/14636; H01L 27/14643; H01L 27/14647; H01L 27/1465; H01L 27/14678; H01L 27/14625; H01L 21/02107; H01L 21/02381; H01L 21/048; H01L 21/042; H01L 21/0425; H01L 21/2815; H01L 21/28132; H01L 21/311; H01L 21/31105; H01L 21/76877; H01L 21/76879–76883; H01L 21/743; H01L 21/76898; H01L 23/481; H01L 23/5384; G02B 6/10; G02B 6/43; G02B 6/122; G02B 6/132; G02B 6/136; G02B 6/12004; G02F 1/025
USPC ........... 257/432, 98, 351, 506; 438/481, 682
See application file for complete search history.

(56) References Cited

U.S. PATENT DOCUMENTS

| | | | |
|---|---|---|---|
| 2010/0059822 A1* | 3/2010 | Pinguet | H01L 21/84 257/351 |
| 2015/0125111 A1* | 5/2015 | Orcutt | G02B 6/122 385/14 |
| 2017/0077319 A1* | 3/2017 | Cheng | H01L 21/77 |
| 2017/0237229 A1* | 8/2017 | Menezo | G02F 1/025 385/3 |

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2017-127366 filed on Jun. 29, 2017 including the specification, drawings and abstract is incorporated herein by reference in its entirety.

BACKGROUND

The present invention relates to a semiconductor device and a manufacturing method thereof, and can be used appropriately for a semiconductor device in which, e.g., a silicon photonics device is embedded and a manufacturing method thereof.

In recent years, a silicon photonics technique has been developed. The silicon photonics technique couples an optical device and an electronic device to each other via an optical circuit using an optical waveguide made of silicon used as a material. A semiconductor device in which an optical device and an electronic device are thus coupled to each other using an optical circuit and mounted is referred to as an optical communication module.

Such semiconductor devices include a semiconductor device having, as a transmission line for an optical signal, an optical waveguide made of a semiconductor layer formed over a base via an insulating layer and an insulating film formed such that the insulating film covers the optical waveguide. At this time, the optical waveguide functions as a core layer, while the insulating layer and the insulating film function as a clad layer.

In Non-Patent Document 1, FIG. 1 shows a cross-sectional view of a silicon photonics platform having a germanium photodetector (Ge PD), a Si modulator (Si MOD), a Si waveguide (Si WG), and a TiN heater.

RELATED ART DOCUMENT

Non-Patent Document

[Non-Patent Document 1] Andy Eu-Jin Lim et al., "Review of Silicon Photonics Foundry Efforts", IEEE JOURNAL OF SELECTED TOPICS IN QUANTUM ELECTRONICS, VOL. 20, NO. 4, JULY/AUGUST 2014, 8300112

SUMMARY

The present inventors have been considering embedding an optical modulator and an optical receiver (photoelectric converter) in a semiconductor device to which a silicon photonics technique is applied and using heating involving the use of a heater for the optical modulator. In this case, it is necessary to couple various elements to wires, but the reliability of the semiconductor device deteriorates unless a coupling structure therefor is inventively improved.

Other objects and novel features of the present invention will become apparent from a statement in the present specification and the accompanying drawings.

According to an embodiment, a semiconductor device includes an insulating layer formed over a base, a first optical waveguide and a first semiconductor portion which are formed over the insulating layer, a second semiconductor portion formed over the first semiconductor portion, and a first interlayer insulating film formed over the insulating layer such that the first interlayer insulating film covers the first optical waveguide, the first semiconductor portion, and the second semiconductor portion. In the first interlayer insulating film, a first opening reaching the first semiconductor portion and a second opening reaching the second semiconductor portion are formed. The semiconductor device further includes a first coupling electrode formed continuously in the first opening and over the first interlayer insulating film and electrically coupled with the first semiconductor portion, a second coupling electrode formed continuously in the second opening and over the first interlayer insulating film and electrically coupled with the second semiconductor portion, and a heater portion formed over the first interlayer insulating film and over the first optical waveguide. Over the first interlayer insulating film, a second interlayer insulating film is formed such that the second interlayer insulating film covers the heater portion, the first coupling electrode, and the second coupling electrode. A first wire formed over the second interlayer insulating film is electrically coupled with the heater portion via a first conductive plug embedded in the second interlayer insulating film. A second wire formed over the second interlayer insulating film is electrically coupled with the first coupling electrode via a second conductive plug embedded in the second interlayer insulating film. A third wire formed over the second interlayer insulating film is electrically coupled with the second coupling electrode via a third conductive plug embedded in the second interlayer insulating film.

According to the embodiment, it is possible to improve the reliability of the semiconductor device.

DETAILED DESCRIPTION

Figure 1:
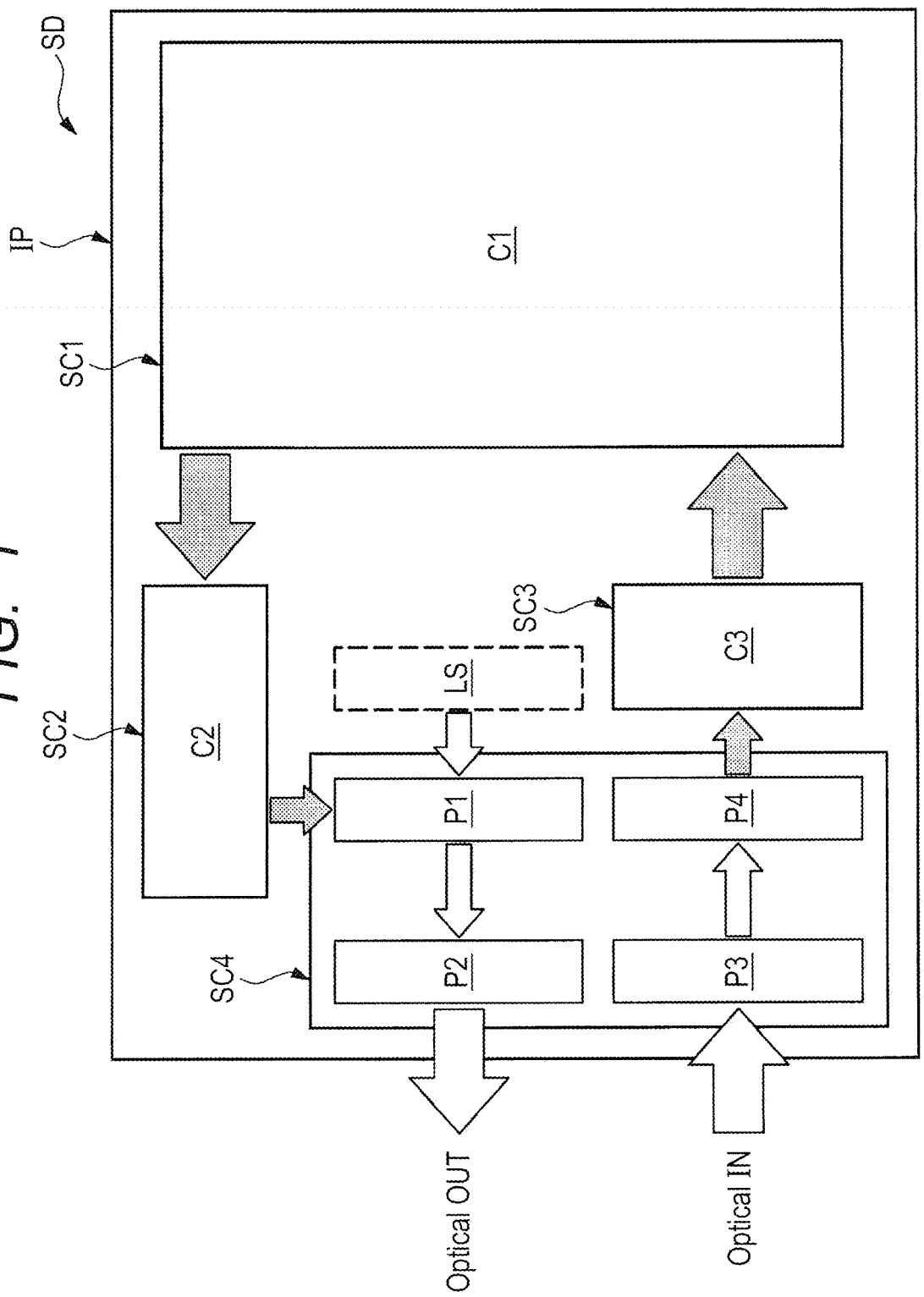
FIG. 1 is a schematic diagram showing an example of a configuration of an optical communication module according to an embodiment.

In each of the following embodiments, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in each of the following embodiments, when the number and the like (including the number, numerical value, amount, range, and the like) of elements are mentioned, they are not limited to specified numbers unless particularly explicitly described otherwise or unless they are obviously limited to the specified numbers in principle. The number and the like of the elements may be not less than or not more than the specified numbers. Also, in each of the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in each of the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even from a cross-sectional view for improved clarity of illustration. On the other hand, even a plan view may be hatched for improved clarity of illustration.

(First Embodiment)

[Example of Configuration of Optical Communication Module]

Using FIG. 1, a description will be given of an example of a configuration of an optical communication module according to the present first embodiment. FIG. 1 is a schematic diagram showing the example of the configuration of the optical communication module according to the present first embodiment. In FIG. 1, for easier understanding, the arrows hatched with dots show the flow of an electric signal, while the non-hatched arrows show the flow of an optical signal.

As shown in FIG. 1, data output from a silicon electronic circuit C1 in which, e.g., a control circuit, a memory circuit, or the like is formed is transmitted as an electric signal to an optical modulator P1 via a silicon electronic circuit (transceiver IC) C2. The optical modulator P1 is an optical device which converts the data transmitted as the electric signal to an optical signal. On the optical modulator P1, e.g., a continuous wave laser beam from a light source LS is incident. By controlling the phase of the beam in the optical modulator P1 and thus changing the state of the optical signal, it is possible to associate the data transmitted as the electric signal with the phase state of the beam. The optical signal resulting from the modulation in the optical modulator P1 is output from the optical communication module (semiconductor device) SD to the outside via an optical coupler P2 such as, e.g., a grating coupler or a spot size converter.

On the other hand, the optical signal input to the optical communication module (semiconductor device) SD is transmitted to an optical receiver P4 via an optical coupler P3 such as, e.g., a grating coupler or a spot size converter. The optical receiver P4 is an optical device which converts the data transmitted as the optical signal to an electric signal. The data converted to the electric signal in the optical receiver P4 is transmitted to the silicon electronic circuit C1 via a silicon electronic circuit (receiver IC) C3.

For the transmission (transmittance) of the electric signal transmitted from the silicon electronic circuit C1 to the optical modulator P1 via the silicon electronic circuit C2 and the electric signal transmitted from the optical receiver P4 to the silicon electronic circuit C1 via the silicon electronic circuit C3, an electric wire made mainly of a conductive material such as aluminum (Al), copper (Cu), or tungsten (W) is used. On the other hand, for the transmission (transmittance) of the optical signal, a transmission line for an optical signal (hereinafter referred to as an optical signal line) made of, e.g., silicon (Si) is used. An optical waveguide described later corresponds to the optical signal line.

The silicon electronic circuit C1 is formed in a semiconductor chip SC1. The silicon electronic circuit C2 is formed in a semiconductor chip SC2. The silicon electronic circuit C3 is formed in a semiconductor chip SC3. The optical modulator P1, the optical couplers P2 and P3, and the optical receiver P4 are formed in one semiconductor chip SC4. These semiconductor chips SC1, SC2, SC3, and SC4 and the light source LS are mounted over, e.g., one interposer IP to form the optical communication module (semiconductor device) SD.

The electronic device and the optical device which are used herein are formed in the different semiconductor chips, but the configuration is not limited thereto. For example, the electronic device and the optical device can also be formed in one semiconductor chip.

[About Structure of Semiconductor Device]

Figure 2:
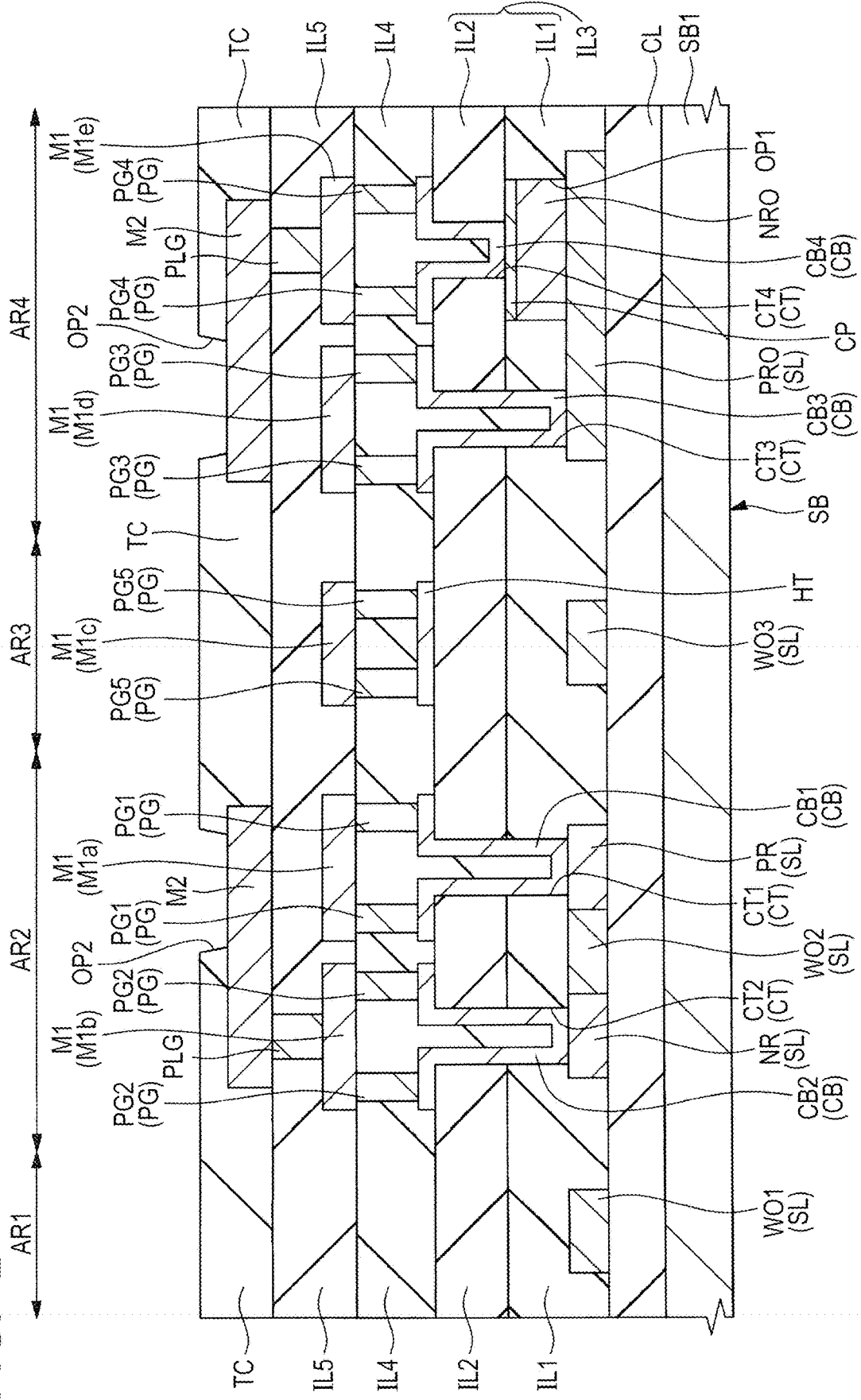
FIG. 2 is a main-portion cross-sectional view showing the semiconductor device in the embodiment.
Figure 3:
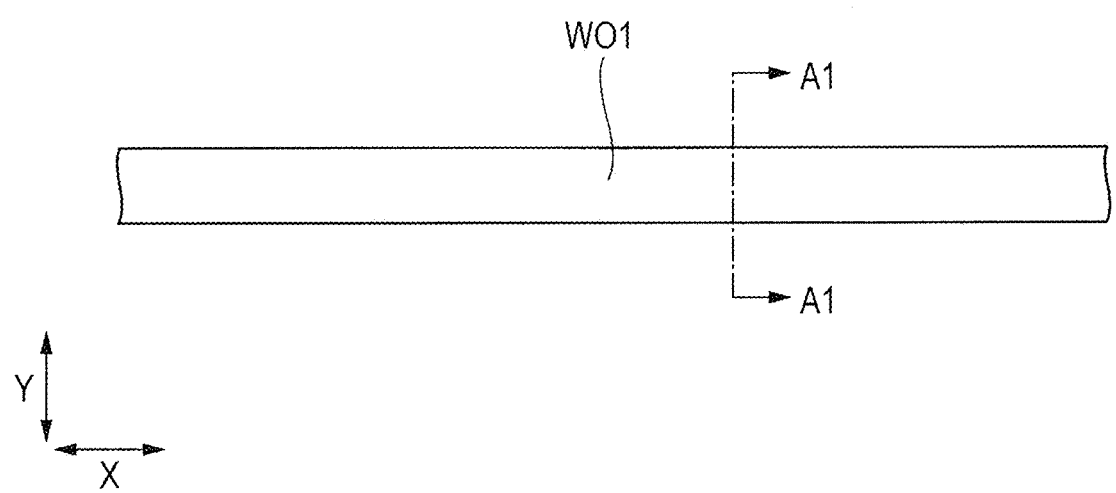
FIG. 3 is a main-portion plan view of the semiconductor device in the embodiment.
Figure 4:
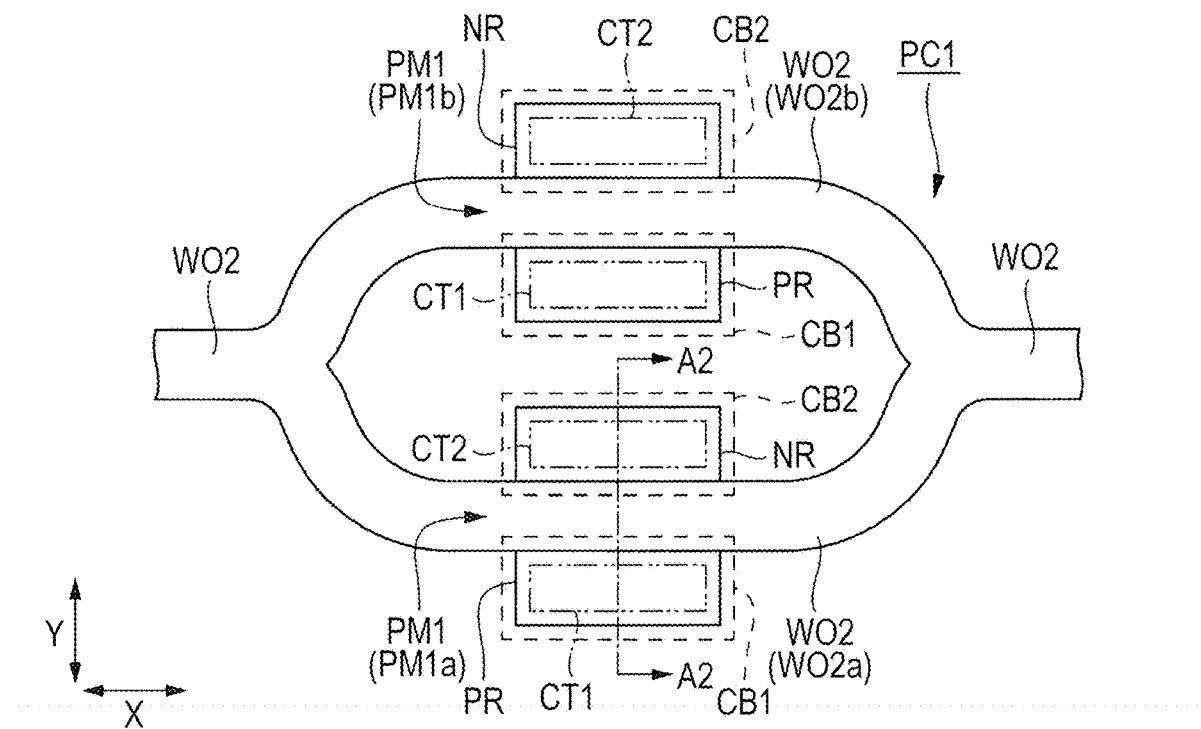
FIG. 4 is a main-portion plan view of the semiconductor device in the embodiment.
Figure 5:
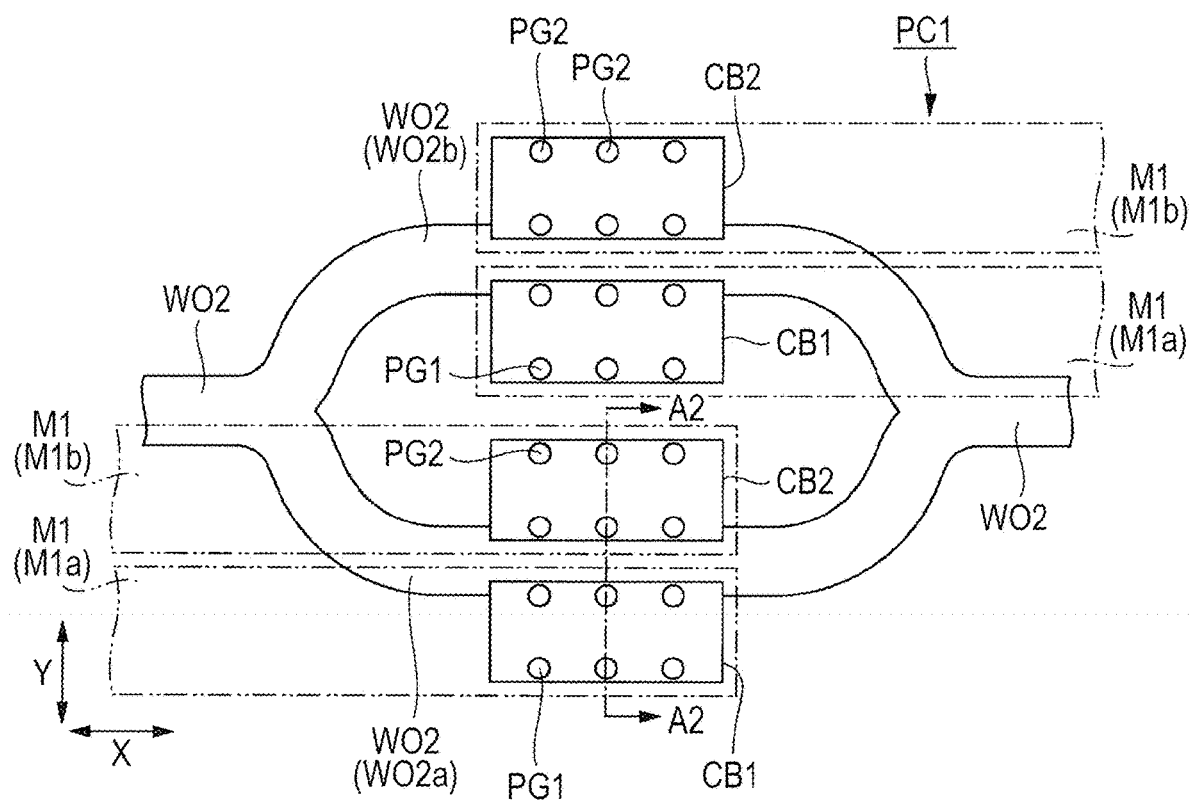
FIG. 5 is a main-portion plan view of the semiconductor device in the embodiment.
Figure 6:
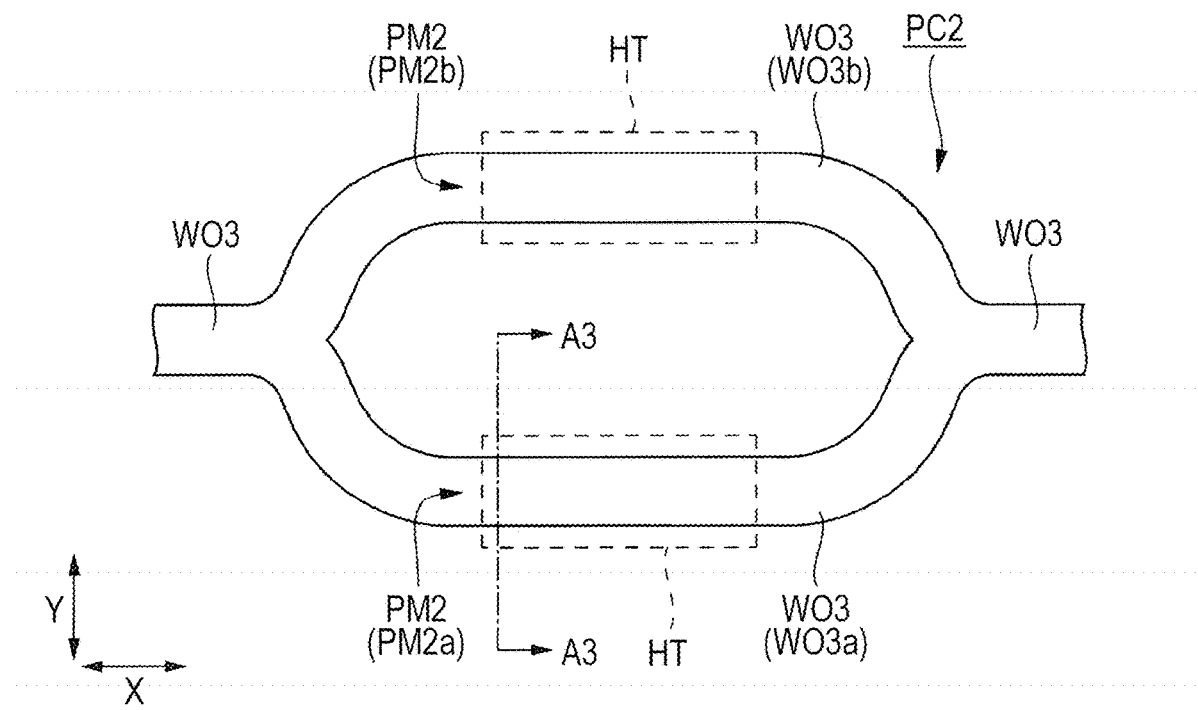
FIG. 6 is a main-portion plan view of the semiconductor device in the embodiment.
Figure 7:
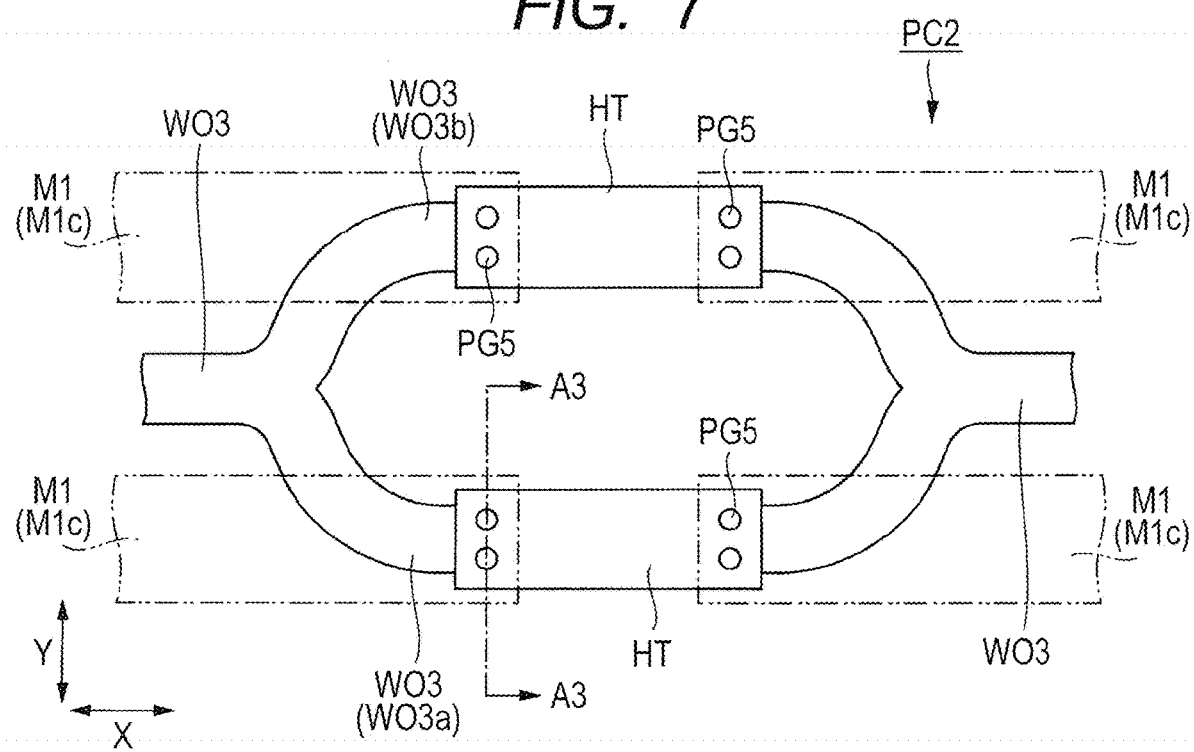
FIG. 7 is a main-portion plan view of the semiconductor device in the embodiment.
Figure 8:
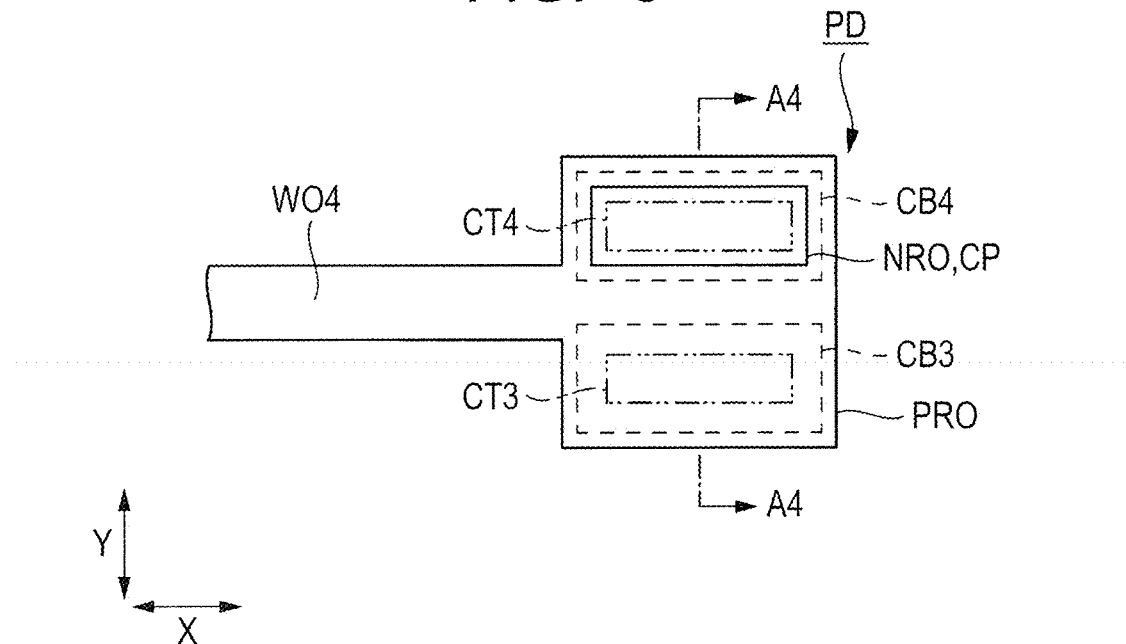
FIG. 8 is a main-portion plan view of the semiconductor device in the embodiment.
Figure 9:
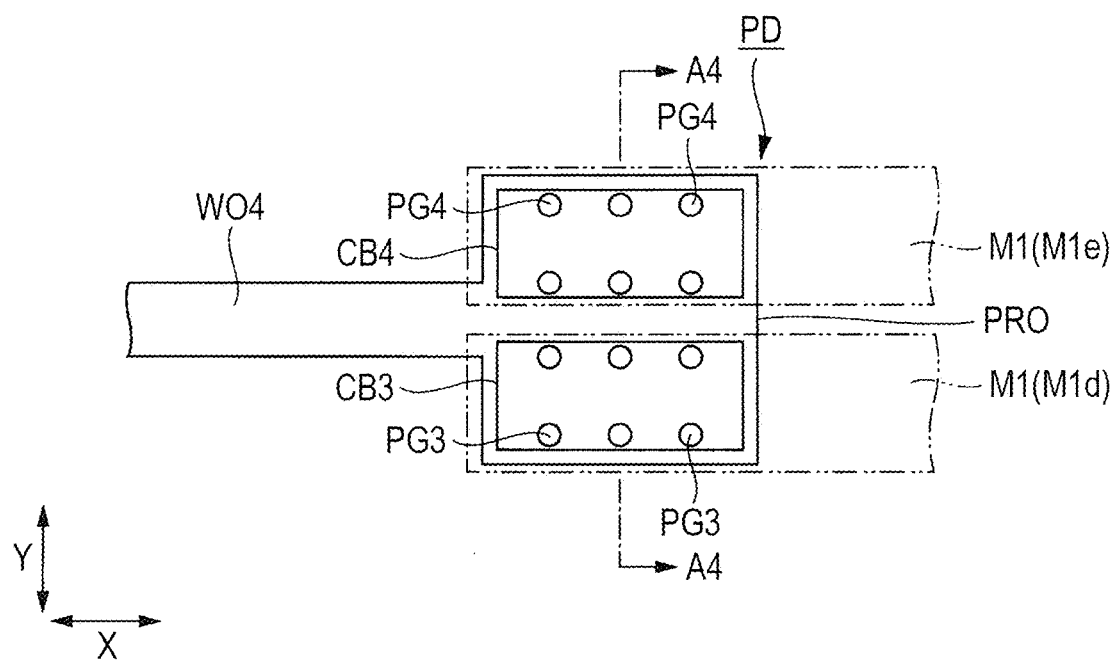
FIG. 9 is a main-portion plan view of the semiconductor device in the embodiment.

FIG. 2 is a main-portion cross-sectional view showing the semiconductor device in the present first embodiment. The semiconductor device shown in FIG. 2 corresponds to the semiconductor chip SC4 in FIG. 1 described above. FIGS. 3 to 9 are main-portion plan views of the semiconductor device in the present first embodiment. FIG. 3 shows a plan view of an area AR1. FIGS. 4 and 5 show plan views of an area AR2. FIGS. 6 and 7 show plan views of an area AR3. FIGS. 8 and 9 show plan views of an area AR4. A cross-sectional view at a position along the line A1-A1 in FIG. 3 corresponds to a cross section of the area AR1 in FIG. 2. A cross-sectional view at a position along the line A2-A2 in FIG. 4 corresponds to a cross section of the area AR2 in FIG. 2. A cross-sectional view at a position along the line A3-A3 in FIG. 6 corresponds to a cross section of the area AR3 in FIG. 3. A cross-sectional view at a position along the line A4-A4 in FIG. 8 corresponds to a cross section of the area AR4 in FIG. 2.

Note that FIGS. 4 and 5 show the plan views of the same area but, in FIG. 4, optical waveguides WO2 and semiconductor portions NR and PR are shown by the solid lines, contact holes CT1 and CT2 are shown by the two-dot-dash lines, and contact portions CB1 and CB2 are shown by the broken lines. On the other hand, in FIG. 5, the optical waveguides WO2, the contact portions CB1 and CB2, and plugs PG1 and PG2 are shown by the solid lines, and wires M1a and M1b are shown by the two-dot-dash lines. FIGS. 6 and 7 show the plan views of the same area but, in FIG. 6, optical waveguides WO3 are shown by the solid line, and heaters HT are shown by the broken lines. On the other hand, in FIG. 7, the optical waveguides WO3, the heaters HT, and plugs PG5 are shown by the solid lines, and wires M1c are shown by the two-dot-dash lines. FIGS. 8 and 9 show the plan views of the same area but, in FIG. 8, an optical waveguide WO4, semiconductor portions PRO and NRO, and a cap layer CP are shown by the solid lines, contact holes CT3 and CT4 are shown by the two-dot-dash lines, and contact portions CB3 and CB4 are shown by the broken lines. On the other hand, in FIG. 9, the optical waveguide WO4, the contact portions CB3 and CB4, and plugs PG3 and PG4 are shown by the solid lines, and wires M1d and M1e are shown by the two-dot-dash lines.

As shown in FIG. 2, the semiconductor device in the present first embodiment includes a base (supporting substrate) SB1, an insulating layer CL formed over the base SB1, and a semiconductor layer SL formed over the insulating layer CL. The base SB1, the insulating layer CL, and the semiconductor layer SL form a SOI (Silicon on Insulator) substrate SB.

The base SB1 is a supporting substrate supporting the insulating layer CL and a structure above the insulating layer CL, which is a semiconductor substrate. The base SB1 is preferably made of a monocrystalline silicon substrate, which is, e.g., a p-type monocrystalline silicon substrate having a (100) plane orientation and a specific resistance of about 5 to 50 Ωcm. The insulating layer CL is preferably made of a silicon oxide film. The insulating layer CL can also be regarded as a BOX (Buried Oxide) layer. The semiconductor layer SL is preferably made of a silicon layer (more specifically, a monocrystalline silicon layer) and can also be regarded as a SOI (Silicon on Insulator) layer.

The SOI substrate SB has the area AR1, the area AR2, the area AR3, and the area AR4. The area AR1, the area AR2, the area AR3, and the area AR4 correspond to the different two-dimensional areas of the main surface of the same SOI substrate SB. In the area AR1, a transmission line for an optical signal (optical waveguide WO1) is formed. In the area AR2, an optical modulator (PC1) is formed. In the area AR3, an optical modulator (PC2) is formed. In the area AR4, an optical receiver (germanium optical receiver PD) is formed. Note that the area AR1, the area AR2, the area AR3, and the area AR4 may be or may not be adjacent to each other. However, for easier understanding, FIG. 2 shows the areas AR1, AR2, AR3, and AR4 which are sequentially adjacent to each other.

<Optical Signal Line>

As shown in FIGS. 2 and 3, in the area AR1, the optical waveguide WO1 as a transmission line for various optical signals (i.e., optical signal line) is formed.

The optical waveguide WO1 is made of the semiconductor layer SL (silicon layer) and formed over the insulating layer CL. The lower surface of the optical waveguide WO1 is in contact with the upper surface of the insulating layer CL. In the optical waveguide WO1, no impurity ion is implanted. In other words, the optical waveguide WO1 is made of an intrinsic semiconductor, i.e., an i (intrinsic) type semiconductor. In the case shown in FIG. 3, the optical waveguide WO1 has a linear pattern extending in an X-direction. The optical signal introduced into the optical waveguide WO1 travels in the optical waveguide WO1 along the extending direction of the optical waveguide WO1, which applies also to each of optical waveguides WO2, WO3, and WO4 described later.

Note that the X-direction and a Y-direction which are shown in FIGS. 3 to 9 are orthogonal to each other and are also generally parallel with the main surface of the SOI substrate SB (or with the main surface of the base SB1). In the cross-sectional view of FIG. 2, a direction perpendicular to the paper surface with FIG. 2 corresponds to the X-direction.

As shown in FIG. 2, over the insulating layer CL, an interlayer insulating film IL3 is formed such that the interlayer insulating film IL3 covers the optical waveguide WO1. Preferably, the interlayer insulating film IL3 is made of silicon oxide. Specifically, the interlayer insulating film IL3 is made of a multi-layer film including an insulating film IL1 and an insulating film IL2 over the insulating film IL1. Preferably, each of the insulating film IL1 and the insulating film IL2 is made of a silicon oxide film. Since the insulating film IL1 is in a lower layer and the insulating film IL2 is in an upper layer, the insulating film IL1 is in contact with the optical waveguide WO1. The optical waveguide WO1 is surrounded circumferentially (from upper and lower sides and from left and right sides) by the insulating layer CL and the interlayer insulating film IL3 (more specifically, the insulating film IL1). The optical waveguide WO1 can function as a core layer, while the insulating layer CL and the interlayer insulating film IL3 can function as a clad layer. The refractive indices of the insulating layer CL and the interlayer insulating film IL3 which serve as the clad layer are lower than the refractive indices of the optical waveguide WO1 and the optical waveguides WO2 and WO3 described later.

By way of example, FIG. 2 shows the optical waveguide WO1 having a quadrilateral (rectangular) cross-sectional shape. However, it is also possible to provide an optical waveguide having a protruding (rib-shaped) cross-sectional shape over the insulating layer CL.

Over the insulating layer CL, a grating coupler is also formed, though not shown in FIG. 2. The grating coupler is also made of the semiconductor layer SL formed over the insulating layer CL and covered with the interlayer insulating film IL3. The grating coupler is equivalent to the foregoing optical couplers P2 and P3.

In the area AR1, over the interlayer insulating film IL3, an interlayer insulating film IL4 is formed. Over the interlayer insulating film IL4, wires M1 are formed as necessary. The wires M1 are the first-layer wires.

<Optical Modulator>

Referring to FIGS. 2, 4, and 5, a description will be given of the optical modulator PC1 formed in the area AR2. In the area AR2, the optical modulator PC1 is formed. The optical modulator PC1 corresponds to the foregoing optical modulator P1 in FIG. 1 described above.

As shown in FIGS. 2, 4, and 5, in the area AR2, the optical waveguide WO2 extending in the X-direction is divided at a branch portion into the two optical waveguides WO2 (i.e., an optical waveguide WO2a and an optical waveguide WO2b). The two optical waveguides WO2 (WO2a and WO2b) extend in the X-direction, while being spaced apart from each other in the Y-direction, and are then reunited to form the one optical waveguide WO2 extending in the X-direction. In each of the two optical waveguides WO2a and WO2b, a phase modulation portion PM1 is provided. The phase modulation portion PM1 is an element which changes the phase of a light beam. The phase modulation portion PM1 provided in the optical waveguide WO2a is referred to herein as a phase modulation portion PM1a, while the phase modulation portion PM1 provided in the optical waveguide WO2b is referred to herein as a phase modulation portion PM1b. The structure of the phase modulation portion PM1a and the structure of the phase modulation portion PM1b are basically the same.

Each of the phase modulation portions PM1 includes the optical waveguide WO2, the p-type semiconductor portion PR, and the n-type semiconductor portion NR. The optical waveguide WO2, the p-type semiconductor portion PR, and the n-type semiconductor portion NR are made of the semiconductor layer SL (silicon layer) and formed over the insulating layer CL. The respective lower surfaces of the optical waveguide WO2, the p-type semiconductor portion PR, and the n-type semiconductor portion NR are in contact with the upper surface of the insulating layer CL.

The p-type semiconductor portion PR and the n-type semiconductor portion NR are formed integrally with the optical waveguide WO2 (WO2a or WO2b). On one of both sides of the optical waveguide WO2 (WO2a or WO2b), the p-type semiconductor portion PR is provided while, on the other side thereof, the n-type semiconductor portion NR is provided. In the optical waveguide WO2, no impurity ion is implanted so that the optical waveguide WO2 is made of an intrinsic semiconductor (i.e., an i-type region). In the p-type semiconductor portion PR, a p-type impurity is introduced while, in the n-type semiconductor portion NR, an n-type impurity is introduced. The p-type semiconductor portion PR, the optical waveguide WO2, and the n-type semiconductor portion NR form an element with a pin structure (diode with a pin structure) and thus form the phase modulation portion PM1.

By thus providing the structure portion (PM1) including the optical waveguide WO2, and the p-type semiconductor portion PR and the n-type semiconductor portion NR which are located on both sides thereof, it is possible to change the phase of a light beam. For example, when respective voltages are applied to the p-type semiconductor portion PR and the n-type semiconductor portion NR in the phase modulation portion PM1 (i.e., when a forward bias is applied to the diode with the pin structure), a carrier density in the optical waveguide WO2 (WO2a or WO2b) made of an intrinsic semiconductor is changed to change the refractive index of the light beam in the optical waveguide WO2 (WO2a or WO2b). When the refractive index of the light beam in the optical waveguide WO2 (WO2a or WO2b) is changed, the wavelength of the light beam traveling in the optical waveguide WO2 (WO2a or WO2b) is changed to allow the phase of the light beam in the process of traveling in the optical waveguide WO2 (WO2a or WO2b) of the phase modulation portion PM1 to be changed.

The incident light beam from an input portion travels in the optical waveguide WO2 and is divided at the branch portion into two light beams which travel in the two optical waveguides WO2a and WO2b. The two light beams have respective phases controlled in the respective phase modulation portions PM1 provided in the optical waveguides WO2a and WO2b and are then reunited into one light beam which travels in the one optical waveguide WO2. By controlling the voltage applied to the phase modulation portion PM1a and the voltage applied to the phase modulation portion PM1b, the phase difference between the light beam that has passed through the optical waveguide WO2a of the phase modulation portion PM1a and the light beam that has passed through the optical waveguide WO2b of the phase modulation portion PM1b is adjusted to thus allow the phase and intensity of the light beam output from the optical modulators PC1 to be controlled.

In the case shown in FIG. 2, the height positions of the respective upper surfaces of the p-type semiconductor portion PR and the n-type semiconductor portion NR are substantially the same as the height position of the upper surface of the optical waveguide WO2. However, in another form, it is also possible to set the height positions of the respective upper surfaces of the p-type semiconductor portion PR and the n-type semiconductor portion NR lower than the height position of the upper surface of the optical waveguide WO2. That is, it is also possible to form each of the phase modulation portions PM1 into a rib-shaped structure.

In the area AR2, over the insulating layer CL, the interlayer insulating film IL3 is formed such that the interlayer insulating film IL3 covers the optical waveguides WO2, the p-type semiconductor portions PR, and the n-type semiconductor portions NR. The optical waveguides WO2, the p-type semiconductor portions PR, and the n-type semiconductor portions NR function as a core layer, while the insulating layer CL and the interlayer insulating film IL3 function as a clad layer. As described above, the interlayer insulating film IL3 is made of the multi-layer film including the insulating film IL1 and the insulating film IL2 over the insulating film IL1. Accordingly, the insulating film IL1 is in contact with the optical waveguides WO2, the p-type semiconductor portions PR, and the n-type semiconductor portions NR.

Note that, over the p-type semiconductor portions PR and the n-type semiconductor portions NR, respective contact holes (openings) CT are formed to extend through the interlayer insulating film IL3 (insulating films IL1 and IL2). In the contact holes CT, contact portions (coupling electrodes) CB are formed. Note that the contact holes CT formed over the p-type semiconductor portions PR are referred to as the contact holes (openings) CT1, while the contact holes CT formed over the n-type semiconductor portions NR are referred to as the contact holes (openings) CT2. The contact holes CT1 formed in the interlayer insulating film IL3 reach the p-type semiconductor portions PR so that, at the bottom portion of each of the contact holes CT1, a portion of the upper surface of the p-type semiconductor portion PR is exposed. On the other hand, the contact holes CT2 formed in the interlayer insulating film IL3 reach the n-type semiconductor portions NR so that, at the bottom portion of each of the contact hole CT2, a portion of the upper surface of the n-type semiconductor portion NR is exposed.

The contact portions CB formed in the contact holes CT1 are referred to as the contact portions (coupling electrodes) CB1, while the contact portions CB formed in the contact holes CT2 are referred to as the contact portions (coupling electrodes) CB2. The contact portions CB1 formed in the contact holes CT1 are in contact with the p-type semiconductor portions PR at the bottom portions of the contact holes CT1 and electrically coupled with the p-type semiconductor portions PR. On the other hand, the contact portions CB2 formed in the contact holes CT2 are in contact with the n-type semiconductor portions NR at the bottom portions of the contact holes CT2 and electrically coupled with the n-type semiconductor portions NR. That is, onto the p-type semiconductor portions PR and the n-type semiconductor portions NR, the contact portions CB1 and CB2 are coupled respectively as the electrodes (coupling electrodes).

Referring next to FIGS. 2, 6, and 7, a description will be given of the optical modulator PC2 formed in the area AR3. In the area AR3, the optical modulator PC2 is formed. The optical modulator PC2 corresponds to the foregoing optical modulator P1 in FIG. 1 described above.

As shown in FIGS. 2, 6, and 7, in the area AR3, the optical waveguide WO3 extending in the X-direction is divided at a branch portion into two optical waveguides WO3 (i.e., an optical waveguide WO3a and an optical waveguide WO3b). The two optical waveguides WO3 (WO3a and WO3b) extend in the X-direction, while being spaced apart from each other in the Y-direction, and are then reunited to form the one optical waveguide WO3 extending in the X-direction. In each of the two optical waveguides WO3a and WO3b, a phase modulation portion PM2 is provided. The phase modulation portion PM2 is an element which changes the phase of a light beam. The phase modulation portion PM2 provided in the optical waveguide WO3a is referred to herein as a phase modulation portion PM2a, while the phase modulation portion PM2 provided in the optical waveguide WO3b is referred to herein as a phase modulation portion PM2b. The structure of the phase modulation portion PM2a and the structure of the phase modulation portion PM2b are basically the same.

Each of the phase modulation portions PM2 includes the optical waveguide WO3 and the heater (heater portion) HT. The optical waveguide WO3 is made of the semiconductor layer SL (silicon layer) and formed over the insulating layer CL. The lower surface of the optical waveguide WO3 is in contact with the upper surface of the insulating layer CL. In the optical waveguide WO3, no impurity ion is implanted so that the optical waveguide WO3 is made of an intrinsic semiconductor (i.e., i-type region).

In the area AR3, over the insulating layer CL, the interlayer insulating film IL3 is formed such that the interlayer insulating film IL3 covers the optical waveguides WO3. The optical waveguides WO3 function as a core layer, while the insulating layer CL and the interlayer insulating film IL3 function as a clad layer. As described above, the interlayer insulating film IL3 is made of the multi-layer film including the insulating film IL1 and the insulating film IL2. Accordingly, the insulating film IL1 is in contact with the optical waveguides WO3. The heaters HT are formed over the interlayer insulating film IL3 (i.e., over the insulating film IL2) and over the optical waveguides WO3. Between the optical waveguides WO3 and the heaters HT, the interlayer insulating film IL3 (insulating films IL1 and IL2) is interposed. The heaters HT are disposed over the optical waveguides WO3, while the optical waveguides WO3 and the heaters HT are spaced apart and electrically insulated from each other by the interlayer insulating film IL3.

The heaters HT are elements (heater elements or heating elements) for heating the optical waveguides WO3 located under the heaters HT. The optical waveguide WO3a and the heater HT located thereover form the phase modulation portion PM2a, while the optical waveguide WO3b and the heater HT located thereover form the phase modulation portion PM2b. Each of the heaters HT is a heat source which changes the temperature of the optical waveguide WO3 to thus adjust the phase of the optical signal passing through the optical waveguide WO3. By providing the structure portion (PM2) including the optical waveguide WO3 and the heater HT disposed thereover, it is possible to change the phase of a light beam.

For example, when a current is allowed to flow in the heater HT in each of the phase modulation portions PM2, the heater HT generates heat. The heat generated from the heater HT heats the optical waveguide WO3 under the heater HT to change (raise) the temperature of the optical waveguide WO3. That is, the current allowed to flow in the heater HT allows the temperature of the optical waveguide WO3 to be controlled. When the temperature of each of the optical waveguides WO3 (WO3a and WO3b) is changed, the refractive index of the light beam in each of the optical waveguides WO3 (WO3a and WO3b) is changed. When the refractive index of the light beam in each of the optical waveguides WO3 (WO3a and WO3b) is changed, the wavelength of the light beam traveling in each of the optical waveguides WO3 (WO3a and WO3b) is changed to allow the phase of the light beam in the process of traveling in each of the optical waveguides WO3 (WO3a and WO3b) of the phase modulators PM2 to be changed.

The incident light beam from an input portion travels in the optical waveguide WO3 and is divided at the branch portion into two light beams which travel in the two optical waveguides WO3a and WO3b. The two light beams have respective phases controlled in the respective phase modulation portions PM2 provided in the optical waveguides WO3a and WO3b and are then reunited into one light beam which travels in the one optical waveguide WO3. By controlling the current allowed to flow in the heater HT of the phase modulation portion PM2a and the current allowed to flow in the heater HT of the phase modulation portion PM1b, the phase difference between the light beam that has passed through the optical waveguide WO3a of the phase modulation portion PM2a and the light beam that has passed through the optical waveguide WO3b of the phase modulation portion PM2b is adjusted to thus allow the phase and intensity of the light beam output from the optical modulator PC2 to be controlled.

<Optical Receiver>

Referring to FIGS. 2, 8, and 9, a description will be given of the germanium optical receiver (photoelectric conversion portion) PD formed in the area AR4. In the area AR4, the germanium optical receiver PD is formed. The germanium optical receiver PD corresponds to the foregoing optical receiver P4. The germanium optical receiver PD is a photoelectric conversion element (photoelectric conversion portion or photodetector) which converts an optical signal to an electric signal.

The germanium optical receiver PD includes the p-type semiconductor portion (semiconductor layer) PRO and the n-type semiconductor portion (semiconductor layer) NRO. The p-type semiconductor portion PRO and the n-type semiconductor portion NRO form an element with a pn junction structure (diode with a pn structure) and thus form the germanium optical receiver PD.

The p-type semiconductor portion PRO is made of the semiconductor layer SL (silicon layer) and formed over the insulating layer CL. The lower surface of the p-type semiconductor portion PRO is in contact with the upper surface of the insulating layer CL. In the p-type semiconductor portion PRO, a p-type impurity is introduced. The thickness (height) of the p-type semiconductor portion PRO is about the same as the thickness (height) of each of the optical waveguides WO1, WO2, WO3, and WO4 and the semiconductor portions PR and NR.

The p-type semiconductor portion PRO is coupled (connected) integrally to the optical waveguide WO4. In the case shown in FIG. 8, to one of the end portions of the optical waveguide WO4 extending in the X-direction, the p-type semiconductor portion PRO is coupled (connected) integrally. This allows the optical signal that has propagated in the optical waveguide WO4 to be introduced into the p-type semiconductor portion PRO. The optical waveguide WO4 is made of the semiconductor layer SL and formed over the insulating layer CL. The lower surface of the optical waveguide WO4 is in contact with the upper surface of the insulating layer CL. Note that the optical waveguide WO4 is shown in FIGS. 8 and 9, but is not shown in the cross section of FIG. 2. In the optical waveguide WO4, no impurity ion is implanted so that the optical waveguide WO4 is made of an intrinsic semiconductor (i type semiconductor). That is, the optical waveguide WO4 and the p-type semiconductor portion PRO are integrally formed together over the insulating layer CL. However, in the optical waveguide WO4, no impurity is introduced, while a p-type impurity is introduced in the p-type semiconductor portion PRO.

The n-type semiconductor portion NRO is formed over the p-type semiconductor portion PRO. The lower surface of the n-type semiconductor portion NRO is in contact with the upper surface of the p-type semiconductor portion PRO. Between (at the interface between) the n-type semiconductor portion NRO and the p-type semiconductor portion PRO, a pn junction (pn junction surface) is formed. The n-type semiconductor portion NRO is made of a germanium (Ge) layer in which an n-type impurity is introduced. The area (two-dimensional size) of the n-type semiconductor portion NRO is smaller than the area (two-dimensional size) of the p-type semiconductor portion PRO. In plan view, the n-type semiconductor portion NRO is included in the p-type semiconductor portion PRO. Germanium (Ge) has a forbidden band width smaller than that of silicon (Si). Accordingly, the pn junction formed between n-type germanium and p-type silicon allows a near-infrared light beam at a wavelength not longer than about 1.6 μm in, e.g., a communication wavelength band to be detected.

Over the n-type semiconductor portion NRO, the cap layer CP is formed. The cap layer CP is made of silicon (Si) or silicon germanium (SiGe), and more preferably made of silicon (Si). The cap layer CP is formed in order to improve surface roughness of germanium contained in the n-type semiconductor portion NRO and ensure the thickness of the layer. The two-dimensional shape of the cap layer CP substantially coincides with the two-dimensional shape of the n-type semiconductor portion NRO. It is also possible to regard a combination of the n-type semiconductor portion NRO and the cap layer CP located thereover as a semiconductor portion.

The germanium optical receiver PD has the p-type semiconductor portion PRO as a first semiconductor portion and a second semiconductor portion over the first semiconductor portion (p-type semiconductor portion PRO). The second semiconductor portion has a multi-layer structure including the n-type semiconductor portion NRO and the cap layer CP. That is, more preferably, the second semiconductor portion included in the germanium optical receiver PD includes the germanium layer (semiconductor portion NRO) formed over the first semiconductor portion (p-type semiconductor portion PRO) and further includes the silicon layer (cap layer CP) formed over the germanium layer (semiconductor portion NRO). The second semiconductor portion is formed in the opening OP1 of the insulating film IL2. The contact hole CT3 described later reaches the second semiconductor portion. The contact portion CB4 described later is electrically coupled with the second semiconductor portion.

In the area AR4, over the insulating layer CL, the interlayer insulating film IL3 is formed such that the interlayer insulating film IL3 covers the germanium optical receiver PD (p-type semiconductor portion PRO, n-type semiconductor portion NRO, and cap layer CP). The insulating layer CL and the interlayer insulating film IL3 can function as the clad layer. As described above, the interlayer insulating film IL3 is made of the multi-layer film including the insulating film IL1 and the insulating film IL2 over the insulating film IL1. The insulating film IL1, not the insulating film IL2, is in contact with the optical waveguide WO4 and the p-type semiconductor portion PR.

Note that, over the multi-layer structure including the n-type semiconductor portion NRO and the cap layer CP, the insulating film IL1 is not formed, but the insulating film IL2 is formed. This is because, after the multi-layer structure including the n-type semiconductor portion NRO and the cap layer CP is formed in the opening OP1 formed in the insulating film IL1, the insulating film IL2 is formed. Consequently, the interlayer insulating film IL3 located over the cap layer CP is made of the insulating film IL2, while the interlayer insulating film IL3 located other than over the cap layer CP is made of the multi-layer film including the insulating film IL1 and the insulating film IL2.

Note that, over the portion of the p-type semiconductor portion PRO which is uncovered with the n-type semiconductor portion NRO and over the cap layer CP over the n-type semiconductor portion NRO, the respective contact holes CT are formed to extend through the interlayer insulating film IL3. In the contact holes CT, the contact portions CB are formed. The contact hole CT formed over the portion of the p-type semiconductor portion PRO which is uncovered with the n-type semiconductor portion NRO is referred to as the contact hole (opening) CT3, while the contact hole CT formed over the cap layer CP over the n-type semiconductor portion NRO is referred to as the contact hole (opening) CT4. The contact holes CT1, CT2, and CT3 are formed in the insulating films IL1 and IL2, while the contact hole CT4 is formed in the insulating film IL2. The contact hole CT3 formed in the interlayer insulating film IL3 reaches the portion of the p-type semiconductor portion PRO which is uncovered with the n-type semiconductor portion NRO. At the bottom portion of the contact hole CT3, a portion of the upper surface of the p-type semiconductor portion PRO is exposed. The contact hole CT4 formed in the interlayer insulating film IL3 reaches the cap layer CP. At the bottom portion of the contact hole CT4, a portion of the upper surface of the cap layer CP is exposed.

The contact portion CB formed in the contact hole CT3 is referred to as the contact portion (coupling electrode) CB3, while the contact portion CB formed in the contact hole CT4 is referred to as the contact portion (coupling electrode) CB4. The contact portion CB3 formed in the contact hole CT3 is in contact with the p-type semiconductor portion PRO at the bottom portion of the contact hole CT3 and electrically coupled with the p-type semiconductor portion PRO. The contact portion CB4 formed in the contact hole CT4 is in contact with the cap layer CP at the bottom portion of the contact hole CT4 and electrically coupled with the cap layer CP. Note that, in the case where the cap layer CP is not formed, the contact hole CT4 reaches the semiconductor portion NRO. At the bottom portion of the contact hole CT4, a portion of the upper surface of the semiconductor portion NRO is exposed. The contact portion CB4 is in contact with the semiconductor portion NRO at the bottom portion of the contact hole CT4 and electrically coupled with the semiconductor portion NRO.

Thus, onto the p-type semiconductor portion PRO and onto the cap layer CP over the n-type semiconductor portion NRO, the contact portions CB3 and CB4 are coupled respectively as the electrodes (coupling electrodes). This allows a dc current allowed to flow by a photovoltaic effect at the pn junction portion included in the germanium optical receiver PD to be extracted to the outside using the contact portions CB3 and CB4. That is, the optical signal can be extracted as an electric signal.

Referring to FIG. 2, a description will be given next of a structure above the interlayer insulating film IL3 in the areas AR1, AR2, AR3, and AR4.

In the areas AR1, AR2, AR3, and AR4, over the interlayer insulating film IL3, the interlayer insulating film IL4 is formed such that the interlayer insulating film IL4 covers the heaters HT and the contact portions CB1, CB2, CB3, and CB4. In the interlayer insulating film IL4, through holes (penetration holes) are formed and, in the through holes, conductive plugs PG are embedded. Over the interlayer insulating film IL4 in which the plugs PG are embedded, the wires M1 are formed. The wires M1 are the first-layer wires and include the wires M1a, M1b, M1c, M1d, and M1e.

In the area AR2, the plugs PG are disposed between the wires M1a and the contact portions CB1 and between the wires M1b and the contact portions CB2. In the area AR3, the plugs PG are disposed between the wires M1c and the heaters HT. In the area AR4, the plugs PG are disposed between the wire M1d and the contact portion CB3 and between the wire M1e and the contact portion CB4.

In the area AR2, the plugs PG disposed between the contact portions CB1 and the wires M1a are referred to as the plugs PG1, while the plugs PG disposed between the contact portions CB2 and the wires M1b are referred to as the plugs PG2. The lower surfaces of the plugs PG1 are in contact with and electrically coupled with the contact portions CB1. The upper surfaces of the plugs PG1 are in contact with and electrically coupled with the wires M1a. The lower surfaces of the plugs PG2 are in contact with and electrically coupled with the contact portions CB2. The upper surfaces of the plugs PG2 are in contact with and electrically coupled with the wires M1b. The plugs PG1 electrically couple the contact portions CB1 to the wires M1a. The plugs PG2 electrically couple the contact portions CB2 to the wires M1b.

Consequently, the p-type semiconductor portions PR are electrically coupled with the wires M1a via the contact portions CB1 and the plugs PG1, while the n-type semiconductor portions NR are electrically coupled with the wires M1b via the contact portions CB2 and the plugs PG2. This allows voltages to be applied from the wires M1a to the p-type semiconductor portions PR via the plugs PG1 and the contact portions CB1 and also allows voltages to be applied from the wires M1b to the n-type semiconductor portions NR via the plugs PG2 and the contact portions CB2.

In the area AR3, the plugs PG disposed between the heaters HT and the wires M1c are referred to as plugs PG5. The lower surfaces of the plugs PG5 are in contact with and electrically coupled with the heaters HT, while the upper surfaces of the plugs PG5 are in contact with and electrically coupled with the wires M1c. The plugs PG5 electrically couple the heaters HT to the wires M1c. Accordingly, by applying voltages from the wires M1c to the heaters HT via the plugs PG5, currents are allowed to flow in the heaters HT. By adjusting the currents flowing in the heaters HT, the temperatures of the optical waveguides WO3 under the heaters HT are allowed to be controlled. Since the respective plugs PG5 are coupled to the both end portions of each of the heaters HT, by controlling the difference between the voltage supplied to the plug PG5 coupled to one of the end portions of the heater HT and the voltage supplied to the plug PG5 coupled to the other end portion thereof, the current flowing in the heater HT is allowed to be adjusted.

In the area AR4, the plugs PG disposed between the contact portion CB3 and the wire M1d are referred to as the plugs PG3, while the plugs PG disposed between the contact potion CB4 and the wire M1e are referred to as the plugs PG4. The lower surfaces of the plugs PG3 are in contact with and electrically coupled with the contact portion CB3, while the upper surfaces of the plugs PG3 are in contact with and electrically coupled with the wire M1d. The lower surfaces of the plugs PG4 are in contact with and electrically coupled with the contact portion CB4, while the upper surfaces of the plugs PG4 are in contact with and electrically coupled with the wire M1e. The plugs PG3 electrically couple the contact portion CB3 to the wire M1d. The plugs PG4 electrically couple the contact portion CB4 to the wire M1e. Consequently, the p-type semiconductor portion PRO is electrically coupled with the wire M1d via the contact portion CB3 and the plugs PG3, while the n-type semiconductor portion NRO is electrically coupled with the wire M1e via the cap layer CP, the contact portion CB4, and the plugs PG3. This allows the dc current allowed to flow by the photovoltaic effect at the pn junction portion included in the germanium optical receiver PD to be extracted to the outside via the contact portions CB3 and CB4, the plugs PG4 and PG5, and the wires M1d and M1e.

In the areas AR1, AR2, AR3, and AR4, over the interlayer insulating film IL4, an interlayer insulating film IL5 is formed such that the interlayer insulating film IL5 covers the wires M1. In the interlayer insulating film IL5, through holes (penetration holes) are formed and, in the through holes, conductive plugs PLG are embedded. Over the interlayer insulating film IL5 in which the plugs PLG are embedded, wires M2 are formed. The wires M2 are the second-layer wires. The plugs PLG are disposed between the wires M1 and the wires M2 to electrically couple the wires M1 to the wires M2.

Over the interlayer insulating film IL3, a protective film TC is formed such that the protective film TC covers the wires M2. Note that the interlayer insulating films IL3, IL4, and IL5 are made of, e.g., silicon oxide. Silicon oxide is appropriate as the material of the clad layer. The protective film TC is made of, e.g., silicon oxynitride. The refractive index n of silicon oxide is about 1.45, while the refractive index n of silicon oxynitride is about 1.82. In the protective film TC, openings OP2 each exposing a portion of the wire M2 are formed, and the portions of the wires M2 which are exposed from the openings OP2 serve as pad portions (bonding pads or external coupling portions).

Note that FIGS. 4 and 5 show the case where, in the two optical waveguides WO2a and WO2b, the respective phase modulation portions PM1 are provided. In another form, there may also be a case where the phase modulation portion PM1 is provided in only one of the two optical waveguides WO2a and WO2b. In that case, the semiconductor portions NR and PR are provided for, e.g., the optical waveguide WO2a, while the semiconductor portions NR and PR are not provided for the optical waveguide WO2b.

FIGS. 6 and 7 show the case where, in the two optical waveguides WO3a and WO3b, the respective phase modulation portions PM2 are provided and, for the optical waveguides WO3a and WO3b, the respective heaters HT are disposed. In another form, there may also be a case where the phase modulation portion PM2 is provided in only one of the two optical waveguides WO3a and WO3b. In that case, the heater HT is provided for, e.g., the optical waveguide WO3a, while the heater HT is not provided for the optical waveguide WO3b.

[About Manufacturing Process of Semiconductor Device]

Next, the manufacturing process of the semiconductor device in the present first embodiment will be described, while the structure of the semiconductor device in the present first embodiment is made clearer. FIGS. 10 to 24 are main-portion cross-sectional views of the semiconductor device in the present first embodiment during the manufacturing process thereof, which show cross sections equivalent to that shown in FIG. 2 described above.

Figure 10:
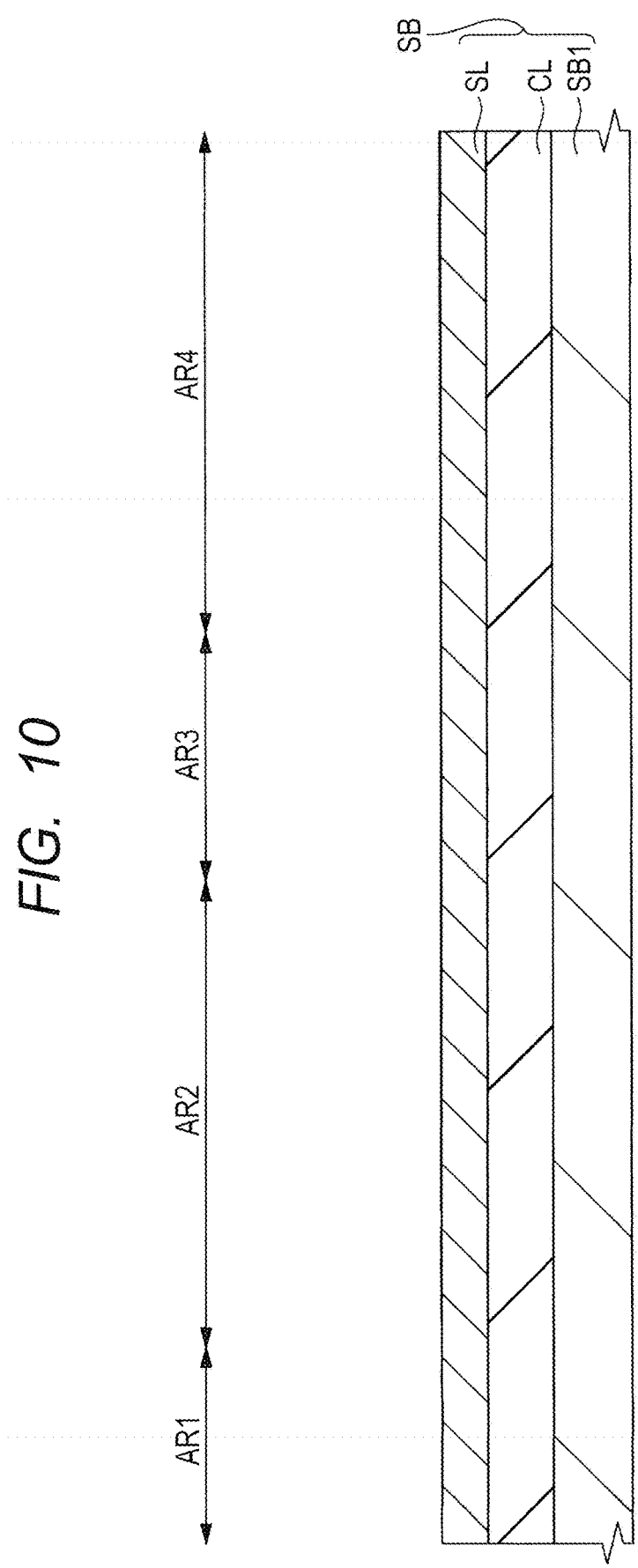
FIG. 10 is a main-portion cross-sectional view of the semiconductor device in the embodiment during the manufacturing process thereof.

First, as shown in FIG. 10, the SOI substrate SB including the base (supporting substrate) SB1, the insulating layer CL formed over the base SB1, and the semiconductor layer SL formed over the insulating layer CL is provided. Preferably, the base SB1 is made of a monocrystalline silicon substrate. Preferably, the insulating layer CL is made of a silicon oxide film and has a thickness of, e.g., about 2 to 3 µm. Preferably, the semiconductor layer SL is made of a silicon layer (more specifically, a monocrystalline silicon layer) and has a thickness of, e.g., about 180 to 250 nm. A method of manufacturing the SOI substrate SB is not limited. The SOI substrate SB can be manufactured using, e.g., a SIMOX (Silicon Implanted Oxide) method, a lamination method, a smart cut process, or the like.

Figure 11:
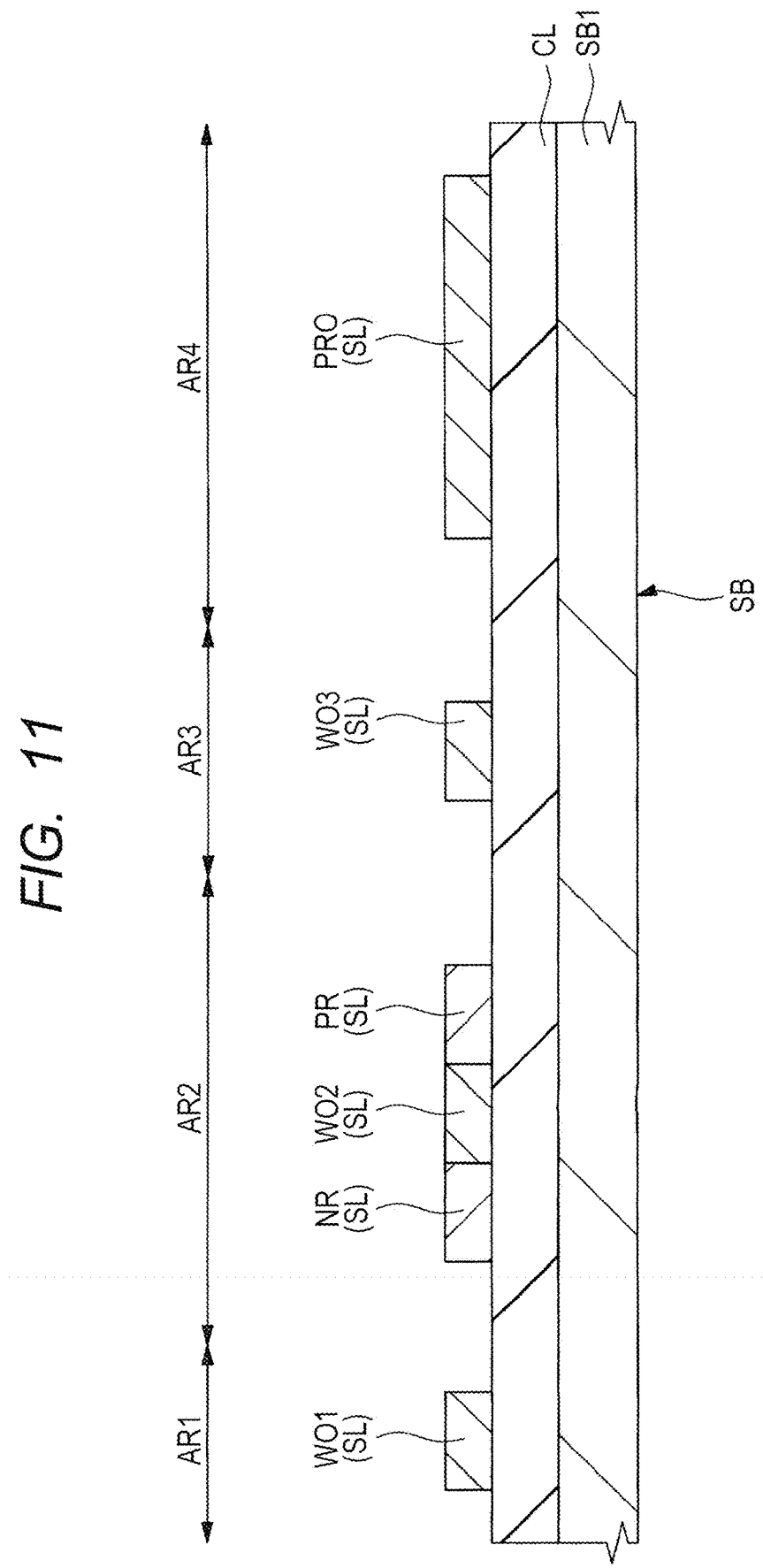
FIG. 11 is a main-portion cross-sectional view of the semiconductor device during the manufacturing process thereof, which is subsequent to FIG. 10.

Next, as shown in FIG. 11, the semiconductor layer SL is patterned using a photolithographic technique and an etching technique to form the optical waveguides WO1, WO2, WO3, and WO4 and the semiconductor portions PR, NR, and PRO.

For example, over the semiconductor layer SL, a photoresist pattern (not shown) is formed over the semiconductor layer SL using a photolithographic technique. Then, using the photoresist pattern as an etching mask, the semiconductor layer SL is etched to be able to form the optical waveguides WO1, WO2, WO3, and WO4 and the semiconductor portions PR, NR, and PRO. Subsequently, the photoresist pattern is removed by ashing or the like. Each of the optical waveguides WO1, WO2, WO3, and WO4 and the semiconductor portions PR, NR, and PRO is made of the patterned semiconductor layer SL and formed over the insulating layer CL. The semiconductor portions PR and NR are formed integrally with the optical waveguides WO2, while the semiconductor portion PRO is formed integrally with the optical waveguide WO4. At this stage, none of the optical waveguides WO1, WO2, WO3, and WO4 and the semiconductor portions PR, NR, and PRO is doped with an impurity. Note that the optical waveguide WO4 is not shown in the cross sections of FIGS. 11 to 24, but is shown in FIGS. 8 and 9 described above. The optical waveguide WO4 is formed integrally with the p-type semiconductor portion PRO over the insulating layer CL.

Next, a p-type impurity is introduced into the semiconductor portion PR using an ion implantation method or the like to change the semiconductor portion PR into the p-type semiconductor portion PR, an n-type impurity is introduced into the semiconductor portion NR using an ion implantation method or the like to change the semiconductor portion NR into the n-type semiconductor portion NR, and a p-type impurity is introduced into the semiconductor portion PRO using an ion implantation method or the like to change the semiconductor portion PRO into the p-type semiconductor portion PRO.

For example, using a photoresist pattern formed using a photolithographic technique as a mask (ion implantation inhibition mask), the p-type impurity is ion-implanted into the semiconductor portions PR and PRO and, using another photoresist pattern formed using a photolithographic technique as a mask, the n-type impurity is ion-implanted into the semiconductor portion NR. Thus, the p-type semiconductor portions PR and PRO and the n-type semiconductor portion NR are formed. During the ion implantation, the optical waveguides WO1, WO2, WO3, and WO4 are covered with a photoresist pattern so that the p-type impurity and the n-type impurity are not implanted therein. The ion implantation step for introducing the p-type impurity into the semiconductor portion PR may be the same as or different from the ion implantation step for introducing the p-type impurity into the semiconductor portion PRO. After the introduction of the p-type impurity and the n-type impurity, it is also possible to perform heat treatment for activing the introduced impurities.

Figure 12:
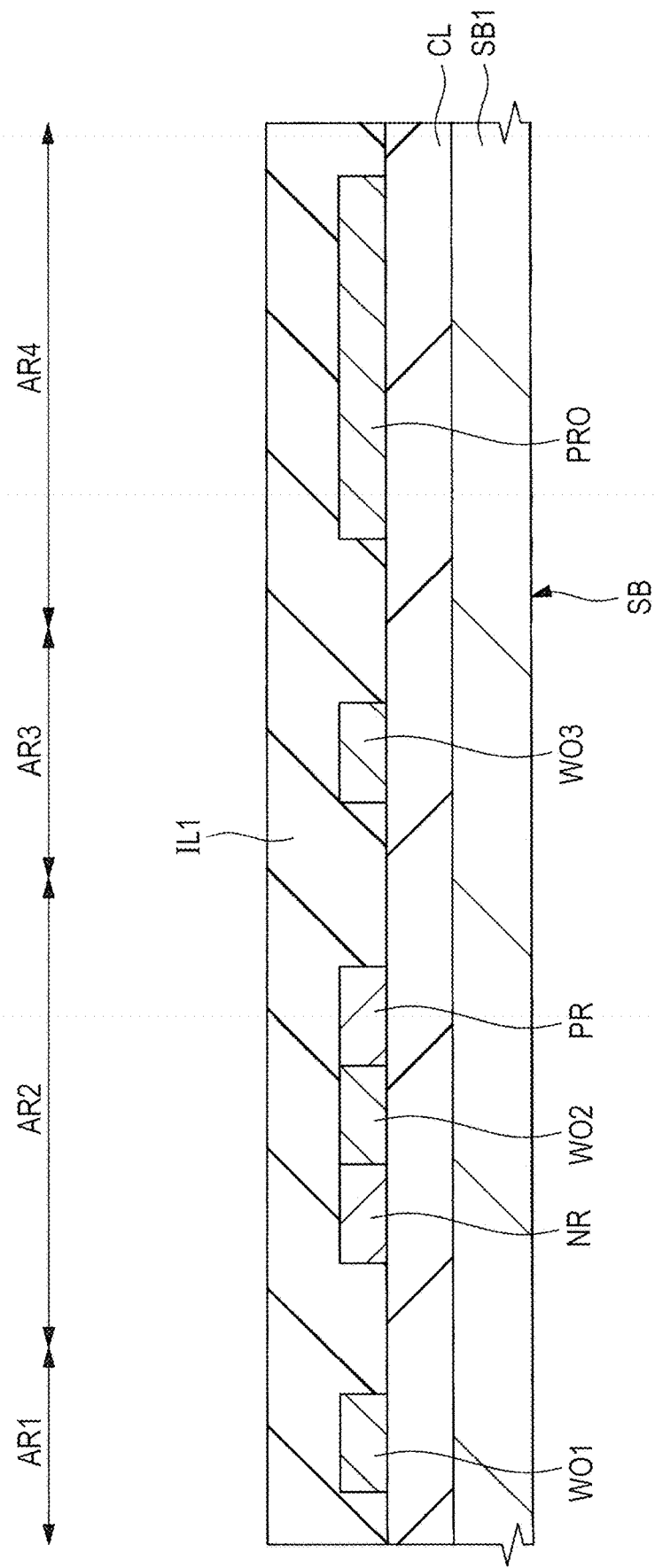
FIG. 12 is a main-portion cross-sectional view of the semiconductor device during the manufacturing process thereof, which is subsequent to FIG. 11.

Next, as shown in FIG. 12, over the SOI substrate SB, i.e., over the insulating layer CL, the insulating film IL1 is formed so as to cover the optical waveguides WO1, WO2, WO3, and WO4 and the semiconductor portions NR, PR, and PRO. The insulating film IL1 is preferably made of a silicon oxide film and can be formed using, e.g., a CVD (Chemical Vapor Deposition) method. The thickness of the formed insulating film IL1 is larger than the thickness of the semiconductor layer SL. After the formation of the insulating film IL1, it is also possible to perform the polishing of the upper surface of the insulating film IL1 using a CMP (Chemical Mechanical Polishing) method or the like and planarize the upper surface of the insulating film IL1. Even when the upper surface of the insulating film IL1 is polished, the optical waveguides WO1, WO2, WO3, and WO4 and the semiconductor portions NR, PR, and PRO are not exposed.

Figure 13:
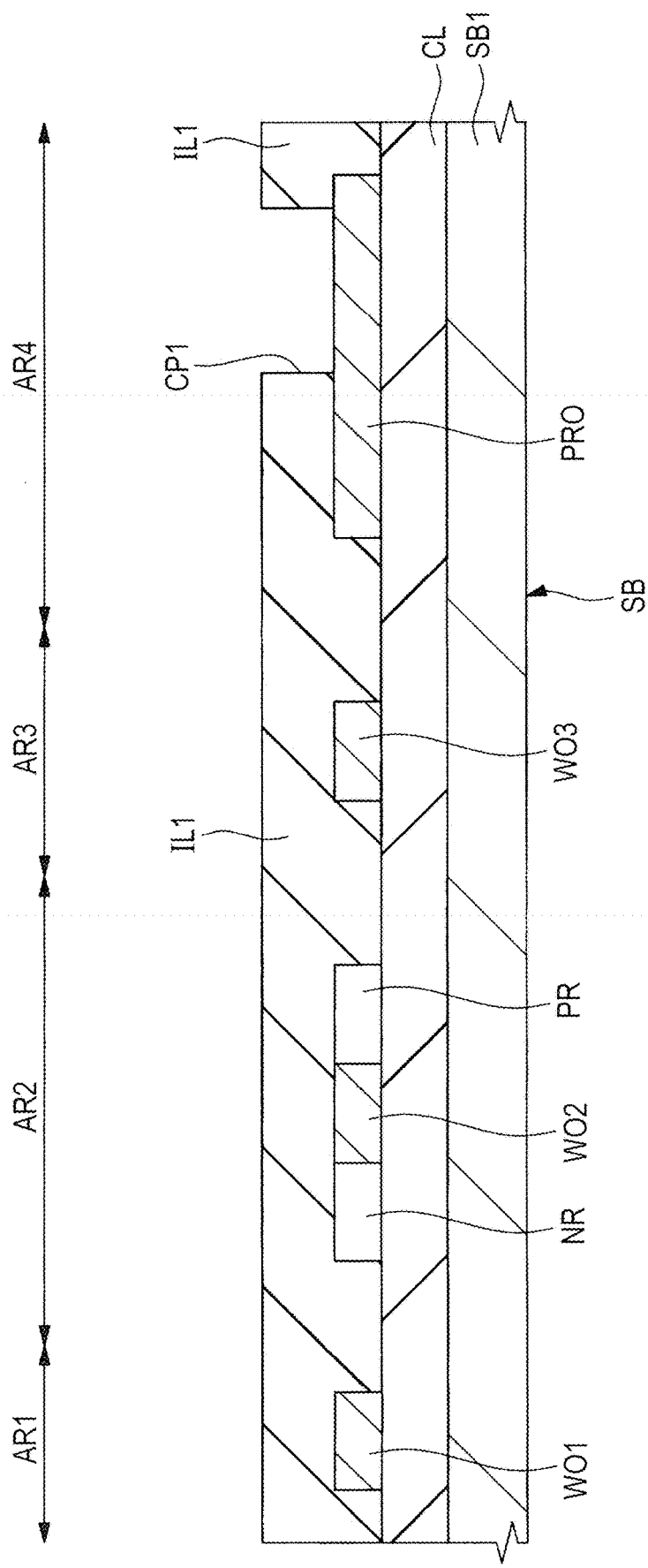
FIG. 13 is a main-portion cross-sectional view of the semiconductor device during the manufacturing process thereof, which is subsequent to FIG. 12.

Next, as shown in FIG. 13, using a photolithographic technique and an etching technique, the opening OP1 is formed in the insulating film IL1. The two-dimensional size (area) of the opening OP1 is smaller than the two-dimensional size of the p-type semiconductor portion PRO. In plan view, the opening OP1 is included in the p-type semiconductor portion PRO. The opening OP1 extends through the insulating film IL1 to reach the semiconductor portion PRO. At the bottom portion of the opening OP1, a portion of the upper surface of the semiconductor portion PRO is exposed.

Figure 14:
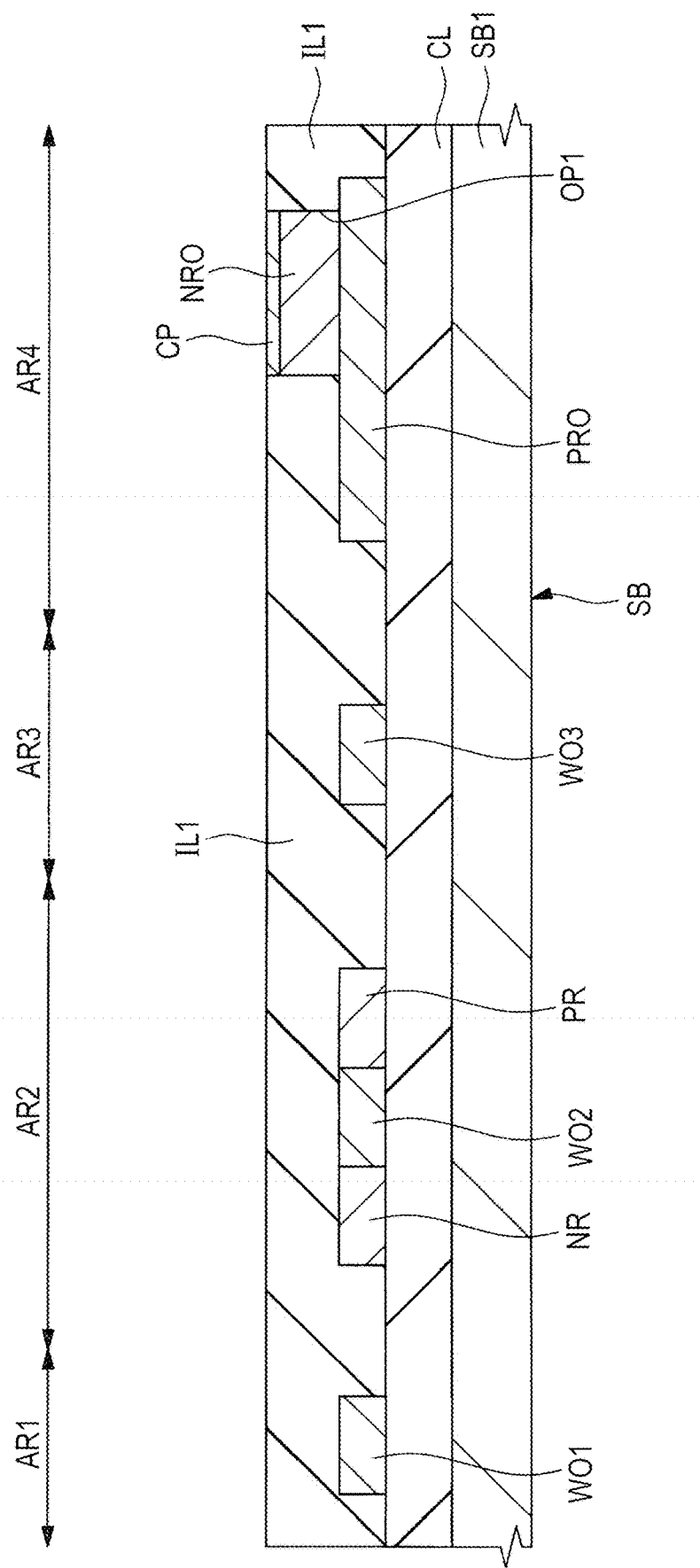
FIG. 14 is a main-portion cross-sectional view of the semiconductor device during the manufacturing process thereof, which is subsequent to FIG. 13.

Next, as shown in FIG. 14, over the p-type semiconductor portion PRO exposed at the bottom portion of the opening OP1, the n-type semiconductor portion (germanium layer) NRO made of germanium (Ge) is formed. The n-type semiconductor portion NRO can be formed using an epitaxial growth method and is formed selectively over the p-type semiconductor portion PRO in the opening OP1. The n-type semiconductor portion NRO can be formed by, e.g., epitaxially growing a germanium (Ge) layer containing an n-type impurity but, in another form, the n-type semiconductor portion NRO can also be formed by epitaxially growing a germanium (Ge) layer as an intrinsic semiconductor and then introducing an n-type impurity into the germanium (Ge) layer by an ion implantation method or the like. In this manner, the element with the pn junction structure including the p-type semiconductor portion PRO made of silicon and the n-type semiconductor portion NRO made of germanium is formed.

Next, over the n-type semiconductor portion NRO, the cap layer CP is selectively formed. The cap layer CP is formed so as to improve surface roughness of germanium forming the n-type semiconductor portion NRO or ensure a film thickness. The cap layer CP can be formed by, e.g., epitaxially growing a semiconductor layer made of silicon (Si) (semiconductor layer for the cap layer CP) over the n-type semiconductor portion NRO and then introducing an n-type impurity into the semiconductor layer using an ion implantation method. In this case, the cap layer CP is made of an n-type silicon layer.

Figure 15:
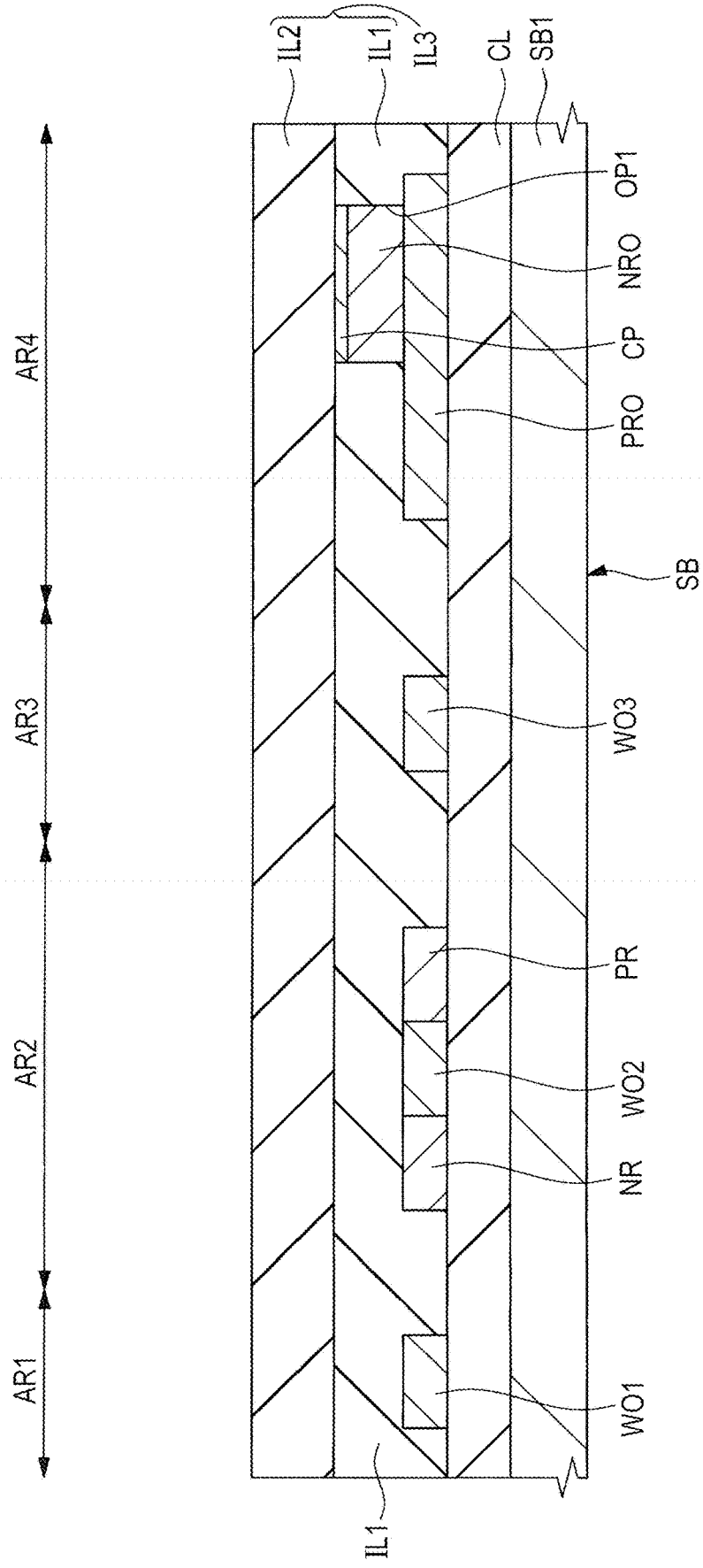
FIG. 15 is a main-portion cross-sectional view of the semiconductor device during the manufacturing process thereof, which is subsequent to FIG. 14.

Next, as shown in FIG. 15, over the insulating film IL1 including the cap layer CP, the insulating film IL2 is formed. After the formation of the insulating film IL2, it is also possible to perform the polishing of the upper surface of the insulating film IL2 or the like using a CMP method and planarize the upper surface of the insulating film IL2.

The insulating film IL2 is preferably made of a silicon oxide film and can be formed using, e.g., a CVD method. A combination of the insulating film IL1 and the insulating film IL2 corresponds to the interlayer insulating film IL3. The interlayer insulating film IL3 is made of the multi-layer film including the insulating film IL1 and the insulating film IL2 over the insulating film IL1. On the other hand, over the cap layer CP, the insulating film IL2 is formed, but the insulating film IL1 is not formed. Consequently, the interlayer insulating film IL3 located over the cap layer CP is made of the insulating film IL2, while the interlayer insulating film IL3 except for the portion thereof located over the cap layer CP is made of the multi-layer film including the insulating film IL1 and the insulating film IL2. The interlayer insulating film IL3 is formed over the insulating layer CL so as to cover the optical waveguide WO1, the optical waveguide WO2, the p-type semiconductor portion PR, the n-type semiconductor portion NR, the optical waveguide WO3, the optical waveguide WO4, the p-type semiconductor portion PRO, the n-type semiconductor portion NRO, and the cap layer CP.

Figure 16:
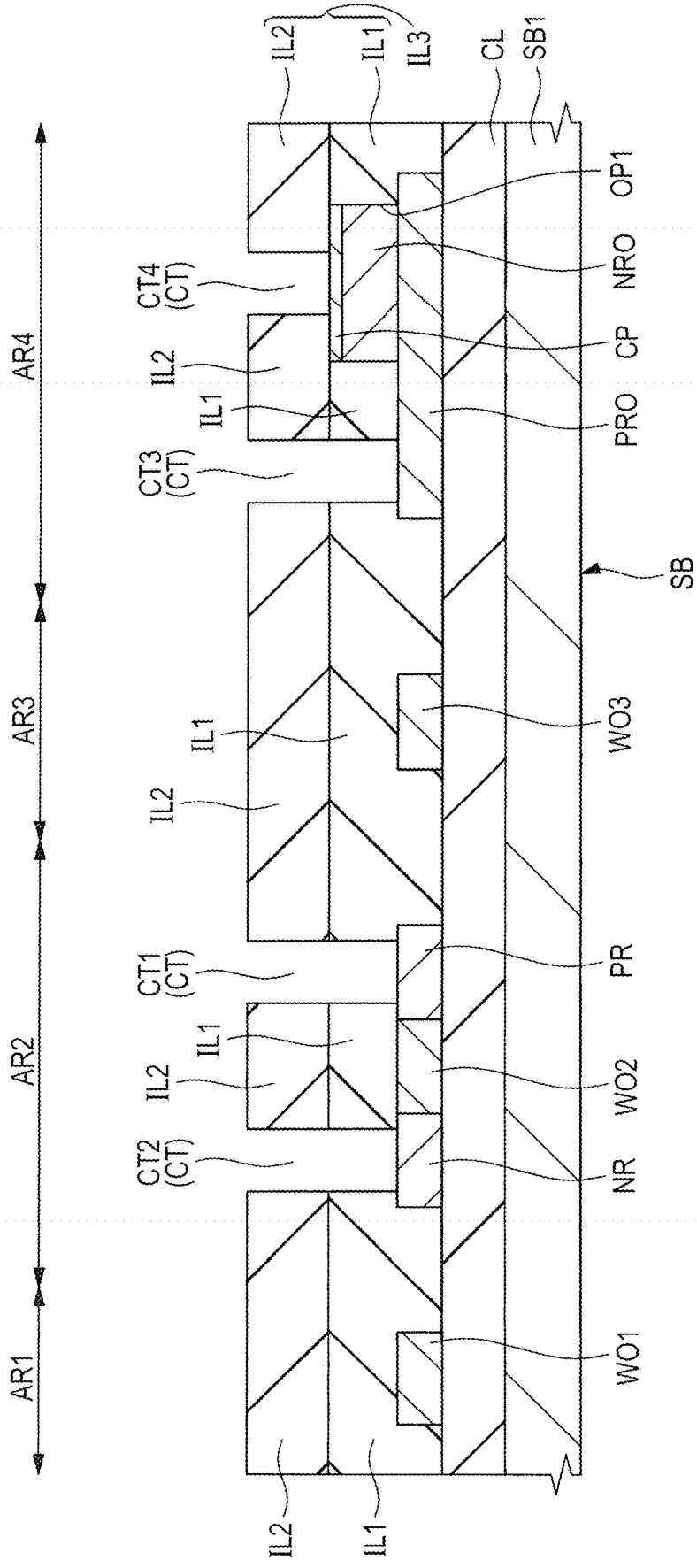
FIG. 16 is a main-portion cross-sectional view of the semiconductor device during the manufacturing process thereof, which is subsequent to FIG. 15.

Next, as shown in FIG. 16, using a photolithographic technique and an etching technique, the contact holes (openings) CT are formed in the interlayer insulating film IL3. The contact holes CT include the foregoing contact holes CT1, CT2, CT3, and CT4 and are formed so as to extend through the interlayer insulating film IL3. That is, in the area AR2, the contact holes CT1 are formed over the p-type semiconductor portions PR, while the contact holes CT2 are formed over the n-type semiconductor portions NR. In the area AR4, the contact hole CT3 is formed over the portion of the p-type semiconductor portion PRO which is uncovered with the n-type semiconductor portion NRO, while the contact hole CT4 is formed over the cap layer CP over the n-type semiconductor portion NRO.

In plan view, the contact holes CT1 are included in the p-type semiconductor portions PR. The contact holes CT1 extend through the interlayer insulating film IL3 (insulating films IL2 and IL1) to reach the p-type semiconductor portions PR. At the bottom portion of each of the contact holes CT1, a portion of the upper surface of the p-type semiconductor portion PR is exposed. In plan view, the contact holes CT2 are included in the n-type semiconductor portions NR. The contact holes CT2 extend through the interlayer insulating film IL3 (insulating films IL2 and IL1) to reach the n-type semiconductor portions NR. At the bottom portion of each of the contact holes CT2, a portion of the upper surface of the n-type semiconductor portion NR is exposed. In plan view, the contact hole CT3 is included in the portion of the p-type semiconductor portion PRO which is uncovered with the n-type semiconductor portion NR. The contact hole CT3 extends through the interlayer insulating film IL3 (insulating films IL2 and IL1) to reach the p-type semiconductor portion PRO. At the bottom portion of the contact hole CT3, a portion of the upper surface of the p-type semiconductor portion PRO is exposed. In plan view, the contact hole CT4 is included in the cap layer CP over the n-type semiconductor portion NRO. The contact hole CT4 extends through the interlayer insulating film IL3 (insulating film IL2) to reach the cap layer CP. At the bottom portion of the contact hole CT4, a portion of the upper surface of the cap layer CP is exposed.

For example, the contact holes CT (CT1, CT2, CT3, and CT4) can be formed as follows. First, over the interlayer insulating film IL3, using a photolithographic technique, a photoresist pattern (not shown) is formed. The photoresist pattern has respective openings for the contact holes CT1, CT2, CT3, and CT4. Then, using the photoresist pattern as an etching mask, the interlayer insulating film IL3 is etched to be able to be formed with the contact holes CT1, CT2, CT3, and CT4. Subsequently, the photoresist pattern is removed by ashing or the like. In this case, the contact holes CT1, CT2, CT3, and CT4 are simultaneously formed in the same step.

In another form, the formation of the contact holes CT1, CT2, and CT3 and the formation of the contact hole CT4 can also be performed in different steps. A description will be given also of that case. First, over the interlayer insulating film IL3, using a photolithographic technique, a photoresist pattern (not shown) is formed. The photoresist pattern has an opening for the contact hole CT4, but does not have respective openings for the contact holes CT1, CT2, and CT3. Then, using the photoresist pattern as an etching mask, the interlayer insulating film IL3 is etched to be formed with the contact hole CT4. Subsequently, the photoresist pattern is removed by ashing or the like, and then another photoresist pattern (not shown) is formed over the interlayer insulating film IL3 using a photolithographic technique. The photoresist pattern formed at this time has respective openings for the contact holes CT1, CT2, and CT3, but does not have an opening for the contact hole CT4. Consequently, in the contact hole CT4, the photoresist pattern is embedded. Then, using the photoresist pattern as an etching mask, the interlayer insulating film IL3 is etched to be formed with the contact holes CT1, CT2, and CT3. Subsequently, the photoresist pattern is removed by ashing or the like. Thus, the contact holes CT1, CT2, CT3, and CT4 can be formed. In this case, the formation of the contact holes CT1, CT2, and CT3 and the formation of the contact hole CT4 are performed in different steps.

In terms of minimizing the number of process steps, it is desirable to simultaneously form the contact holes CT1, CT2, CT3, and CT4 in the same step. This can reduce the number of steps in the manufacturing process of the semiconductor device and reduce the manufacturing cost of the semiconductor device. On the other hand, when the step of forming the contact hole CT4 and the step of forming the contact holes CT1, CT2, and CT3 are performed separately, the number of steps in the manufacturing process is undesirably increased. However, the advantage of being able of inhibit over-etching of the cap layer CP exposed at the bottom portion of the contact hole CT4 during the formation of the contact hole CT4 can be obtained.

Figure 17:
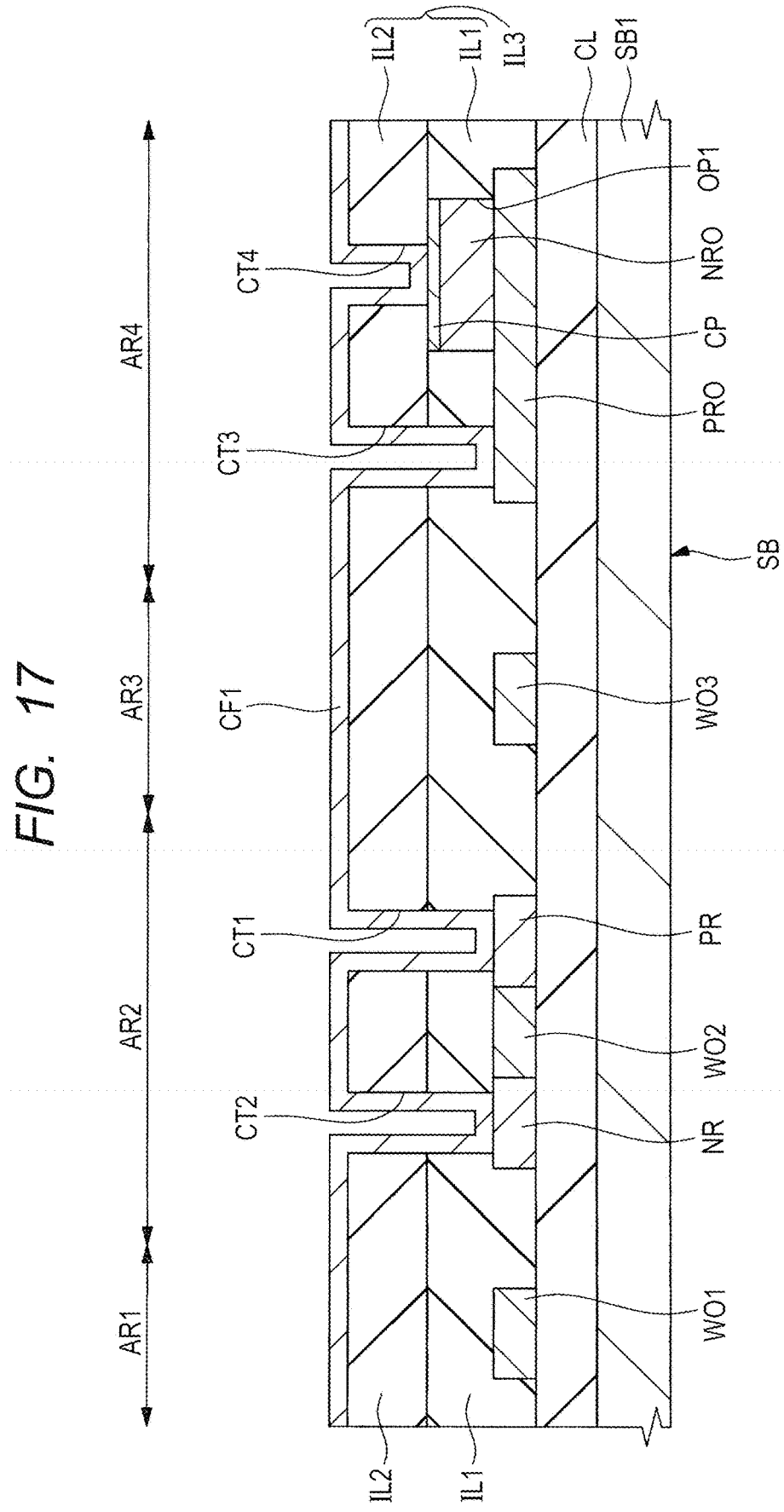
FIG. 17 is a main-portion cross-sectional view of the semiconductor device during the manufacturing process thereof, which is subsequent to FIG. 16.

Next, as shown in FIG. 17, over the interlayer insulating film IL3 (i.e., over the insulating film IL2), a conductive film (conductor film) CF1 is formed.

The conductive film CF1 is the conductive for forming the heaters HT, but serves also as the conductive film for forming the contact portions CB. The conductive film CF1 is preferably made of a metal material, and more preferably made of a titanium (Ti) film, a titanium nitride (TiN) film, or a multi-layer film including a titanium (Ti) film and a titanium nitride (TiN) film. The conductive film CF1 can be formed using a sputtering method or the like. Since the conductive film CF1 is formed in the state where the contact holes CT (CT1, CT2, CT3, and CT4) are formed, the conductive film CF1 is formed not only over the upper surface of the interlayer insulating film IL3, but also in the contact holes CT. Specifically, the conductive film CF1 is formed also over the bottom surfaces and side walls (side surfaces) of the contact holes CT (CT1, CT2, CT3, and CT4).

Figure 18:
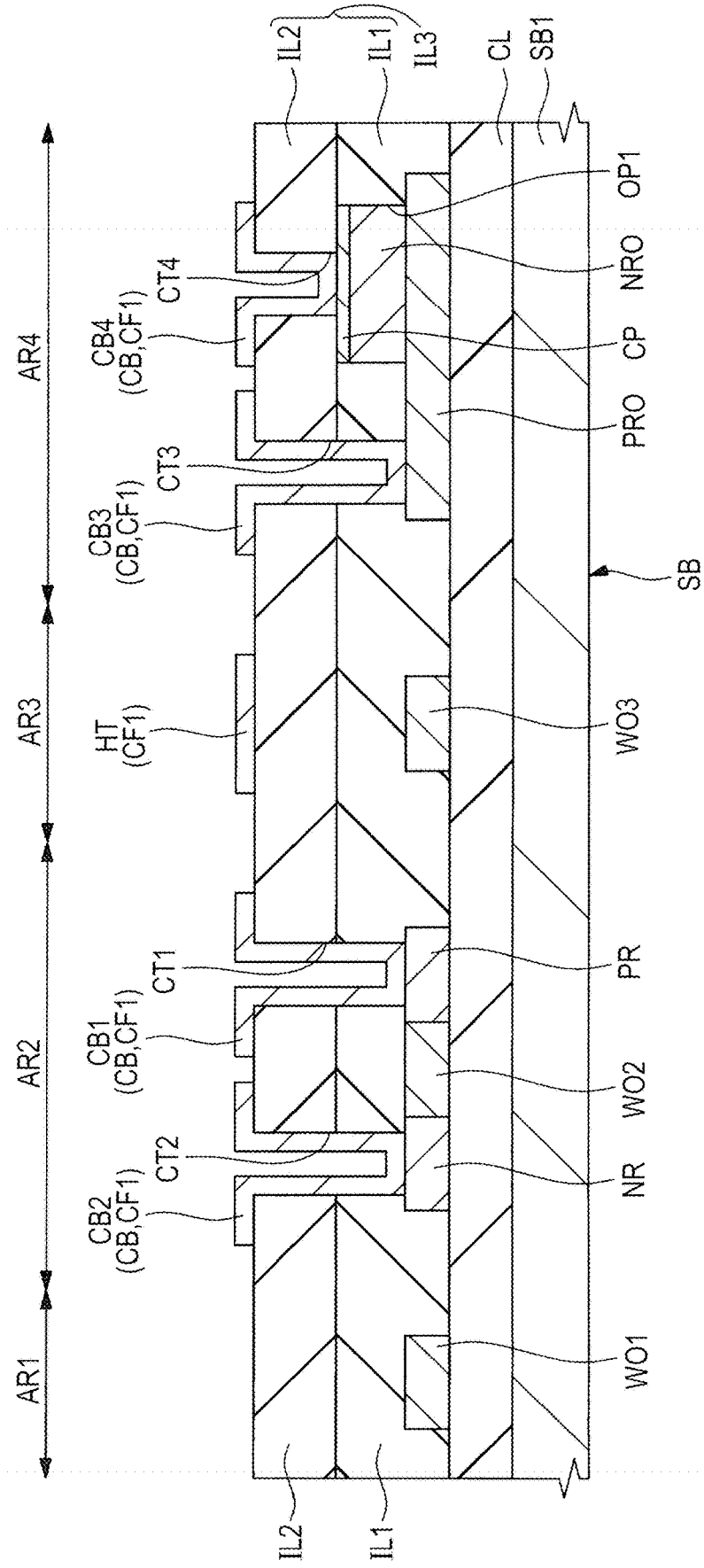
FIG. 18 is a main-portion cross-sectional view of the semiconductor device during the manufacturing process thereof, which is subsequent to FIG. 17.

Next, as shown in FIG. 18, using a photolithographic technique and an etching technique, the conductive film CF1 is patterned to form the heaters HT and the contact potions CB (CB1, CB2, CB3, and CB4).

Specifically, the heaters HT and the contact portions CB can be formed as follows. First, over the conductive film CF1, using a photolithographic technique, a photoresist pattern (not shown) is formed. Then, using the photoresist pattern as an etching mask, the conductive film CF1 is etched to be able to form the heaters HT and the contact portions CB1, CB2, CB3, and CB4. Subsequently, the photoresist pattern is removed by ashing or the like. Each of the heaters HT and the contact portions CB1, CB2, CB3, and CB4 is made of the patterned conductive film CF1. The heaters HT, the contact portions CB1, the contact portions CB2, the contact portion CB3, and the contact portion CB4 are simultaneously formed in the same step, but are unconnected to and detached from each other. The heaters HT, the contact portions CB1, the contact portions CB2, the contact portion CB3, and the contact portion CB4, which are formed by patterning the same conductive film CF1, are made of the same material. When the material of the conductive film CF1 is selected as described above, each of the heaters HT and the contact portions CB1, CB2, CB3, and CB4 is made of a titanium film, a titanium nitride film, or a multi-layer film including a titanium (Ti) film and a titanium nitride (TiN) film.

In the area AR3, the heaters HT are formed over the interlayer insulating film IL3 and disposed over the optical waveguides WO3 so as to be able to reliably heat the optical waveguides WO3.

Each of the contact portions CB is formed continuously in the contact hole CT and over the interlayer insulating film IL3. That is, each of the contact portions CB integrally has a portion made of the conductive film CF1 in the contact hole CT and a portion made of the conductive film CF1 over the upper surface of the interlayer insulating film IL3. In other words, each of the contact portions CB integrally has the portion located in the contact hole CT and the portion located over the upper surface of the interlayer insulating film IL3 around the contact hole CT. Accordingly, when the conductive film CF1 is patterned, the conductive film CF1 is left in and around the contact holes CT. The conductive film CF1 remaining in and around the contact holes CT forms the contact portions CB.

Accordingly, the contact portions CB1 are formed continuously in the contact holes CT1 and over the interlayer insulating film IL3 and integrally has portions located in the contact holes CT1 and portions located over the upper surface of the interlayer insulating film IL3. The contact portions CB1 are in contact with the p-type semiconductor portions PR at the bottom portions of the contact holes CT1 and electrically coupled with the p-type semiconductor portions PR.

The contact portions CB2 are formed continuously in the contact holes CT2 and over interlayer insulating film IL3 and integrally has portions located in the contact holes CT2 and portions located over the upper surface of the interlayer insulating film IL3. The contact portions CB2 are in contact with the n-type semiconductor portions NR at the bottom portions of the contact holes CT2 and electrically coupled with the n-type semiconductor portions NR.

The contact portion CB3 is formed continuously in the contact hole CT3 and over the interlayer insulating film IL3 and integrally has a portion located in the contact hole CT3 and a portion located over the upper surface of the interlayer insulating film IL3. The contact portion CB3 is in contact with the p-type semiconductor portion PRO at the bottom portion of the contact hole CT3 and electrically coupled with the p-type semiconductor portion PRO.

The contact portion CB4 is formed continuously in the contact hole CT4 and over the interlayer insulating film IL3 and integrally has a portion located in the contact hole CT4 and a portion located over the upper surface of the interlayer insulating film IL3. The contact portion CB4 is in contact with the cap layer CP at the bottom portion of the contact hole CT4 and electrically coupled with the cap layer CP.

Note that, in the case shown in FIG. 18, the thickness of the conductive film CF1 is small and, specifically, smaller than half the diameter of each of the contact holes CT. Consequently, when the conductive film CF1 is formed, the conductive film CF1 is formed over the side wall and bottom surface of the contact hole CT, but the contact hole CT is not completely filled with the conductive film CF1. In this case, the formed contact portion CB integrally has a portion extending over the upper surface of the interlayer insulating film IL3, a portion extending over the side wall of the contact hole CT, and a portion extending over the bottom surface of the contact hole CT. However, the contact hole CT is not completely filled with the contact portion CB. As a result, when the interlayer insulating film IL4 is formed later, in the region of the contact hole CT where the contact portion CB is not present, a portion of the interlayer insulating film IL4 is embedded. The resistance value of each of the heaters HT is set so as to allow the heater HT to perform the function of a heating element which heats the optical waveguide WO3, and the two-dimensional size and thickness of the heater HT are set so as to allow the resistance value to be obtained. Consequently, the thickness of the conductive film CF1 may be reduced but, in such a case, the contact portions CB shown in FIG. 18 may be formed appropriately.

In another form, in the case where the thickness of the conductive film CF1 is large, specifically where the thickness of the conductive film CF1 is not less than half the diameter of each of the contact holes CT, when the conductive film CF1 is formed, the contact hole CT is completely filled with the conductive film CF1. In this case, the formed contact portion CB is integrally provided with a portion extending over the upper surface of the interlayer insulating film IL3 and a portion filling the contact hole CT so that the contact hole CT is completely filled with the contact portion CB.

Figure 19:
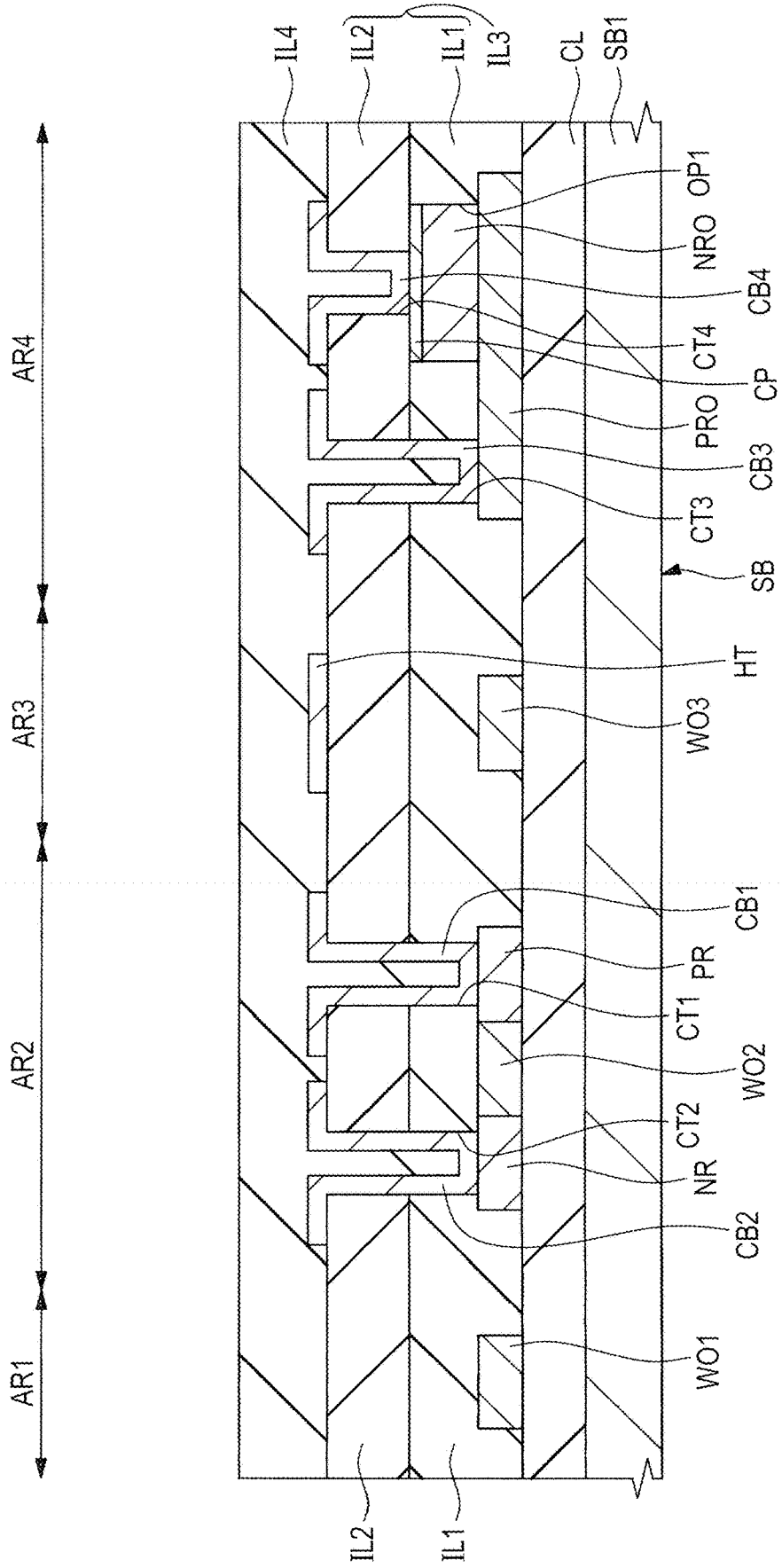
FIG. 19 is a main-portion cross-sectional view of the semiconductor device during the manufacturing process thereof, which is subsequent to FIG. 18.

Next, as shown in FIG. 19, over the interlayer insulating film IL3, the interlayer insulating film IL4 is formed so as to cover the heaters HT and the contact portions CB (CB1, CB2, CB3, and CB4). After the formation of the interlayer insulating film IL4, it is also possible to perform the polishing of the upper surface of the interlayer insulating film IL4 or the like using a CMP method and thus planarize the upper surface of the interlayer insulating film IL4. Preferably, the interlayer insulating film IL4 is made of a silicon oxide film and can be formed using, e.g., a CVD method.

Figure 20:
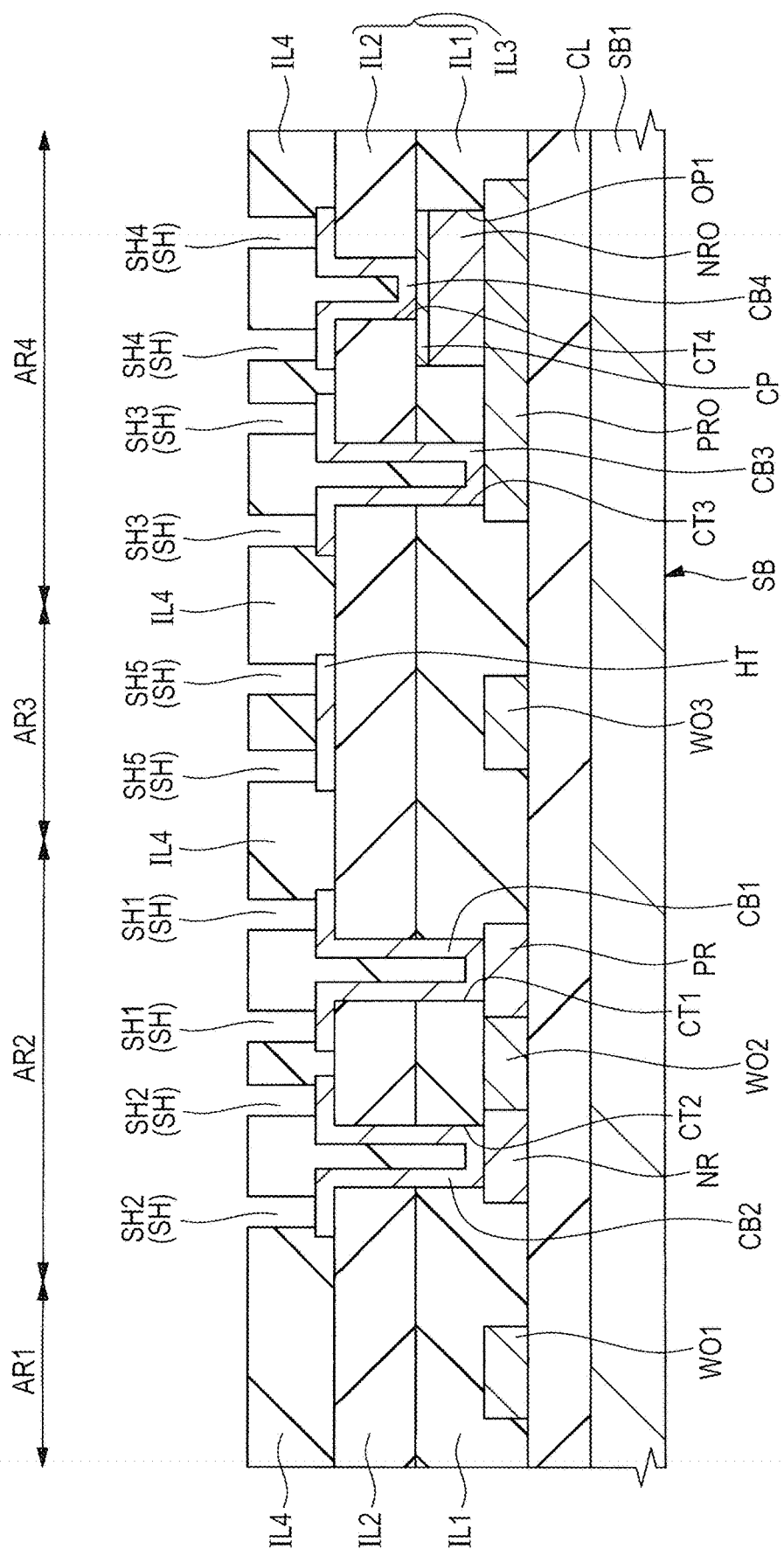
FIG. 20 is a main-portion cross-sectional view of the semiconductor device during the manufacturing process thereof, which is subsequent to FIG. 19.

Next, as shown in FIG. 20, using a photolithographic technique and an etching technique, through holes (openings) SH are formed in the interlayer insulating film IL4. The through holes SH are formed so as to extend through the interlayer insulating film IL4.

For example, the through holes SH can be formed as follows. First, using a photolithographic technique, a photoresist pattern is formed over the interlayer insulating film IL4. The photoresist pattern has respective openings for the through holes SH. Then, using the photoresist pattern as an etching mask, the interlayer insulating film IL4 is etched to be able to be formed with the through holes SH. Subsequently, the photoresist pattern is removed by ashing or the like. Through holes SH1, SH2, SH3, SH4, and SH5 are simultaneously formed in the same step.

The through holes SH include the through holes SH1, SH2, SH3, SH4, and SH5. In the area AR2, the through holes SH1 are formed over the contact portions CB1, while the through holes SH2 are formed over the contact portions CB2. In the area AR4, the through holes SH3 are formed over the contact portion CB3, while the through holes SH4 are formed over the contact portion CB4. In the area AR3, the through holes SH5 are formed over the heaters HT.

In plan view, the through holes SH1 are included in the portions of the contact portions CB1 which are located over the upper surface of the interlayer insulating film IL3. The through holes SH1 extend through the interlayer insulating film IL4 to reach the portions of the contact portion CB1 which are located over the upper surface of the interlayer insulating film IL3. At the bottom portion of each of the through holes SH1, a portion of the upper surface of the contact portion CB1 is exposed. In plan view, the through holes SH2 are included in the portions of the contact portions CB2 which are located over the upper surface of the interlayer insulating film IL3. The through holes SH2 extend through the interlayer insulating film IL4 to reach the portions of the contact portions CB2 which are located over the upper surface of the interlayer insulating film IL3. At the bottom portion of each of the through holes SH2, a portion of the upper surface of the contact portion CB2 is exposed. In plan view, the through holes SH3 are included in the portion of the contact portion CB3 which is located over the upper surface of the interlayer insulating film IL3. The through holes SH3 extend through the interlayer insulating film IL4 to reach the portion of the contact portion CB3 which is located over the upper surface of the interlayer insulating film IL3. At the bottom portion of each of the through holes SH3, a portion of the upper surface of the contact portion CB3 is exposed. In plan view, the through holes SH4 are included in the portion of the contact portion CB4 which is located over the upper surface of the interlayer insulating film IL3. The through holes SH4 extend through the interlayer insulating film IL4 to reach the portion of the contact portion CB4 which is located over the upper surface of the interlayer insulating film IL3. At the bottom portion of each of the through holes SH4, a portion of the upper surface of the contact portion CB4 is exposed. In plan view, the through holes SH5 are included in the heaters HT located over the upper surface of the interlayer insulating film IL3. The through holes SH5 extend through the interlayer insulating film IL4 to reach the heaters HT located over the upper surface of the interlayer insulating film IL3. At the bottom portion of each of the through holes SH4, a portion of the upper surface of the heater HT is exposed. The respective depths of the through holes SH1, SH2, SH3, SH4, and SH5 are substantially the same.

Figure 21:
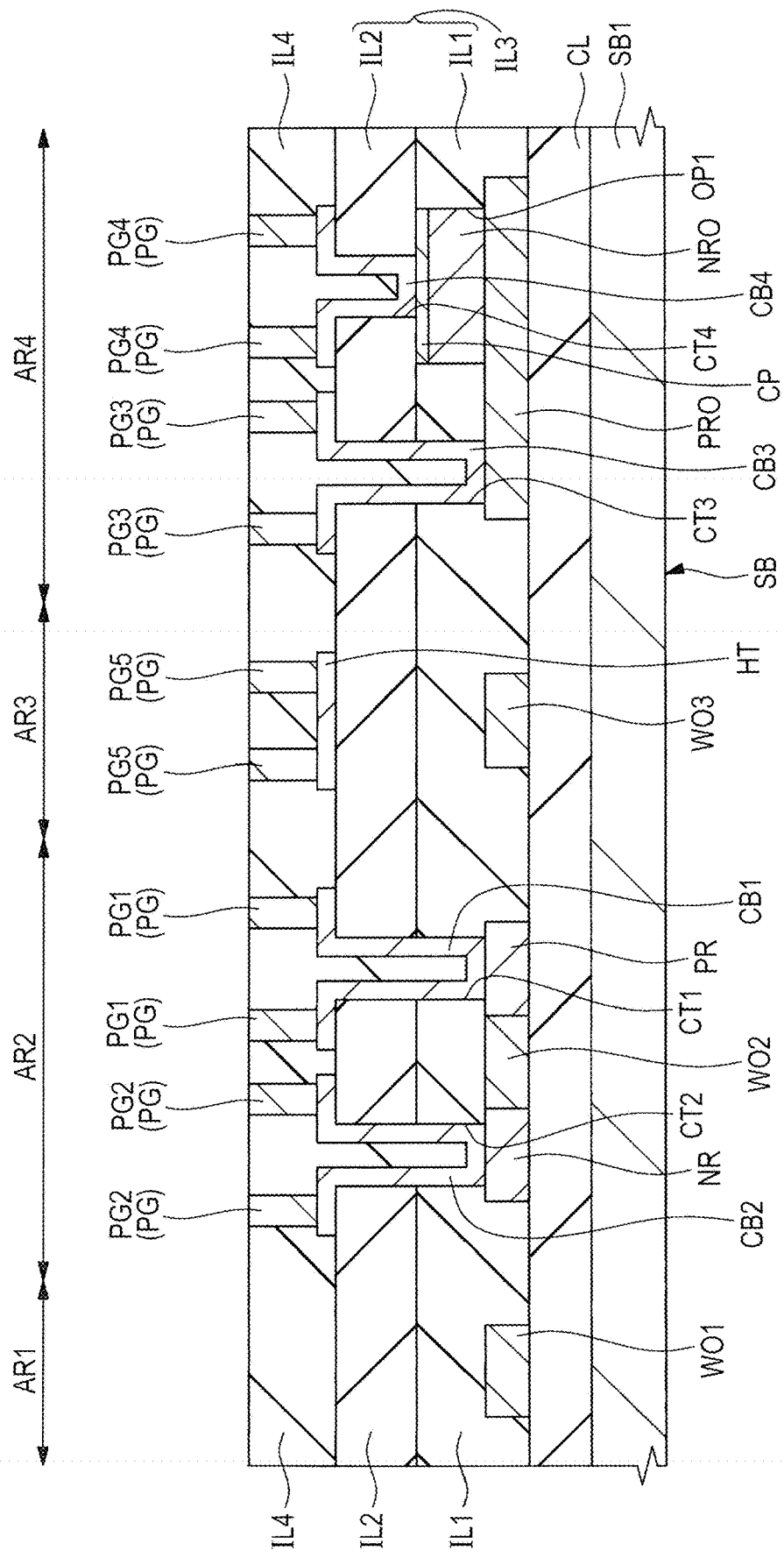
FIG. 21 is a main-portion cross-sectional view of the semiconductor device during the manufacturing process thereof, which is subsequent to FIG. 20.

Next, as shown in FIG. 21, in the through holes SH (SH1, SH2, SH3, SH4, and SH5) of the interlayer insulating film IL4, the conductive plugs PG are formed (embedded).

For example, the plugs PG can be formed as follows. First, over the interlayer insulating film IL4 including the bottom surfaces and side walls of the through holes SH, a barrier conductor film is formed. Then, over the barrier conductor film, a main conductor film made of a tungsten film or the like is formed so as to be embedded in the through holes SH. The barrier conductor film is made of, e.g., a titanium film, a titanium nitride film, or a multi-layer film thereof. Subsequently, by removing the unneeded main conductor film and the unneeded barrier conductor film which are located outside the through holes SH by a CMP method, an etch-back method, or the like, the plugs PG can be formed. Each of the plugs PG includes the main conductor film and the barrier conductor film which remain in the through hole SH.

The plugs PG embedded in the through holes SH1 are the plugs PG1. The plugs PG1 are disposed over the portions of the contact portions CB1 which are located over the upper surface of the interlayer insulating film IL3 and are in contact with and electrically coupled with the contact portions CB1. The plugs PG embedded in the through holes SH2 are the plugs PG2. The plugs PG2 are disposed over the portions of the contact portions CB2 which are located over the upper surface of the interlayer insulating film IL3 and are in contact with and electrically coupled with the contact portions CB2. The plugs PG embedded in the through holes SH3 are the plugs PG3. The plugs PG3 are disposed over the portion of the contact portion CB3 which is located over the upper surface of the interlayer insulating film IL3 and are in contact with and electrically coupled with the contact portion CB3. The plugs PG embedded in the through holes SH4 are the plugs PG4. The plugs PG4 are disposed over the portion of the contact portion CB4 which is located over the upper surface of the interlayer insulating film IL3 and are in contact with and electrically coupled with the contact portion CB4. The plugs PG embedded in the through holes SH5 are the plugs PG5. The plugs PG5 are disposed over the heaters HT located over the upper surface of the interlayer insulating film IL3 and are in contact with and electrically coupled with the heaters HT. The respective heights (dimensions in a height direction) of the plugs PG1, PG2, PG3, PG4, and PG5 are substantially the same.

Figure 22:
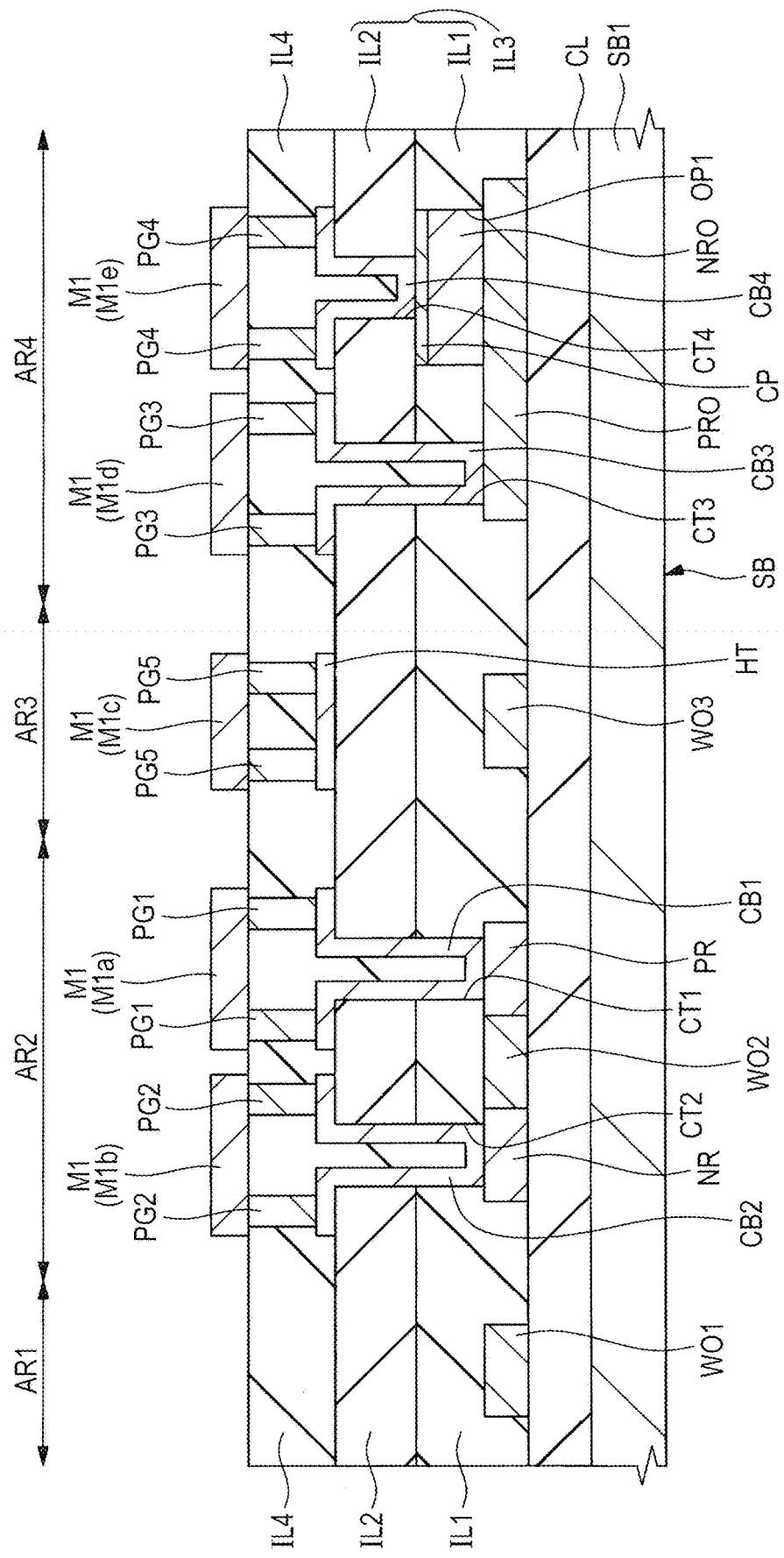
FIG. 22 is a main-portion cross-sectional view of the semiconductor device during the manufacturing process thereof, which is subsequent to FIG. 21.

Next, as shown in FIG. 22, over the interlayer insulating film IL4 in which the plugs PG are embedded, the wires M1 are formed.

For example, the wires M1 can be formed as follows. First, over the interlayer insulating film IL4 in which the plugs PG are embedded, a conductive film for forming the wires M1 is formed. The conductive film is made of, e.g., a multi-layer film including a barrier conductor film, a main conductor film located thereover, and a barrier conductor film located thereover. The barrier conductor film is made of a titanium film, a titanium nitride film, or a multi-layer film thereof. The main conductor film is made of an aluminum film or an aluminum alloy film. Then, over the conductive film, using a photolithographic technique, a photoresist pattern is formed. Then, using the photoresist pattern as an etching mask, the conductive film is etched to be able to form the wires M1. Subsequently, the photoresist pattern is removed by ashing or the like. Each of the wires M1 is made of the patterned conductive film. When the wires M1 are formed, the respective upper surfaces of the plugs PG are in contact with the wires M1 so that each of the plugs PG is electrically coupled with the wire M1 located thereover.

The wires M1 include the foregoing wires M1$a$, M1$b$, M1$c$, M1$d$, and M1$e$. The wires M1$a$ are electrically coupled with the p-type semiconductor regions PR via the plugs PG1 and the contact portions CB1. The wires M1$b$ are electrically coupled with the n-type semiconductor regions NR via the plugs PG2 and the contact portions CB2. The wires M1$c$ are electrically coupled with the heaters HT via the plugs PG5. The wire M1$d$ is electrically coupled with the p-type semiconductor region PRO via the plugs PG3 and the contact portion CB3. The wire M1$e$ is electrically coupled with the cap layer CP via the plugs PG4 and the contact portion CB4 and also electrically coupled with the n-type semiconductor region NR via the cap layer CP.

Figure 23:
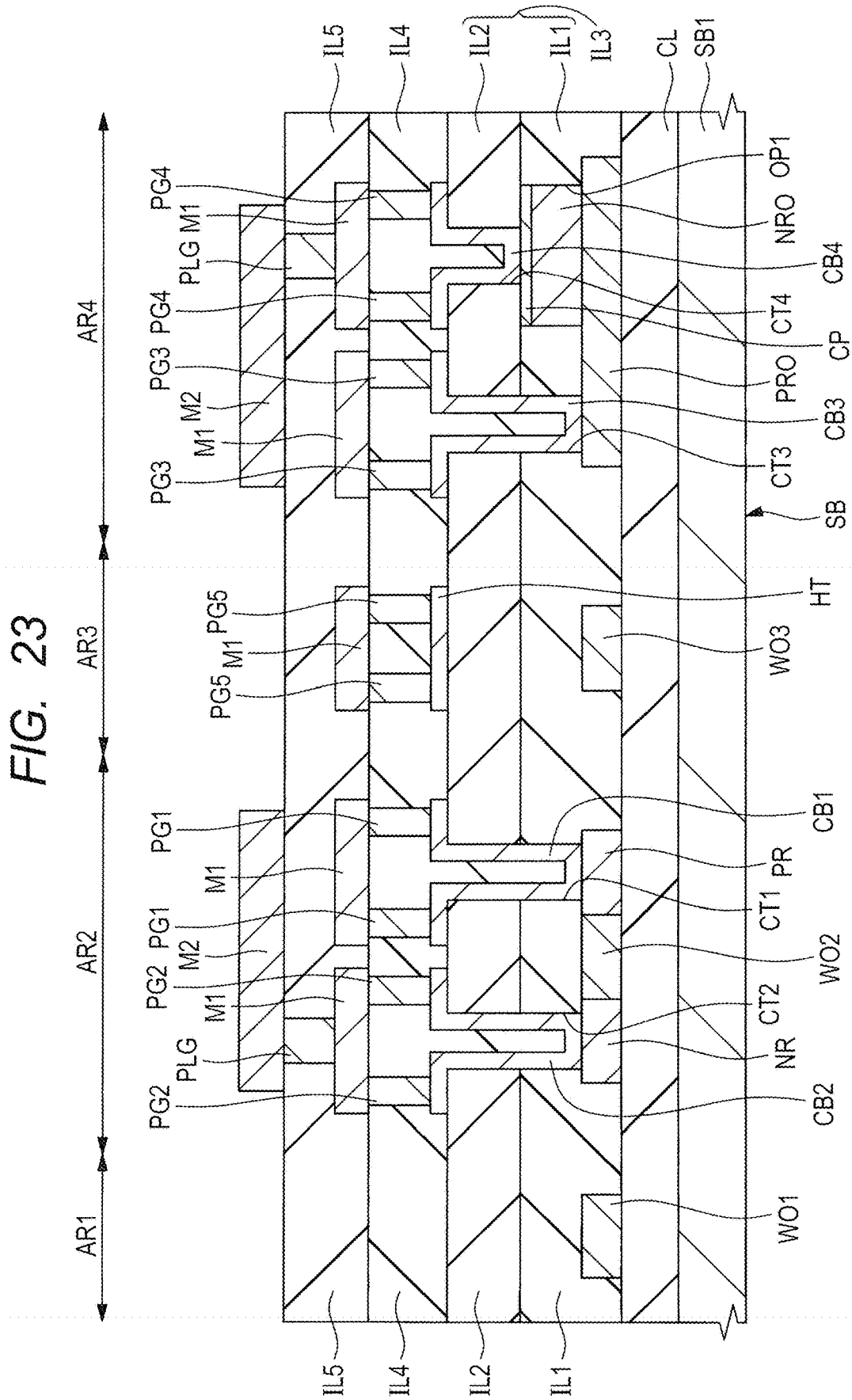
FIG. 23 is a main-portion cross-sectional view of the semiconductor device during the manufacturing process thereof, which is subsequent to FIG. 22.

Next, as shown in FIG. 23, over the interlayer insulating film IL4, the interlayer insulating film IL5 is formed so as to cover the wires M1. After the formation of the interlayer insulating film IL5, it is also possible to perform the polishing of the upper surface of the interlayer insulating film IL5 or the like using a CMP method and thus planarize the upper surface of the interlayer insulating film IL5. The interlayer insulating film IL5 is preferably made of a silicon oxide film and can be formed using, e.g., a CVD method.

Next, using a photolithographic technique and an etching technique, through holes (penetration holes) are formed in the interlayer insulating film IL5. Then, in the through holes, the conductive plugs PLG are formed (embedded). The plugs PLG can be formed using substantially the same method as used to form the foregoing plugs PG.

Next, over the interlayer insulating film IL5 in which the plugs PLG are embedded, the wires M2 are formed. The wires M2 can be formed using substantially the same method as used to form the wires M1. That is, a conductive film for forming the wires M2 is formed over the interlayer insulating film IL5 in which the plugs PLG are embedded and then patterned using a photolithographic technique and an etching technique to be able to form the wires M2. The plugs PLG are disposed between the wires M2 and the wires M1 to electrically couple the wires M2 to the wires M1.

Figure 24:
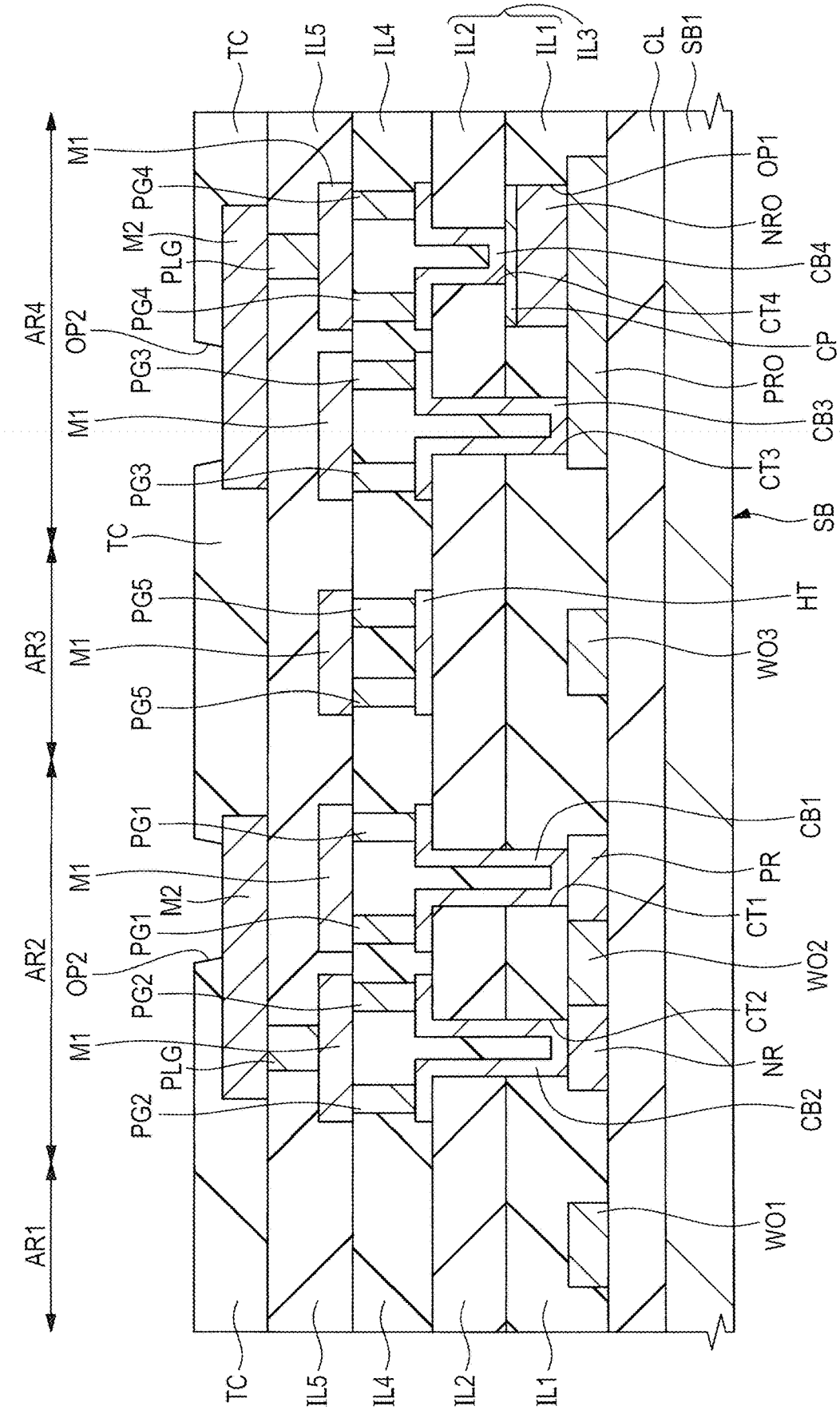
FIG. 24 is a main-portion cross-sectional view of the semiconductor device during the manufacturing process thereof, which is subsequent to FIG. 23.

Next, as shown in FIG. 24, over the interlayer insulating film IL5, the protective film TC is formed so as to cover the wires M2. The protective film TC is made of, e.g., a silicon oxynitride film and can be formed using a CVD method or the like.

Next, using a photolithographic technique and an etching technique, the openings OP2 are formed in the protective film TC. From each of the openings OP2 of the protective film TC, a portion of the wire M2 is exposed. The portions of the wires M2 which are exposed from the openings OP2 serve as the pad portions (bonding pads or external coupling portions). Subsequently, the SOI substrate SB is diced (cut) together with the structure located thereover to be singulated. In this manner, semiconductor chips (semiconductor devices) are obtained.

Thus, the semiconductor device in the present first embodiment can be manufactured.

[Background to Study]

Figure 25:
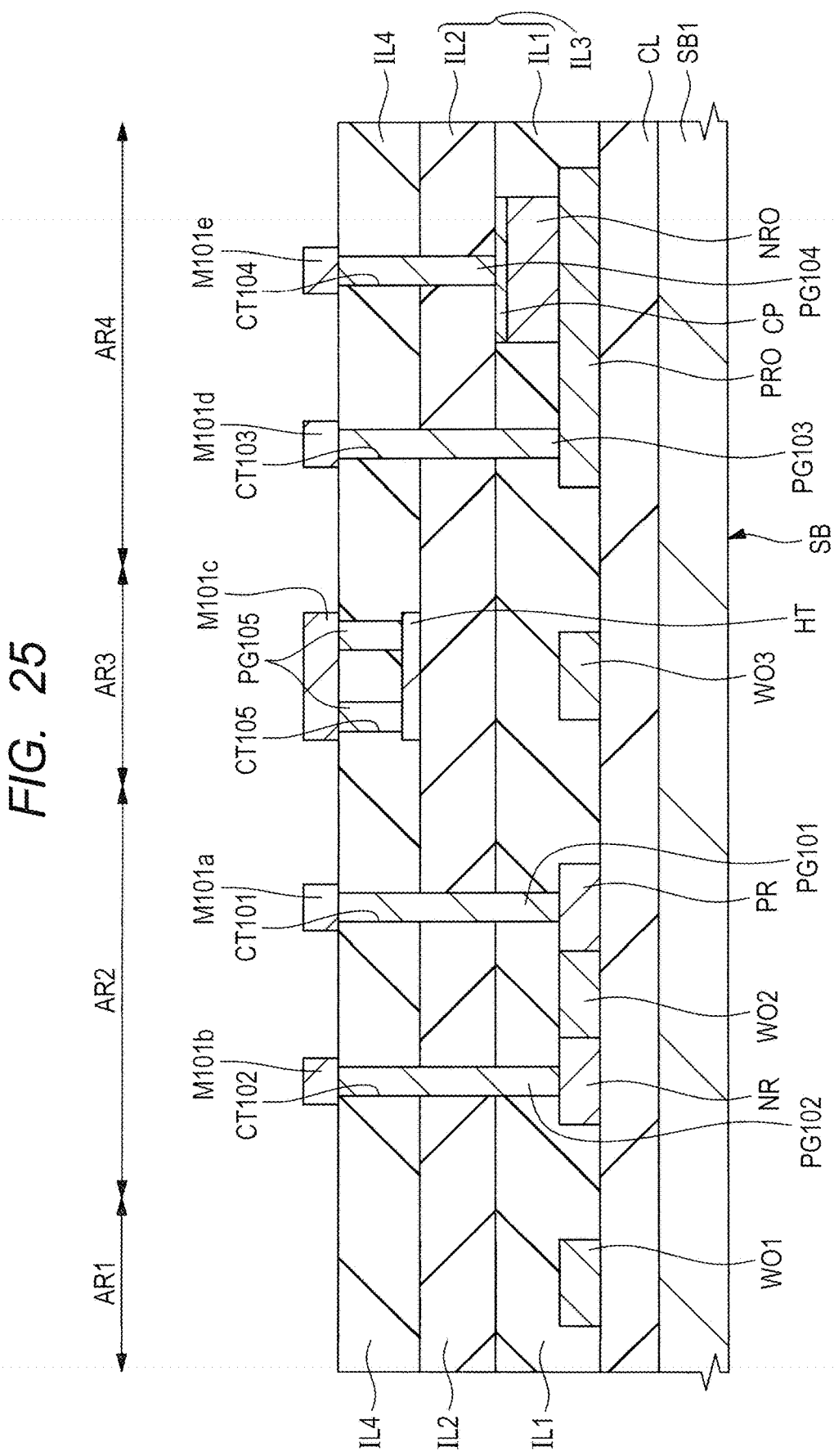
FIG. 25 is a main-portion cross-sectional view of a semiconductor device in a studied example.

Referring to FIG. 25, a description will be given of a semiconductor device in a studied example studied by the present inventors. FIG. 25 is a main-portion cross-sectional view of the semiconductor device in the studied example studied by the present inventors and shows a cross-sectional view of a region equivalent to that shown in FIG. 2 described above. Note that, in FIG. 25, for simpler illustration, the depiction of the foregoing interlayer insulating film IL5 and the structure located thereover is omitted.

The semiconductor device in the studied example shown in FIG. 25 includes the base SB1, the insulating layer CL formed over the base SB1, the optical waveguides WO1, WO2, WO3, and WO4 and the semiconductor portions PR, NR, and PRO which are formed over the insulating layer CL, the semiconductor portion NRO formed over the semiconductor portion PRO, and the cap layer CP formed over the semiconductor portion NRO, similarly to the semiconductor device in the present first embodiment. Note that the optical waveguide WO4 is shown in FIGS. 8 and 9 described above, but is not shown in FIGS. 2 and 25 described above. In the case of the semiconductor device in the studied example shown in FIG. 25 also, in the same manner as in the present first embodiment, each of the heaters HT is formed over the interlayer insulating film IL3 and over the corresponding optical waveguide WO3.

In the semiconductor device in the studied example shown in FIG. 25, over the interlayer insulating film IL4, wires M101$a$, M101$b$, M101$c$, M101$d$, and M101$e$ are formed. The semiconductor device in the studied example is different from that in the present first embodiment in the manner in which the wires M101a, M101b, M101c, M101d, and M101e are coupled to the semiconductor portions PR, NR, PRO, and NRO and the heater HT.

That is, in the semiconductor device in the studied example shown in FIG. 25, no equivalent to the contact portions CB (CB1, CB2, CB3, and CB4) in the present first embodiment is formed. The wires M101a, M101b, M101c, M101d, and M101e are coupled directly to the semiconductor portions PR, NR, and PRO, the cap layer CP, and the heater HT via conductive plugs PG101, PG102, PG103, PG104, and PG105.

Specifically, the wire M101a is electrically coupled with the p-type semiconductor portion PR via the plug PG101 embedded in a contact hole CT101 extending through the interlayer insulating films IL3 and IL4. The wire M101b is electrically coupled with the n-type semiconductor portion NR via the plug PG102 embedded in a contact hole CT102 extending through the interlayer insulating films IL3 and IL4. The wire M101c is electrically coupled with the heater HT via the plug PG105 embedded in a contact hole CT105 extending through the interlayer insulating film IL4. The wire M101d is electrically coupled with the p-type semiconductor portion PRO via the plug PG103 embedded in a contact hole CT103 extending through the interlayer insulating films IL3 and IL4. The wire M101e is electrically coupled with the cap layer CP via the plug PG104 embedded in a contact hole CT104 extending through the interlayer insulating films IL3 and IL4 and also to the n-type semiconductor portion NRO via the cap layer CP.

Next, referring to FIGS. 26 to 30, a description will be given of the manufacturing process of the semiconductor device in the studied example shown in FIG. 25. FIGS. 26 to 30 are main-portion cross-sectional views of the semiconductor device in the studied example during the manufacturing process thereof and show cross sections equivalent to that shown in FIG. 25 described above.

The manufacturing process of the semiconductor device in the studied example and the manufacturing process of the semiconductor device in the present first embodiment described above are substantially the same until the structure in FIG. 15 described above is obtained by forming the insulating film IL2 over the insulating film IL1 including the cap layer CP and polishing the upper surface of the insulating film IL2 by a CMP method.

Figure 26:
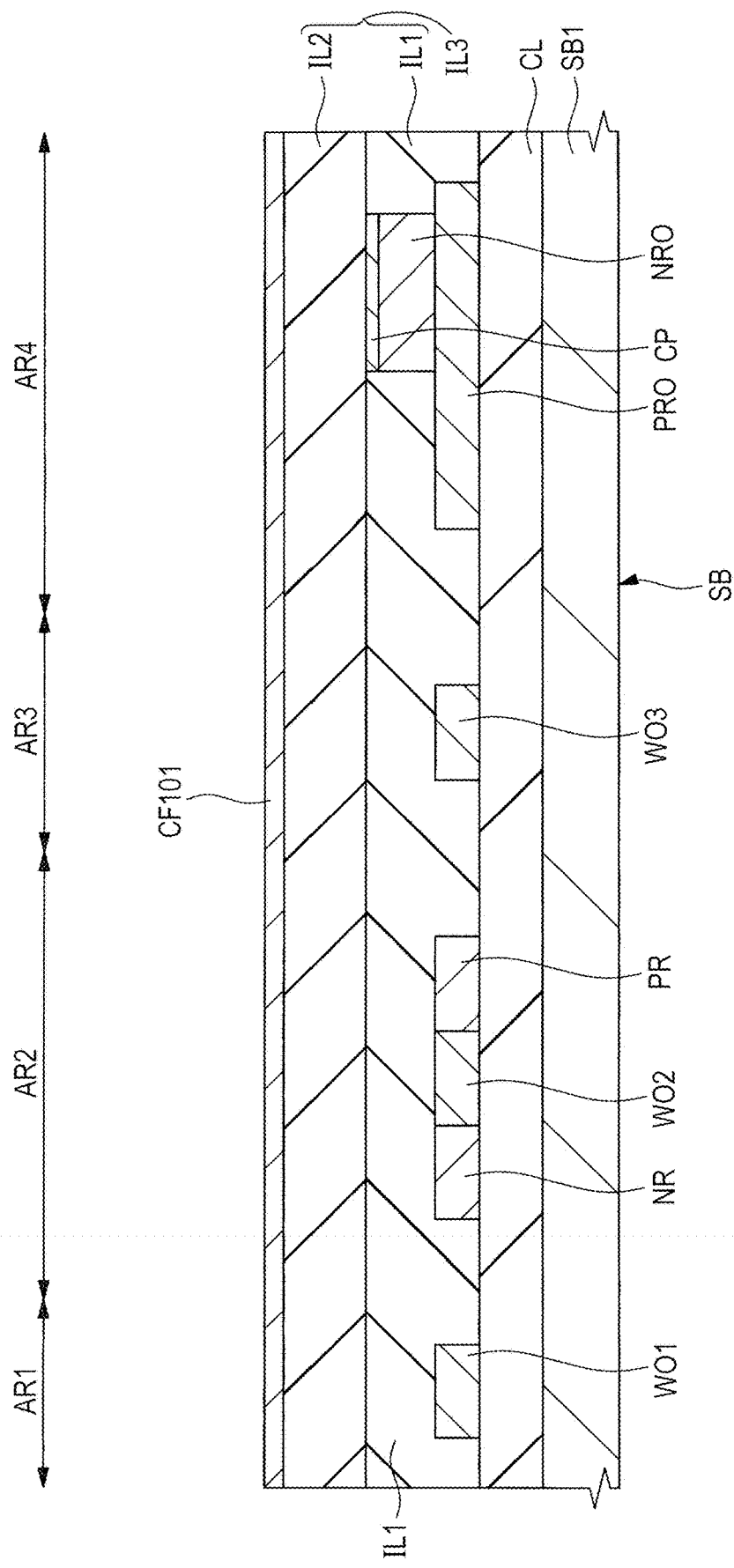
FIG. 26 is a main-portion cross-sectional view of the semiconductor device in the studied example during the manufacturing process thereof.
Figure 27:
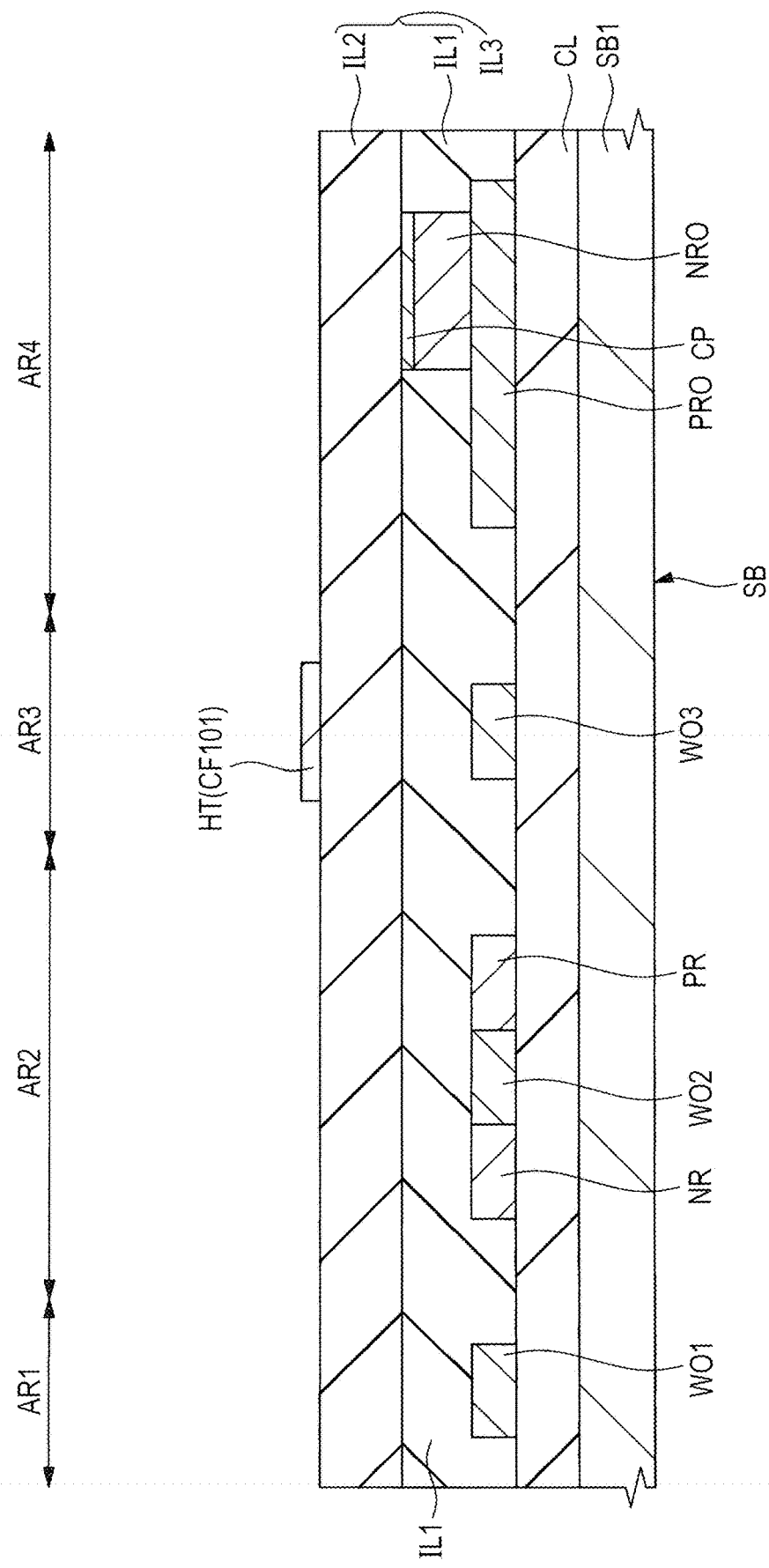
FIG. 27 is a main-portion cross-sectional view of the semiconductor device during the manufacturing process thereof, which is subsequent to FIG. 26.

In the case of the studied example, after the structure in FIG. 15 described above is obtained, the step of forming the foregoing contact holes CT is not performed, but a conductive film CF101 is formed over the interlayer insulating film IL3 as shown in FIG. 26. Then, as shown in FIG. 27, the conductive film C101 is patterned to form the heaters HT. However, in the case of the studied example, no equivalent to the foregoing contact portions CB1, CB2, CB3, and CB4 is formed.

Figure 28:
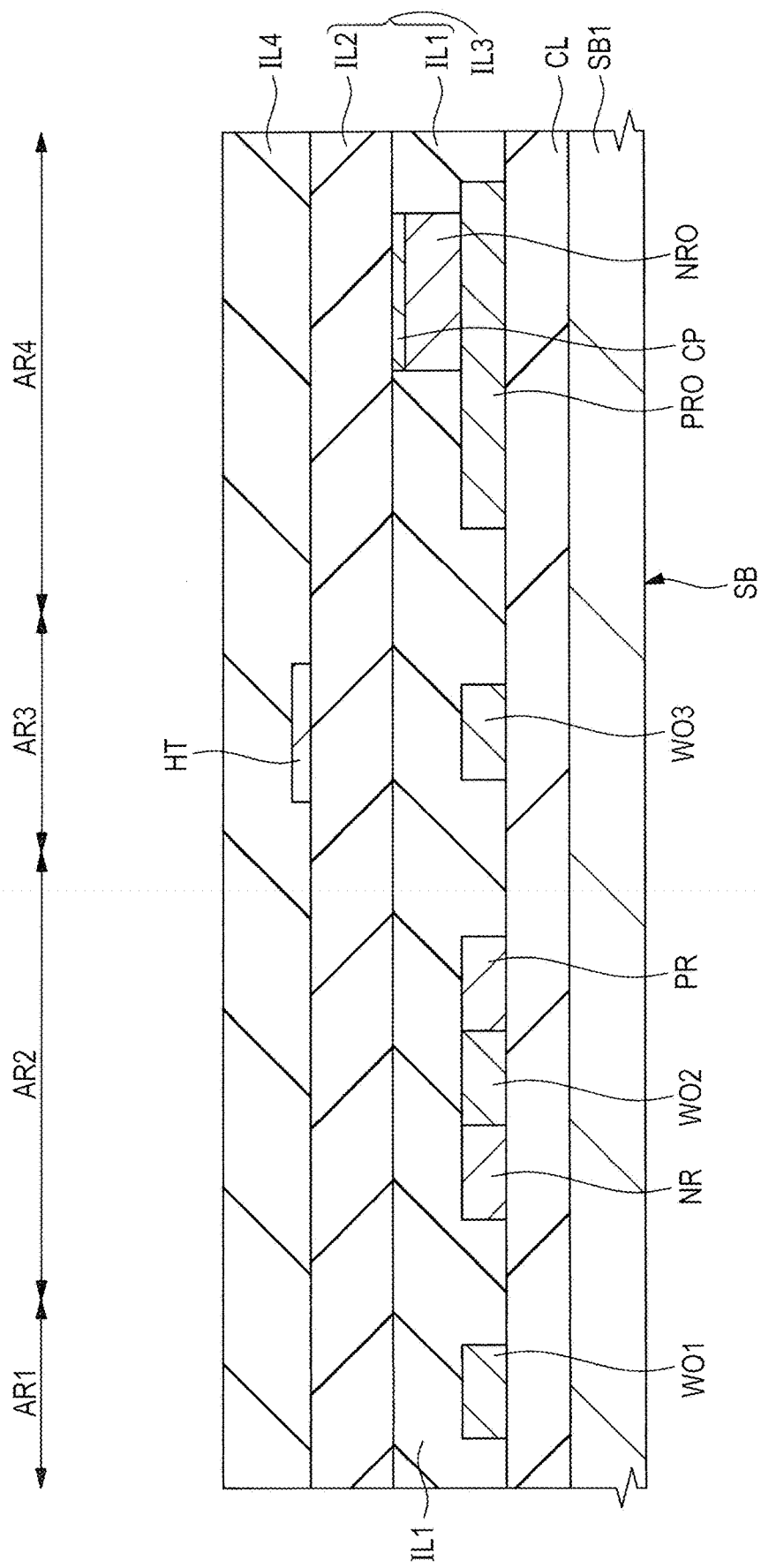
FIG. 28 is a main-portion cross-sectional view of the semiconductor device during the manufacturing process thereof, which is subsequent to FIG. 27.

Then, as shown in FIG. 28, over the interlayer insulating film IL3, the interlayer insulating film IL4 is formed so as to cover the heaters HT. After the formation of the interlayer insulating film IL4, the polishing of the upper surface of the interlayer insulating film IL4 or the like is performed using a CMP method to planarize the upper surface of the interlayer insulating film IL4.

Figure 29:
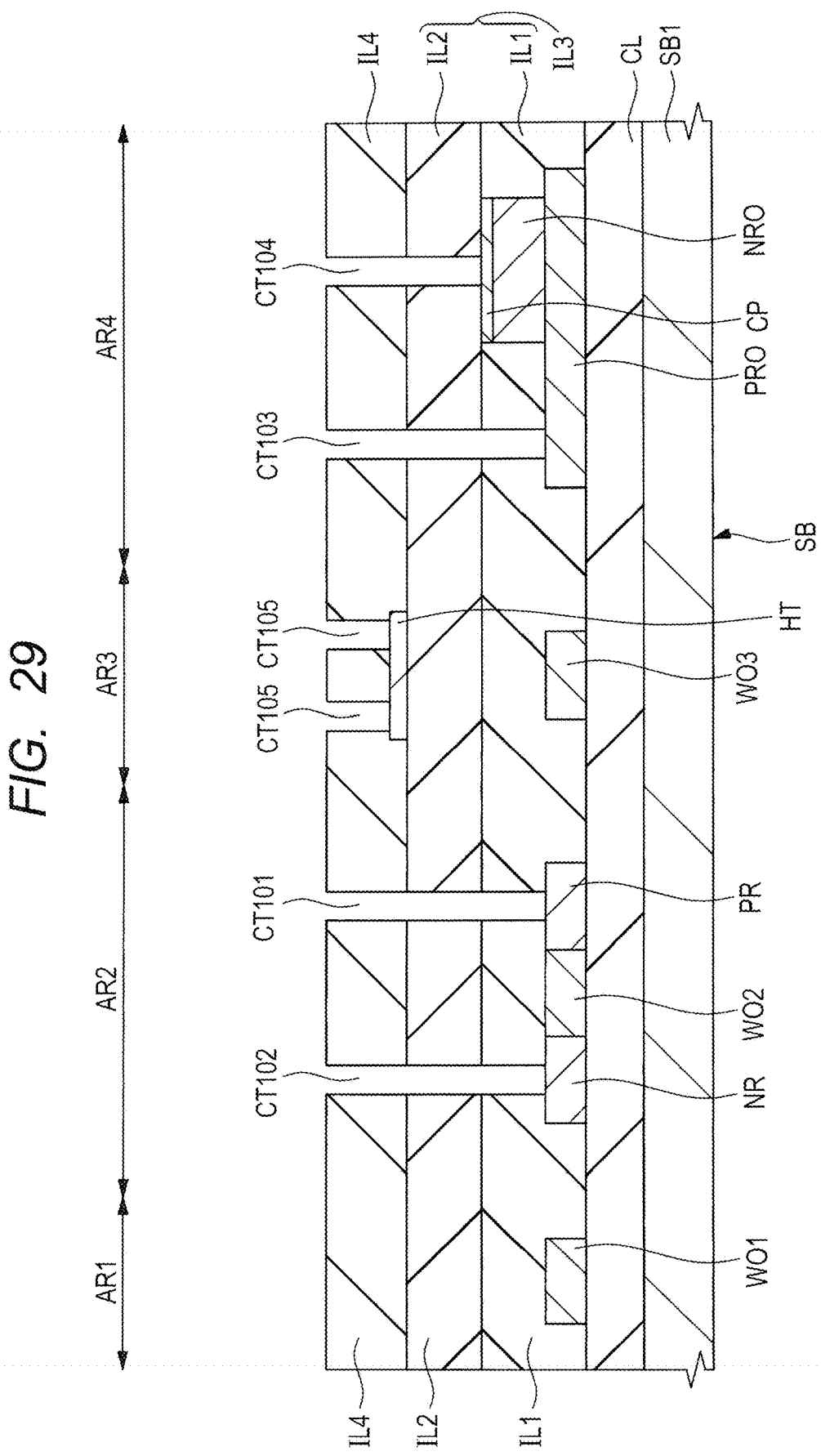
FIG. 29 is a main-portion cross-sectional view of the semiconductor device during the manufacturing process thereof, which is subsequent to FIG. 28.

Then, as shown in FIG. 29, using a photolithographic technique and an etching technique, the contact holes CT101, CT102, CT103, CT104, and CT105 are formed in the interlayer insulating films IL4 and IL3.

The contact hole CT101 extends through the interlayer insulating film IL4, the insulating film IL2, and the insulating film IL1. At the bottom portion of the contact hole CT101, a portion of the p-type semiconductor portion PR is exposed. The contact hole CT102 extends through the interlayer insulating film IL4, the insulating film IL2, and the insulating film IL1. At the bottom portion of the contact hole CT102, a portion of the n-type semiconductor portion NR is exposed. The contact hole CT103 extends through the interlayer insulating film IL4, the insulating film IL2, and the insulating film IL1. At the bottom portion of the contact hole CT103, a portion of the p-type semiconductor portion PRO is exposed. The contact hole CT104 extends through the interlayer insulating film IL4 and the insulating film IL2. At the bottom portion of the contact hole CT104, a portion of the cap layer CP is exposed. The contact hole CT105 extends through the interlayer insulating film IL4. At the bottom portion of the contact hole CT105, a portion of the heater HT is exposed.

Figure 30:
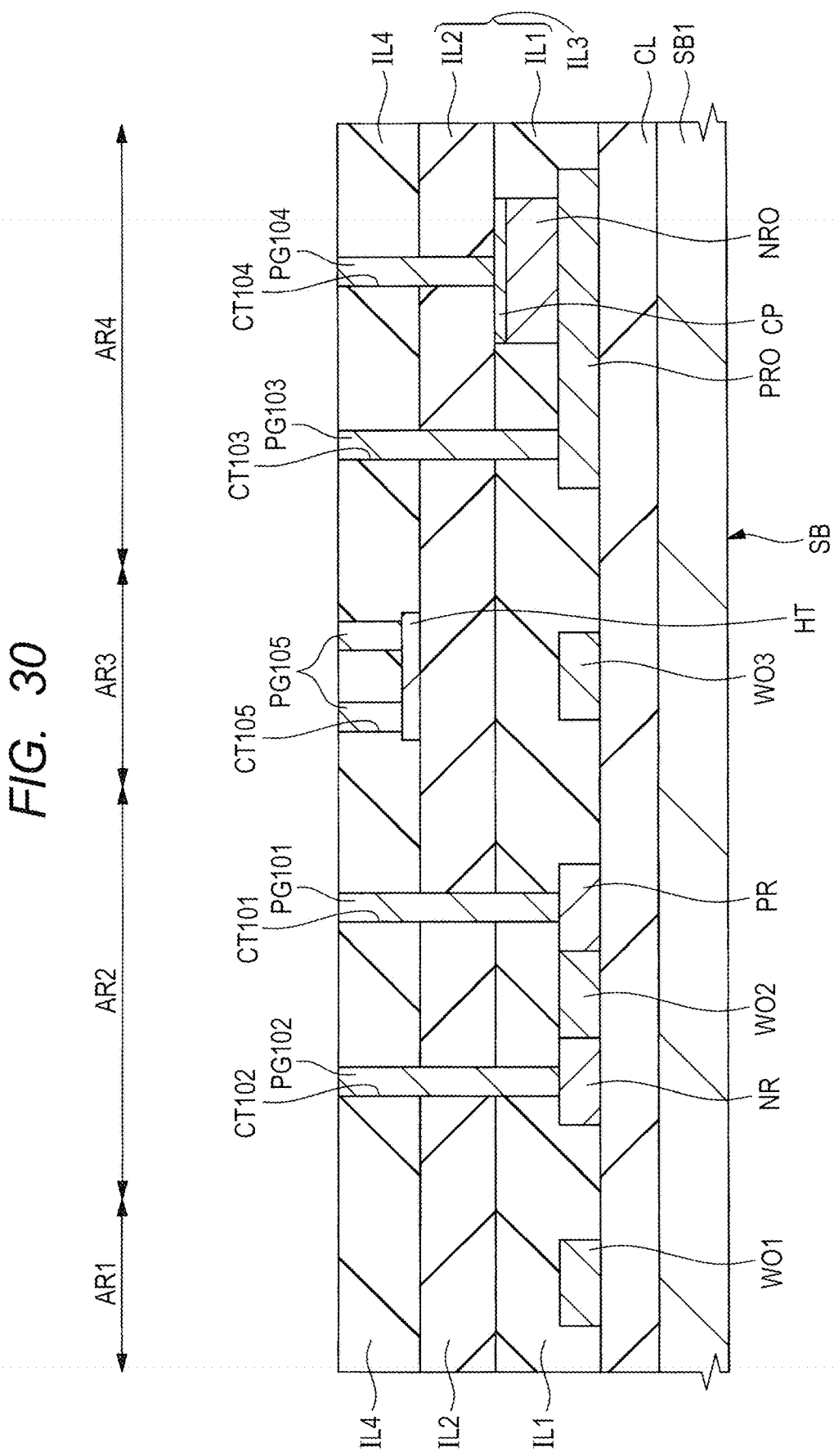
FIG. 30 is a main-portion cross-sectional view of the semiconductor device during the manufacturing process thereof, which is subsequent to FIG. 29.

Then, as shown in FIG. 30, in the contact holes CT101, CT102, CT103, CT104, and CT105, the conductive plugs PG101, PG102, PG103, PG104, and PG105 are formed. Then, as shown in FIG. 25, over the interlayer insulating film IL4 in which the plugs PG101, PG102, PG103, PG104, and PG105 are embedded, the wires M101a, M101b, M101c, M101d, and M101e are formed. Subsequently, over the interlayer insulating film IL4, the foregoing interlayer insulating film IL5 is formed so as to cover the wires M101a to M101e, but the illustration and description thereof is omitted herein.

Next, a description will be given of the problem to be solved that has been found by the present inventors.

The present inventors have considered introducing an optical modulator which uses heating involving the use of a heater in a semiconductor device to which a silicon photonics technique is applied. Accordingly, as described above, the present inventors have considered forming the optical waveguides WO1, WO2, WO3, and WO4, the semiconductor portions PR, NR, PRO, and NRO, and the heaters TH in the same semiconductor device (semiconductor chip).

The optical waveguides WO1, WO2, WO3, and WO4 and the semiconductor portions PR, NR, and PRO are made of the same material (silicon) and can be formed by patterning the SOI layer (foregoing semiconductor layer SL) of the SOI substrate. Accordingly, each of the optical waveguides WO1, WO2, WO3, and WO4 and the semiconductor portions PR, NR, and PRO is formed over the insulating layer CL, i.e., formed in the same layer.

However, the semiconductor portion NRO provided so as to form a photoelectric conversion element is made of a material (specifically, germanium) different from that of each of the optical waveguides WO1, WO2, WO3, and WO4 and the semiconductor portions PR, NR, and PRO. Consequently, the semiconductor portion NRO cannot be formed by patterning the semiconductor layer SL and therefore needs to be formed in a layer different from the layer in which the optical waveguides WO1, WO2, WO3, and WO4 and the semiconductor portions PR, NR, and PRO are formed. Accordingly, the semiconductor portion NRO is formed over the semiconductor portion PRO. To obtain a property appropriate for a heater, the heaters HT are made of a material different from that of each of the optical waveguides WO1, WO2, WO3, and WO4 and the semiconductor portions PR, NR, and PRO, and is also made of a material different from that of the semiconductor portion NRO. When it is intended to form the heaters using the wires M1, since each of the wires M1 needs to have a low specific resistance, the resistance of each of the heaters is also reduced. Consequently, it is difficult to ensure the function of the heater, and therefore it is desirable to separately form the heaters HT in a layer different from the layer in which the wires M1 are formed. Accordingly, it is necessary to form the heaters HT in a layer different from the layer in which the optical waveguides WO1, WO2, WO3, and WO4 and the semiconductor portions PR, NR, and PRO are formed, also different from the layer in which the semiconductor portion NRO is formed, and also different from the layer in which the wires M1 are formed.

As a result, the layer in which the optical waveguides WO1, WO2, WO3, and WO4 and the semiconductor portions PR, NR, and PRO are formed, the layer in which a multi-layer structure including the semiconductor portion NRO and the cap layer CP is formed, and the layer in which the heaters HT are formed are at different height positions, and the layer in which the heaters HT are formed is at a highest position. Specifically, over the insulating film CL, the optical waveguides WO2, WO3, and WO4 and the semiconductor portions PR, NR, and PRO are formed. Over the p-type semiconductor portion PRO, the multi-layer structure including the semiconductor portion NRO and the cap layer CP is formed. Over the interlayer insulating film IL3, the heaters HT are formed. The heaters HT and the semiconductor portions PR, NR, PRO, and NRO need to be electrically coupled with the wires provided over the interlayer insulating film IL4.

This commonly applies to the case of the present first embodiment and to the case of the studied example, but a method of electrically coupling the semiconductor portions PR, NR, PRO, and NRO and the heater HT with the wires over the interlayer insulating film IL4 in the case of the studied example is different from that in the case of the present first embodiment.

In the case of the studied example, the plug PG101 is embedded in the contact hole CT101 extending through the interlayer insulating film IL4 and the insulating films IL2 and IL1 and, through the plug PG101, the p-type semiconductor portion PR is electrically coupled with the wire M101a over the interlayer insulating film IL4. Also, the plug PG102 is embedded in the contact hole CT102 extending through the interlayer insulating film IL4 and the insulating films IL2 and IL1 and, through the plug PG102, the n-type semiconductor portion NR is electrically coupled with the wire M101b over the interlayer insulating film IL4. Also, the plug PG103 is embedded in the contact hole CT103 extending through the interlayer insulating film IL4 and the insulating films IL2 and IL1 and, through the plug PG103, the p-type semiconductor portion PRO is electrically coupled with the wire M101d over the interlayer insulating film IL4. Also, the plug PG104 is embedded in the contact hole CT104 extending through the interlayer insulating film IL4 and the insulating film IL2 and, through the plug PG104, the cap layer CP is electrically coupled with the wire M101e over the interlayer insulating film IL4. Also, the plug PG105 is embedded in the contact hole CT105 extending through the interlayer insulating film IL4 and, through the plug PG105, the heater HT is electrically coupled with the wire M101c over the interlayer insulating film IL4.

Accordingly, the depth of the contact hole CT104 is larger than the depth of the contact hole CT105, and the respective depths of the contact holes CT101, CT102, and CT103 are larger than the depth of the contact hole CT104. That is, the depth of the contact hole CT105 is rather small, while the depth of the contact hole CT104 is considerably large, and the respective depths of the contact holes CT101, CT102, and CT103 are larger than the depth of the contact hole CT104. In addition, since the distances between the heater HT and the optical waveguides WO3 need to be set rather large, the differences between the depth of the contact hole CT105 and the depths of the other contact holes CT101, CT102, CT103, and CT104 are set large.

When it is intended to form these contact holes CT101 to CT105 using a photolithographic technique and an etching technique, a problem resulting from over-etching may arise to raise a concern about the degradation of the reliability of the semiconductor device. The following will describe the concern.

As shown in FIG. 29, when the contact holes CT101 to CT105 having unequal depths are formed by etching, it is necessary to perform the etching on the basis of the depth of each of the deepest contact holes CT101 to CT103. Accordingly, during the formation of the contact holes CT101 to CT105, an amount of over-etching of the cap layer CP exposed at the bottom portion of the contact hole CT104 is larger than an amount of over-etching of each of the semiconductor portions PR, NR, and PRO exposed at the bottom portions of the contact holes CT101 to CT103, and an amount of over-etching of the heater HT exposed at the bottom portion of the contact hole CT105 is larger than the amount of the over-etching of the cap layer CP exposed at the bottom portion of the contact hole CT104.

When the contact holes CT101 to CT105 are formed by etching, the amount of over-etching needs to be set such that the deepest contact holes CT101 and CT103 are surely opened. Since it is common to set the amount of over-etching at a predetermined ratio relative to the depth of a contact hole to be formed, when the depth of the contact hole intended to be formed is increased, the set amount of over-etching also needs to be increased. Showing an example, a description will be given thereof.

In the case where, e.g., a contact hole having a depth of 500 nm is formed in a silicon oxide film, when the amount of etching is set exactly to 500 nm, there is a concern that the contact hole cannot be opened due to fluctuations in conditions in a manufacturing device. Accordingly, in the case where a contact hole having a depth of 500 nm is formed in a silicon oxide film, etching is performed by setting the amount of over-etching to 200 nm corresponding to 40% of the depth of the contact hole and assuming that an amount of etching which allows the silicon oxide film to be etched by 700 nm is the total amount of etching. In the case where a contact hole having a depth of 1000 nm is formed in a silicon oxide film, etching is performed by setting the amount of over-etching to 400 nm corresponding to 40% of the depth of the contact hole and assuming that an amount of etching which allows the silicon oxide film to be etched by 1400 nm is the total amount of etching. This allows the contact hole to be surely opened even when conditions in the manufacturing device unintentionally fluctuate. As a result, the amount of over-etching is larger in the case where the contact hole having a depth of 1000 nm is formed in the silicon oxide film than in the case where the contact hole having a depth of 500 nm is formed in the silicon oxide film.

Accordingly, the amount of over-etching during the formation of the contact holes CT101 to CT105 needs to be set considerably large on the basis of the deeper contact holes CT101 to CT103. This leads to a considerably large amount of over-etching of each of the semiconductor portions PR, NR, and PRO which are exposed at the bottom portions of the contact holes CT101 to CT103 during the formation of the contact holes CT101 to CT105 and leads to a larger amount of over-etching of each of the cap layer CP and the heaters HT which are exposed at the bottom portions of the contact holes CT104 and CT105.

Each of the heaters HT is disposed over the corresponding optical waveguide WO3 so as to heat the optical waveguide WO3, and the distance between the heater HT and the optical waveguide WO3 needs to be set rather large. This functions to increase the depths of the contact holes CT101 to CT103 and also increase the differences between the depths of the contact holes CT101 to CT103 and the contact hole CT105 and consequently functions to increase over-etching of each of the semiconductor portions PR, NR, and PRO, the cap layer CP, and the heaters HT. When consideration is given to the function of the germanium optical receiver, the semiconductor portion NR needs to have a rather large thickness. However, increasing the thickness of the semiconductor portion NR functions to increase the depths of the contact holes CT101 to CT103 and also increase the differences between the depths of the contact holes CT101 to CT103 and the contact hole CT104 and therefore functions to increase over-etching of the cap layer CP. Also, when consideration is given of the function of the germanium optical receiver, the thickness of the cap layer CP cannot be excessively increased. Consequently, when the amount of over-etching of the cap layer CP is increased, the cap layer CP disappears as a result of being over-etched and even the semiconductor portion NRO may be over-etched.

Accordingly, in the case of the studied example, the amount of over-etching of each of the semiconductor portions PR, NR, and PRO exposed at the bottom portions of the contact holes CT101 to CT103 is considerably increased, the amount of over-etching of the cap layer CP exposed at the bottom portion of the contact hole CT104 is further increased, and the amount of over-etching of the heater HT exposed at the bottom portion of the contact hole CT105 is further increased. The increased amount of over-etching of each of the semiconductor portions PR, NR, and PRO, the cap layer CP, and the heater HT which are exposed at the bottom portions of the contact holes CT101 to CT105 may degrade the reliability of the manufactured semiconductor device. To improve the reliability of the semiconductor device, it is desired to reduce the amount of over-etching of each of the semiconductor portions PR, NR, and PRO, the cap layer CP, and the heater HT.

The large depth of each of the contact holes CT101 to CT103 leads to an increase in the aspect ratio (length-width ratio) of each of the contact holes CT101 to CT103. This increases the difficulty with which the contact holes CT101 to CT103 are opened by etching and may cause defective formation of the contact holes CT101 to CT103. In this point also, the reliability of the manufactured semiconductor device may be degraded.

[About Main Characteristic Features and Effects]

One of the main characteristic features of the present first embodiment is that, over the semiconductor portions PR, NR, PRO, and NRO, the contact portions CB1, CB2, CB3, and CB4 electrically coupled individually thereto are provided. In addition, the wires M1a, M1b, M1c, M1d, and M1e formed over the interlayer insulating film IL4 are electrically coupled with the heaters HT and the contact portions CB1, CB2, CB3, and CB4 via the plugs PG1, PG2, PG3, PG4, and PG5 embedded in the interlayer insulating film IL4.

In the present first embodiment, by using such a configuration, it is possible to improve the reliability of the semiconductor device. The following will specifically describe the reason for this.

The wires M1c formed over the interlayer insulating film IL4 are electrically coupled with the heaters HT via the plugs PG5, while the wires M1a, M1b, M1d, and M1e formed over the interlayer insulating film IL4 are electrically coupled with the semiconductor portions PR, NR, and PRO and the cap layer CP via the plugs PG (PG1, PG2, PG3, and PG4) and the contact portions CB (CB1, CB2, CB3, and CB4).

The heaters HT are formed over the interlayer insulating film IL3, while each of the contact portions CB (CB1, CB2, CB3, and CB4) is formed continuously in the contact hole CT (CT1, CT2, CT3, or CT4) provided in the interlayer insulating film IL3 and over the interlayer insulating film IL3. This reflects the fact that the heaters HT and the contact portions CB1, CB2, CB3, and CB4 are formed by patterning the same conductive film CF1.

Accordingly, it is possible to provide coupling between the wires M1c and the heaters HT, between the wires M1a and the contact portions CB1, between the wires M1b and the contact portions CB2, between the wire Mid and the contact portion CB3, and between the wire M1e and the contact portion CB4 via the plugs PG (PG1, PG2, PG3, PG4, and PG5) embedded in the interlayer insulating film IL4. Therefore, the through holes SH1, SH2, SH3, SH4, and SH5 provided for the formation of the plugs PG1, PG2, PG3, PG4, and PG5 may be formed appropriately in the interlayer insulating film IL4. As a result, the through holes SH1, SH2, SH3, SH4, and SH5 have substantially the same depths, which are considerably small. Specifically, the respective depths of the through holes SH1, SH2, SH3, SH4, and SH5 are considerably smaller than the respective depths of the foregoing contact holes CT101, CT102, and CT103 in the foregoing comparative example and about the same as the depth of the foregoing contact hole CT105. Accordingly, when the through holes SH1, SH2, SH3, SH4, and SH5 are formed in the interlayer insulating film IL4, the amount of over-etching of each of the contact portions CB1, CB2, CB3, and CB4 and the heaters HT which are exposed at the bottom portions of the through holes SH1, SH2, SH3, SH4, and SH5 can considerably be reduced. As a result, during the formation of the through holes SH1, SH2, SH3, SH4, and SH5 in the interlayer insulating film IL4, a problem resulting from over-etching is less likely to occur. Also, during the formation of the through holes SH1, SH2, SH3, SH4, and SH5, the semiconductor portions PR, NR, PRO, and NRO and the cap layer CP are not exposed. Consequently, when the through holes SH1, SH2, SH3, SH4, and SH5 are formed in the interlayer insulating film IL4, there is no concern about over-etching of the semiconductor portions PR, NR, PRO, and NRO and the cap layer CP.

In the present first embodiment, it is necessary to form the contact holes CT1, CT2, CT3, and CT4 in the interlayer insulating film IL3. However, when the contact holes CT1, CT2, CT3, and CT4 are formed, the interlayer insulating film IL4 has not been formed yet. Therefore, the interlayer insulating film IL4 need not be etched, and it is sufficient to etch the interlayer insulating film IL3. Accordingly, the respective depths of the contact holes CT1, CT2, CT3, and CT4 are not so large. Specifically, the depths of the contact holes CT1, CT2, CT3, and CT4 are considerably smaller than the depths of the foregoing contact holes CT101, CT102, and CT103 in the foregoing comparative example.

The depths of the contact holes CT1, CT2, and CT3 are substantially the same, while the depth of the contact hole CT4 is smaller than those of the contact holes CT1, CT2, and CT3. When the contact holes CT1, CT2, CT3, and CT4 having unequal depths are formed by the same etching step, it is necessary to perform the etching on the basis of the depths of the deepest contact holes CT1, CT2, and CT3. In addition, it is also necessary to set the amount of over-etching such that the deepest contact holes CT1, CT2, and CT3 are surely opened. Accordingly, as the contact holes CT1, CT2, and CT3 are deeper, the amount of over-etching in the etching step for forming the contact holes CT1, CT2, CT3, and CT4 needs to be set larger. However, in the present first embodiment, it is sufficient to merely form the contact holes CT1, CT2, and CT3 in the interlayer insulating film IL3. As a result, it is possible to reduce the depths of the contact holes CT1, CT2, and CT3 and consequently set the amount of over-etching during the formation of the contact holes CT1, CT2, CT3, and CT4 small. This leads to a reduction in the amount of over-etching of each of the semiconductor portions PR, NR, and PRO exposed at the bottom portions of the contact holes CT1, CT2, and CT3 during the formation of the contact holes CT1, CT2, CT3, and CT4 and also leads to a reduction in the amount of over-etching of the cap layer CP exposed at the bottom portion of the contact hole CT4.

Thus, in the present first embodiment, it is possible to reduce the amount of over-etching of each of the semiconductor portions PR, NR, and PRO exposed at the bottom portions of the contact holes CT1, CT2, and CT3 and reduce the amount of over-etching of the cap layer CP exposed at the bottom portion of the contact hole CT4. This can inhibit or prevent the occurrence of a problem resulting from over-etching during the formation of the contact holes CT1, CT2, CT3, and CT4 in the interlayer insulating film IL3 and improve the reliability of the manufactured semiconductor device.

Thus, in the present first embodiment, it is possible to inhibit or prevent the occurrence of a problem resulting from over-etching during the formation of the contact holes CT1, CT2, CT3, and CT4 in the interlayer insulating film IL3 and during the formation of the through holes SH1, SH2, SH3, SH4, and SH5 in the interlayer insulating film IL4. This can improve the reliability of the manufactured semiconductor device.

Since the respective depths of the contact holes CT1, CT2, CT3, and CT4 and the through holes SH1, SH2, SH3, SH4, and SH5 can be reduced, the respective aspect ratios thereof can be reduced. As a result, the contact holes CT1, CT2, CT3, and CT4 and the through holes SH1, SH2, SH3, SH4, and SH5 are more easily opened by etching, and defective formation of the contact holes CT1, CT2, CT3, and CT4 and the through holes SH1, SH2, SH3, SH4, and SH5 can be prevented. In this point also, the reliability of the manufactured semiconductor device can be improved.

Techniques for inhibiting over-etching include a technique using an etching stopper film. In this technique, e.g., a contact hole is formed in a multi-layer film including a silicon nitride film and a silicon oxide film. When the silicon oxide film is etched, the silicon nitride film is caused to function as an etching stopper and then, under changed etching conditions, the silicon nitride film is etched to thus complete the contact hole. However, the interlayer insulating film IL3 functions as the clad layer. Accordingly, the insulating layer CL and the interlayer insulating film IL3 are preferably formed of the same material, and more preferably formed of silicon oxide. For this reason, it is difficult to apply the technique using the etching stopper film to a silicon photonics device. In the present first embodiment, as described above, it is possible to inhibit over-etching during the formation of the contact holes CT1, CT2, CT3, and CT4 and during the formation of the through holes SH1, SH2, SH3, SH4, and SH5 without applying the technique using the etching stopper film. Accordingly, the insulating layer CL and the interlayer insulating film IL3 can be formed of the same material and, more preferably, can be formed of silicon oxide. This can enhance the function of the insulating layer CL and the interlayer insulating film IL3 as the clad layer.

Also, in the present first embodiment, the heaters HT and the contact portions CB1, CB2, CB3, and CB4 are formed by patterning the same conductive film CF1. That is, by additionally performing the step of forming the contact holes CT1, CT2, CT3, and CT4 after the formation of the insulating film IL2 and before the formation of the conductive film CF1, the contact portions CB1, CB2, CB3, and CB4 can also be formed simultaneously with the heaters HT. This can reduce the number of steps in the manufacturing process of the semiconductor device even when the contact portions CB1, CB2, CB3, and CB4 are formed and thus reduce the manufacturing cost of the semiconductor device.

Reflecting the fact that the heaters HT and the contact portions CB1, CB2, CB3, and CB4 are formed by patterning the same conductive film CF1, the contact portions CB1, CB2, CB3, and CB4 have respective portions located (extending) over the interlayer insulating film IL3. By disposing the plugs PG1, PG2, PG3, and PG4 over the portions of the contact portions CB1, CB2, CB3, and CB4 which are located (extending) over the interlayer insulating film IL3, the plugs PG1, PG2, PG3, and PG4 can be coupled easily and reliably to the contact portions CB1, CB2, CB3, and CB4. This also allows the through holes SH1, SH2, SH3, SH4, and SH5 to have substantially equal depths and thus allows the plugs PG1, PG2, PG3, PG4, and PG5 to have substantially equal heights (dimensions in the height direction). As a result, it is easier to form the through holes SH1, SH2, SH3, SH4, and SH5 and inhibit over-etching during the formation of the through holes SH1, SH2, SH3, SH4, and SH5.

Note that, when the heaters HT and the contact portions CB1, CB2, CB3, and CB4 are formed in different layers, it indicates that the heaters HT and the contact portions CB1, CB2, CB3, and CB4 are not formed by patterning the same conductive film. In such a case, a large number of steps are needed to form the heaters HT and the contact portions CB1, CB2, CB3, and CB4. Moreover, the through holes SH1, SH2, SH3, SH4, and SH5 are not allowed to have equal depths to raise a concern about over-etching during the formation of the through holes SH1, SH2, SH3, SH4, and SH5. In the present first embodiment, such a situation can be avoided.

The semiconductor portion NRO under the cap layer CP, which is made of germanium (Ge), has low resistance to heat. In the case of the foregoing studied example, the plug PG104 is formed in the state where the cap layer CP is exposed from the contact hole CT104. However, each of the plugs PG101 to PG105 includes a tungsten (W) film as a main conductor film and, during the deposition of the tungsten film, the semiconductor portion NRO made of germanium (Ge) may be heated and degraded. In the present first embodiment, each of the plugs PG1 to PG5 includes a tungsten (W) film as a main conductor film, but is considerably distant from the cap layer CP and the semiconductor portion NRO. Accordingly, it is possible to avoid the situation in which, during the deposition of the tungsten film, the semiconductor portion NRO made of germanium (Ge) is heated and degraded. Also, in the case of the present first embodiment, the conductive film CF1 is formed in the state where the cap layer CP is exposed from the contact hole CT4 but, as described above, the conductive film CF1 is made of a titanium film, a titanium nitride film, or a multi-layer film thereof. While being deposited, a titanium film and a titanium nitride film are more likely to inhibit the underlay from being heated than a tungsten film. As a result, it is possible to inhibit or prevent the semiconductor portion NRO made of germanium (Ge) from being heated and degraded during the deposition of the conductive film CF1. In this point also, the present first embodiment can improve the reliability of the manufactured semiconductor device.

Also, in the present first embodiment, the contact holes CT1, CT2, CT3, and CT4 can be formed by the same step. However, in another form, it is also possible to perform the formation of the contact holes CT1, CT2, and CT3 and the formation of the contact holes CT4 in different steps. In terms of minimizing the number of steps, it is desirable to simultaneously form the contact holes CT1, CT2, CT3, and CT4 in the same step. However, when the step of forming the contact hole CT4 and the step of forming the contact holes CT1, CT2, and CT3 are separately performed, the advantage of being able to further inhibit over-etching of the cap layer CP exposed at the bottom portion of the contact hole CT4 can be obtained.

On the other hand, in the case of the foregoing studied example, it can be considered to perform the formation of the contact holes CT101, CT102, and CT103 and the formation of the contact hole CT104, and the formation of the contact hole CT105 in different steps, but it is difficult to accomplish this in practice. This is because, since the depths of the contact holes CT101, CT102, CT103, and CT104 are considerably large, it is not easy to remove the photoresist pattern embedded in the contact holes CT101, CT102, and CT103 or in the contact hole CT104 by ashing to raise a concern about the unremoved residues of the photoresist pattern.

By contrast, in the present first embodiment, the depths of the contact holes CT1, CT2, CT3, and CT4 are relatively small. Accordingly, the photoresist pattern embedded in the contact holes CT1, CT2, and CT3 or in the contact hole CT4 can be removed easily and reliably by ashing. As a result, in the present first embodiment, even when the formation of the contact holes CT1, CT2, and CT3 and the formation of the contact hole CT4 are performed in different steps, it is possible to prevent the unremoved residues of the photoresist pattern from being left.

In the case of the foregoing studied example, the conductive film CF101 is patterned using the photoresist pattern formed over the conductive film CF101 as an etching mask to form the heaters HT. In the exposure step when the photoresist pattern is formed, alignment marks (e.g., stepped portions or recessed portions in the conductive film CF101) are necessary. This causes the need for the step of processing the interlayer insulating film IL3 before the step of forming the conductive film CF101 so as to allow the alignment marks to be formed in the conductive film CF101.

By contrast, in the present first embodiment, in the state where the contact holes CT are formed in the interlayer insulating film IL3, the conductive film CF1 is formed and then patterned using the photoresist pattern formed over the conductive film CF1 as an etching mask to form the heaters HT and the contact portions CB1, CB2, CB3, and CB4. In the exposure step when the photoresist pattern is formed, stepped portions or recessed portions resulting from the contact holes CT are formed in the conductive film CF1, and therefore can be used as alignment marks. Accordingly, after the formation of the contact holes CT and before the step of forming the conductive film CF1, it is unnecessary to perform a processing step for forming alignment marks on the interlayer insulating film IL3.

Note that the semiconductor device in the present first embodiment has both of the optical modulator PC1 having a configuration in which voltages are applied to the semiconductor portions PR and NR and the optical modulator PC2 having a configuration in which the optical waveguides WO3 are heated using the heaters HT. In the semiconductor device, at least the one or more optical modulators PC1 and at least the one or more optical modulator PC2 are embedded. In another form, there may also be a case where the semiconductor device has the optical modulator PC2 having the configuration in which the optical waveguides WO3 are heated using the heaters HT, but does not have the optical modulator PC1 having the configuration in which voltages are applied to the semiconductor portions PR and NR. In this case, the one or more optical modulators PC2 each having the configuration in which the optical waveguides WO3 are heated using the heaters HT are embedded in the semiconductor device. In this case, the formation of the foregoing optical waveguides WO2, the p-type semiconductor portions PR, the n-type semiconductor portions NR, the contact portions CB1 and CB2, the plugs PG1 and PG2, and the wires M1a and M1b is omitted.

(Second Embodiment)

Figure 31:
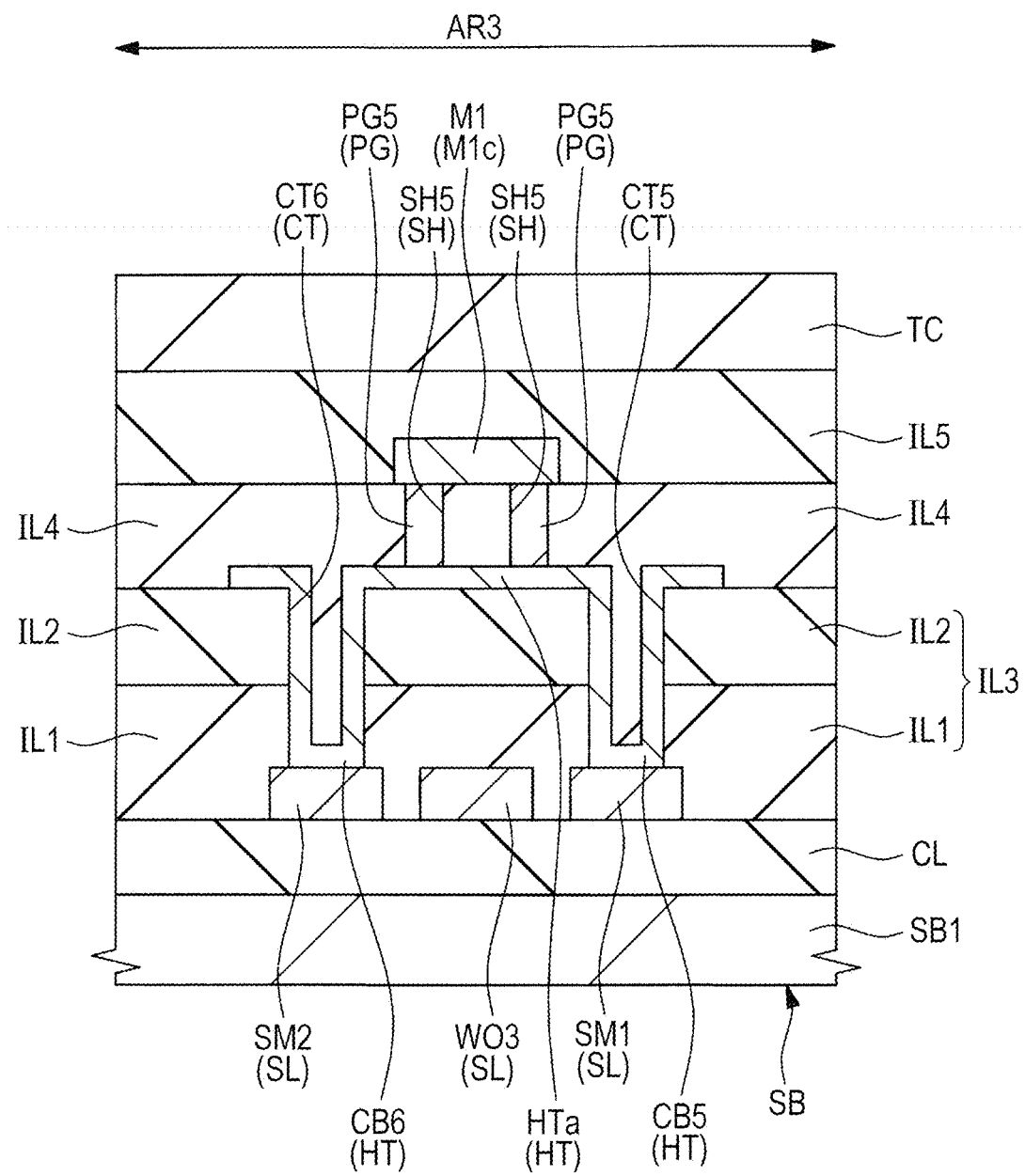
FIG. 31 is a main-portion cross-sectional view showing a semiconductor device in another embodiment.
Figure 32:
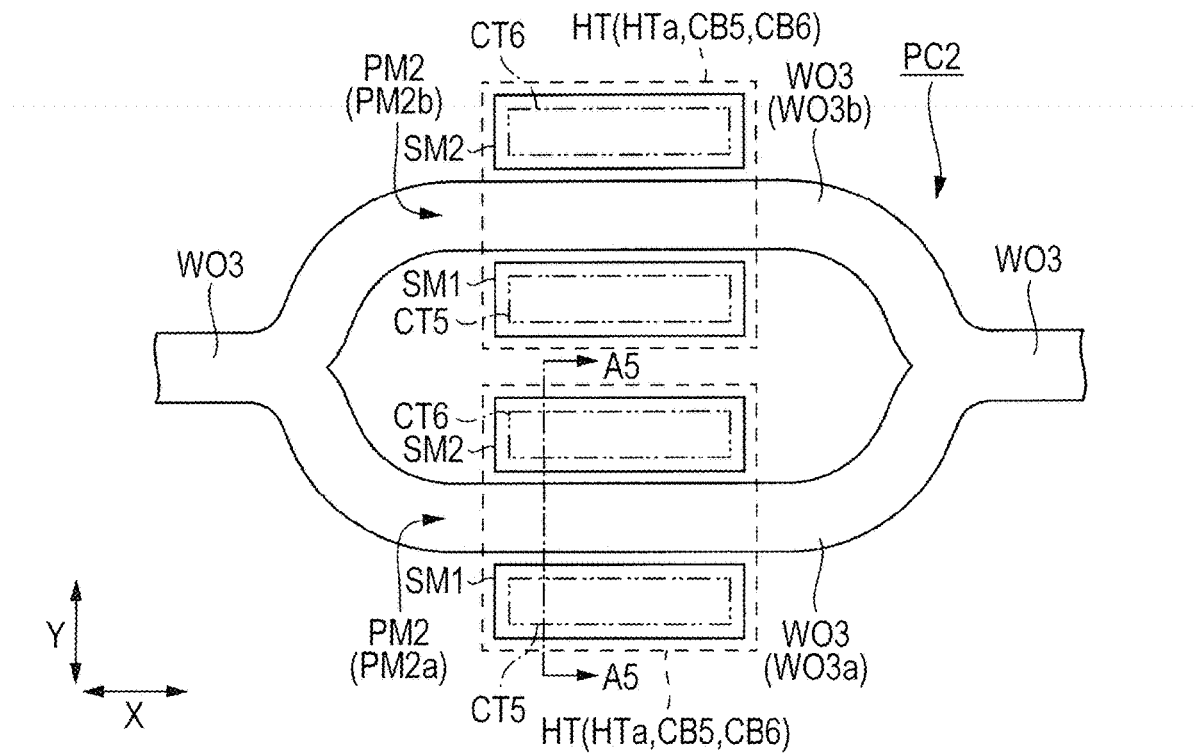
FIG. 32 is a main-portion plan view of the semiconductor device in the other embodiment.
Figure 33:
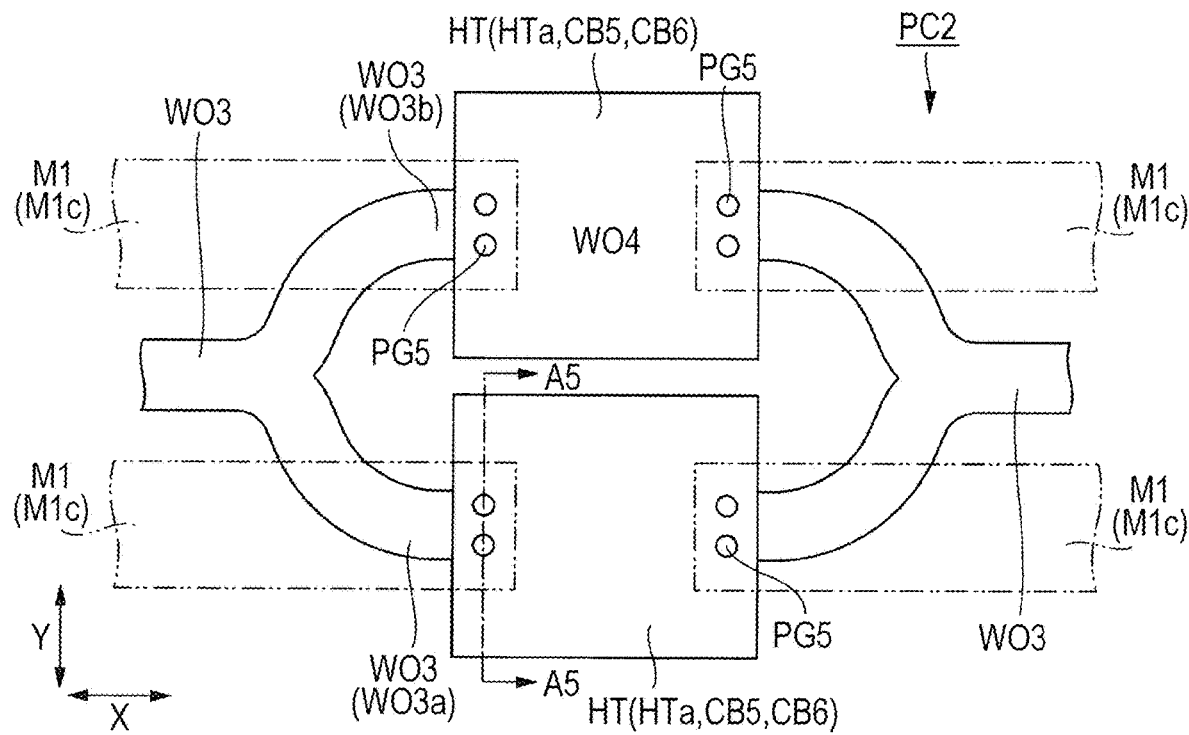
FIG. 33 is a main-portion plan view of the semiconductor device in the other embodiment.

Referring to FIGS. 31 to 33, a description will be given of the semiconductor device in a second embodiment. FIG. 31 is a main-portion cross-sectional view of the semiconductor device in the present second embodiment. FIGS. 33 and 34 are main-portion plan views of the semiconductor device in the present second embodiment.

The semiconductor device in the present second embodiment is the same as the semiconductor device in the foregoing first embodiment in the configuration thereof except for the optical modulator PC2 formed in the area AR3. Accordingly, a repeated description thereof is omitted herein, and a description is given herein of the configuration in the area AR3. FIG. 31 shows a cross-sectional view of the area AR3. FIGS. 32 and 33 show plan views of the area AR3. A cross-sectional view at a position along the line A5-A5 in FIG. 32 corresponds to FIG. 31. Note that FIGS. 32 and 33 show the plan views of the same area but, in FIG. 32, the optical waveguides WO3 and semiconductor portions SM1 and SM2 are shown by the solid lines, contact holes CT5 and CT6 are shown by two-dot-dash lines, and the heaters HT are shown by the broken lines. On the other hand, in FIG. 33, the optical waveguides WO3, the heaters HT, and the plugs PG5 are shown by the solid lines, and the wires M1c are shown by the two-dot-dash lines.

In the same manner as in the foregoing first embodiment, in the present second embodiment also, the optical waveguide WO3 extending in the X-direction in the area AR3 is divided at a branch portion into the two optical waveguides WO3 (i.e., WO3a and WO3b). The two optical waveguides WO3 extend in the X-direction, and are then reunited to form the one optical waveguide WO3 extending in the X-direction. In each of the two optical waveguides WO3a and WO3b, the phase modulation portion PM2 is provided. The structure of the phase modulation portion PM2 in the present second embodiment is different from that in the foregoing first embodiment.

Note that, since the configuration of the phase modulation portion PM2 (i.e., the phase modulation portion PM2a) provided in the optical waveguide WO3a and the configuration of the phase modulation portion PM2 (i.e., the phase modulation portion PM2b) provided in the optical waveguide WO3b are basically the same, a description is given herein of the configuration of one of the phase modulation portions PM2. Note that, in the present second embodiment also, it may also be possible that the phase modulation portion PM2 is not provided in one of the optical waveguides WO3a and WO3b.

In the present second embodiment, each of the phase modulation portions PM2 includes the optical waveguide WO3, the semiconductor portions SM1 and SM2, and the heater (heater portion) HT. Each of the optical waveguide WO3 and the semiconductor portions SM1 and SM2 is made of the semiconductor layer SL and formed over the insulating layer CL. In the present second embodiment also, the configuration of the optical waveguide WO3 is the same as in the foregoing first embodiment.

The semiconductor portion SM1 and the semiconductor portion SM2 may be i-type regions in which no impurity ion is implanted, n-type regions in which n-type impurity ions are implanted, or p-type regions where p-type impurity ions are implanted. The semiconductor portions SM1 and SM2 are located opposite to each other relative to the optical waveguide WO3 being interposed therebetween. That is, between the semiconductor portion SM1 and the semiconductor portion SM2 which are spaced apart from each other in the Y-direction, the optical waveguide WO3 extending in the X-direction is disposed. The optical waveguide WO3, the semiconductor portion SM1, and the semiconductor portion SM2 are spaced apart from and unconnected to each other. Each of the semiconductor portion SM1 and the semiconductor portion SM2 is a detached pattern. Accordingly, to the semiconductor portions SM1 and SM2, no optical waveguide is connected so that no optical signal is transmitted thereto.

In the area AR3, the interlayer insulating film IL3 (insulating films IL1 and IL2) is formed so as to cover the optical waveguides WO3 and the semiconductor portions SM1 and SM2. Over the semiconductor portions SM1 and the semiconductor portions SM2, the respective contact holes CT extending through the interlayer insulating film IL3 (insulating films IL1 and IL2) are formed. Note that the contact holes CT formed over the semiconductor portions SM1 are referred to as the contact holes (openings) CT5, while the contact holes CT formed over the semiconductor portions SM2 are referred to as the contact holes (openings) CT6. The contact holes CT5 reach the semiconductor portions SM1 and, at the bottom portion of each of the contact holes CT5, a portion of the upper surface of the semiconductor portion SM1 is exposed. The contact holes CT6 reach the semiconductor portions SM2 and, at the bottom portion of each of the contact holes CT6, a portion of the upper surface of the semiconductor portion SM2 is exposed.

In the present second embodiment, each of the heaters HT integrally has a heater main body portion (first portion) HTa formed over the interlayer insulating film IL3 and over the optical waveguide WO3, a contact portion (second portion) CB5 formed in the contact hole CT5, and a contact portion (third portion) CB6 formed in the contact hole CT6. The heaters HT are elements for heating the optical waveguides WO3. In the present second embodiment also, the heaters HT are spaced apart and electrically insulated from the optical waveguides WO3.

The heater main body portion HTa is equivalent to the heater HT in the foregoing first embodiment. A combination of the heater HT in the foregoing first embodiment HT and the contact portions CB5 and CB6 connected integrally thereto corresponds to the heater HT in the present second embodiment. The heater main body portion HTa is disposed over the optical waveguide WO3.

The structures of the contact portions CB5 and CB6 are similar to those of the contact portions CB1, CB2, and CB3. However, the contact portions CB1, CB2, and CB3 are members (patterns) independent of each other, while the contact portions CB5 and CB6 are connected integrally to the heater main body portion HTa.

In the case shown in FIG. 31, each of the contact portions CB5 integrally has a portion extending over the upper surface of the interlayer insulating film IL3, a portion extending over the side wall of the contact hole CT5, and a portion extending over the bottom surface of the contact hole CT5. Also, each of the contact portions CB6 integrally has a portion extending over the upper surface of the interlayer insulating film IL3, a portion extending over the side wall of the contact hole CT6, and a portion extending over the bottom surface of the contact hole CT6. Accordingly, each of the heaters HT in the present second embodiment integrally has a portion extending over the upper surface of the interlayer insulating film IL3, a portion extending over the side wall of the contact hole CT5, a portion extending over the bottom surface of the contact hole CT5, a portion extending over the side wall of the contact hole CT6, and a portion extending over the bottom surface of the contact hole CT6.

In the area AR3, over the interlayer insulating film IL3, the interlayer insulating film IL4 is formed so as to cover the heaters HT, the through holes SH5 are formed in the interlayer insulating film IL4, and the conductive plugs PG5 are embedded in the through holes SH5. Over the interlayer insulating film IL4 in which the plugs PG5 are embedded, the wires M1c are formed. In the area AR3, the plugs PG5 are disposed between the wires M1c and the heaters HT (heater main body portions HTa) to electrically couple the wires M1c with the heaters HT.

Next, a description will be given of the manufacturing process of the semiconductor device in the present second embodiment shown in FIGS. 31 to 33. Note that the description will be given of the difference between the manufacturing process of the semiconductor device in the present second embodiment and the manufacturing process of the semiconductor device in the foregoing first embodiment. A repeated description of the same portion as that of the manufacturing process of the semiconductor device in the foregoing first embodiment is omitted.

In the step of patterning the semiconductor layer SL (step in FIG. 11), the semiconductor layer SL is patterned to form not only the optical waveguides WO1, WO2, WO3, and WO4 and the semiconductor portions NR, PR, and PRO, but also the semiconductor portions SM1 and SM2. Then, in the step of forming the contact holes CT (step in FIG. 16), not only the contact holes CT1, CT2, CT3, and CT4, but also the contact holes CT5 and CT6 (see FIG. 31) are formed.

Note that, when the semiconductor portions SM1 and SM2 are not formed unlike in the present second embodiment, not only the contact holes CT5 and CT6 extend through the interlayer insulating film IL3, but also the etching of the insulating layer CL undesirably proceeds at the bottom portions of the contact holes CT5 and CT6. By contrast, in the present second embodiment, the semiconductor portions SM1 and SM2 are provided and, over the semiconductor portions SM1 and SM2, the contact holes CT5 and CT6 are disposed. This can stop the etching for the contact holes CT5 and CT6 at the semiconductor portions SM1 and SM2. That is, the semiconductor portions SM1 and SM2 are not provided as regions to which voltages are to be applied or as transmission paths for light beams, but are provided so as to allow the contact holes CT5 and CT6 and the contact potions CB5 and CB6 to be reliably formed. As a result, in actuality, the contact portions CB5 are electrically coupled with the semiconductor portions SM1 and the contact portions CB6 are electrically coupled with the semiconductor portions SM2, but the electric coupling is not an essential requirement.

Then, in the step of forming the conductive film CF1 (step in FIG. 17), the conductive film CF1 is formed not only over the upper surface of the interlayer insulating film IL3 (i.e., the upper surface of the insulating film IL2), but also in the contact holes CT1, CT2, CT3, CT4, CT5, and CT6. Specifically, the conductive film CF1 is formed also over the bottom surfaces and side walls of the contact holes CT1, CT2, CT3, CT4, CT5, and CT6.

Then, in the step of patterning the conductive film CF1 (step in FIG. 18 described above), the heaters HT and the contact portions CB1, CB2, CB3, and CB4 are formed. However, in the present second embodiment, each of the heaters HT integrally has the heater main body portion HTa and the contact portions CB5 and CB6 (see FIG. 31). The heater HT is made of the patterned conductive film CF1.

The manufacturing process in the present second embodiment is otherwise substantially the same as that in the foregoing first embodiment.

In the present second embodiment, in addition to the effects obtained in the foregoing first embodiment, effects as shown below can also be obtained. That is, in the present second embodiment, each of the heaters HT integrally includes the heater main body portion HTa formed over the interlayer insulating film IL3 and over the optical waveguide WO3, the contact portion CB5 formed in the contact hole CT5, and the contact portion CB6 formed in the contact hole CT6. Consequently, in the phase modulation portions PM2, the optical waveguides WO3 are surrounded by the heaters HT. This can improve the function of heating the optical waveguides WO3 performed by the heaters HT.

On the other hand, since the present second embodiment has the contact portions CB5 and CB6, the two-dimensional size (particularly the size in the Y-direction in each of FIGS. 7 and 33) of each of the heaters HT is smaller in the foregoing first embodiment than in the present second embodiment. Accordingly, the two-dimensional size of each of the optical modulators PC2 can be set smaller in the foregoing first embodiment than in the present second embodiment. Therefore, in terms of reducing the size of the semiconductor device, the foregoing first embodiment is advantageous over the present second embodiment.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
a base;
an insulating layer formed over the base;
a first optical waveguide formed over the insulating layer;
a first semiconductor portion formed over the insulating layer;
a second semiconductor portion formed over the first semiconductor portion;
a first interlayer insulating film formed over the insulating layer such that the first interlayer insulating film covers the first optical waveguide, the first semiconductor portion, and the second semiconductor portion;
a heater portion formed over the first interlayer insulating film and over the first optical waveguide;
a first opening formed in the first interlayer insulating film, the first opening reaching a portion of the first semiconductor portion which is uncovered with the second semiconductor portion;
a second opening formed in the first interlayer insulating film, the second opening reaching the second semiconductor portion;
a first coupling electrode formed continuously over a bottom surface and a side surface of the first opening and over the first interlayer insulating film, and electrically coupled with the first semiconductor portion;
a second coupling electrode formed continuously over a bottom surface and a side surface of the second opening and over the first interlayer insulating film, and electrically coupled with the second semiconductor portion;
a second interlayer insulating film formed over the first interlayer insulating film such that the second interlayer insulating film covers the heater portion, the first coupling electrode, and the second coupling electrode, and such that respective portions of the second interlayer insulating film are embedded in the first and second openings;
a first wire, a second wire, and a third wire which are formed over the second interlayer insulating film;
a first conductive plug embedded in the second interlayer insulating film, the first conductive plug electrically coupling the heater portion with the first wire;
a second conductive plug embedded in the second interlayer insulating film, the second conductive plug electrically coupling the first coupling electrode with the second wire; and
a third conductive plug embedded in the second interlayer insulating film, the third conductive plug electrically coupling the second coupling electrode with the third wire.

2. The semiconductor device according to claim 1, wherein the first optical waveguide and the first semiconductor portion are made of silicon.

3. The semiconductor device according to claim 2, wherein the second semiconductor portion includes a germanium layer formed over the first semiconductor portion, and
wherein the first semiconductor portion and the germanium layer form a photoelectric conversion portion which converts an optical signal to an electric signal.

4. The semiconductor device according to claim 3, wherein the second semiconductor portion further includes a silicon layer formed over the germanium layer.

5. The semiconductor device according to claim 1, wherein the second conductive plug is disposed over a portion of the first coupling electrode which is located over the first interlayer insulating film, and
wherein the third conductive plug is disposed over a portion of the second coupling electrode which is located over the first interlayer insulating film.

6. The semiconductor device according to claim 1, wherein the heater portion, the first coupling electrode, and the second coupling electrode are made of the same material.

7. The semiconductor device according to claim 6, wherein the heater portion, the first coupling electrode, and the second coupling electrode are made of a titanium film, a titanium nitride film, or a multi-layer film including a titanium film and a titanium nitride film.

8. The semiconductor device according to claim 1,
wherein the first conductive plug, the second conductive plug, and the third conductive plug have the same height.

9. The semiconductor device according to claim 1,
wherein the first interlayer insulating film is made of a multi-layer film including a first insulating film and a second insulating film,
wherein the first insulating film is formed over the insulating layer such that the first insulating film covers the first optical waveguide and the first semiconductor portion,
wherein the second semiconductor portion is formed in a third opening of the first insulating film which is formed over the first semiconductor portion, and
wherein the second insulating film is formed over the first insulating film and over the second semiconductor portion.

10. The semiconductor device according to claim 1, further comprising:
a third semiconductor portion formed over the insulating layer to form a portion of an optical modulator;
a fourth opening formed in the first interlayer insulating film, the fourth opening reaching the third semiconductor portion;
a third coupling electrode formed continuously in the fourth opening and over the first interlayer insulating film and electrically coupled with the third semiconductor portion;
a fourth wire formed over the second interlayer insulating film; and
a fourth conductive plug embedded in the second interlayer insulating film, the fourth conductive plug electrically coupling the third coupling electrode with the fourth wire.

11. The semiconductor device according to claim 1, further comprising:
a fourth semiconductor portion and a fifth semiconductor portion which are formed over the insulating layer and located opposite to each other relative to the first optical waveguide interposed therebetween;
a fifth opening formed in the first interlayer insulating film, the fifth opening reaching the fourth semiconductor portion; and
a sixth opening formed in the first interlayer insulating film, the sixth opening reaching the fifth semiconductor portion,
wherein each of the fourth semiconductor portion and the fifth semiconductor portion is a detached pattern, and
wherein the heater portion integrally has a first portion formed over the first interlayer insulating film and over the first optical waveguide, a second portion formed in the fifth opening, and a third portion formed in the sixth opening.

12. A method of manufacturing a semiconductor device, comprising:
(a) providing a substrate including a base, an insulating layer formed over the base, and a semiconductor layer formed over the insulating layer;
(b) patterning the semiconductor layer to form a first optical waveguide and a first semiconductor portion;
(c) forming a second semiconductor portion formed over the first semiconductor portion and a first interlayer insulating film formed over the insulating layer so as to cover the first optical waveguide, the first semiconductor portion, and the second semiconductor portion;
(d) forming, in the first interlayer insulating film, a first opening reaching a portion of the first semiconductor portion which is uncovered with the second semiconductor portion and a second opening reaching the second semiconductor portion;
(e) forming a conductive film in the first and second openings and over the first interlayer insulating film; and
(f) patterning the conductive film to form a heater portion, a first coupling electrode, and a second coupling electrode,
wherein the heater portion is formed over the first interlayer insulating film to be located over the first optical waveguide,
wherein the first coupling electrode is formed continuously over a bottom surface and a side surface of the first opening and over the first interlayer insulating film, and electrically coupled to the first semiconductor portion, and
wherein the second coupling electrode is formed continuously over a bottom surface and a side surface of the second opening and over the first interlayer insulating film, and electrically coupled to the second semiconductor portion,
the method further comprising:
(g) forming a second interlayer insulating film over the first interlayer insulating film so as to cover the heater portion, the first coupling electrode, and the second coupling electrode, and such that respective portions of the second interlayer insulating film are embedded in the first and second openings;
(h) forming, in the second interlayer insulating film, a third opening reaching the heater portion, a fourth opening reaching the first coupling electrode, and a fifth opening reaching the second coupling electrode; and
(i) forming a first conductive plug in the third opening, forming a second conductive plug in the fourth opening, and forming a third conductive plug in the fifth opening,
wherein the semiconductor device comprises:
the base;
the insulating layer formed over the base;
the first optical waveguide formed over the insulating layer;
the first semiconductor portion formed over the insulating layer;
the second semiconductor portion formed over the first semiconductor portion;
the first interlayer insulating film formed over the insulating layer such that the first interlayer insulating film covers the first optical waveguide, the first semiconductor portion, and the second semiconductor portion;
the heater portion formed over the first interlayer insulating film and over the first optical waveguide;
the first opening formed in the first interlayer insulating film, the first opening reaching a portion of the first semiconductor portion which is uncovered with the second semiconductor portion;
the second opening formed in the first interlayer insulating film, the second opening reaching the second semiconductor portion;
the first coupling electrode formed continuously over a bottom surface and a side surface of the first opening and over the first interlayer insulating film, and electrically coupled with the first semiconductor portion;

the second coupling electrode formed continuously over a bottom surface and a side surface of the second opening and over the first interlayer insulating film, and electrically coupled with the second semiconductor portion;

the second interlayer insulating film formed over the first interlayer insulating film such that the second interlayer insulating film covers the heater portion, the first coupling electrode, and the second coupling electrode, and such that respective portions of the second interlayer insulating film are embedded in the first and second openings;

a first wire, a second wire, and a third wire which are formed over the second interlayer insulating film;

the first conductive plug embedded in the second interlayer insulating film, the first conductive plug electrically coupling the heater portion with the first wire;

the second conductive plug embedded in the second interlayer insulating film, the second conductive plug electrically coupling the first coupling electrode with the second wire; and the third conductive plug embedded in the second interlayer insulating film, the third conductive plug electrically coupling the second coupling electrode with the third wire.

13. The method of manufacturing the semiconductor device according to claim 12, further comprising:

(j) after (i), forming, over the second interlayer insulating film, the first wire electrically coupled to the heater portion via the first conductive plug, the second wire electrically coupled to the first coupling electrode via the second conductive plug, and the third wire electrically coupled to the second coupling electrode via the third conductive plug.

14. The method of manufacturing the semiconductor device according to claim 12, wherein (c) includes:

(c1) forming a first insulating film over the insulating layer so as to cover the first optical waveguide and the first semiconductor portion;

(c2) forming a sixth opening in the first insulating film;

(c3) forming the second semiconductor portion over a portion of the first semiconductor portion which is exposed from the sixth opening; and (c4) forming a second insulating film over the first insulating film so as to cover the second semiconductor portion, wherein the first interlayer insulating film is made of a multi-layer film including the first insulating film and the second insulating film, and wherein, in (d), the first opening is formed in the first and second insulating films, while the second opening is formed in the second insulating film.

15. The method of manufacturing the semiconductor device according to claim 12, wherein the semiconductor layer is made of silicon.

16. The method of manufacturing the semiconductor device according to claim 15, wherein the second semiconductor portion includes a germanium layer formed over the first semiconductor portion, and wherein the first semiconductor portion and the germanium layer form a photoelectric conversion portion which converts an optical signal to an electric signal.

17. The method of manufacturing the semiconductor device according to claim 12, wherein the second conductive plug is disposed over a portion of the first coupling electrode which is located over the first interlayer insulating film, and wherein the third conductive plug is disposed over a portion of the second coupling electrode which is located over the first interlayer insulating film.

18. The method of manufacturing the semiconductor device according to claim 12, wherein the conductive film is made of a titanium film, a titanium nitride film, or a multi-layer film including a titanium film and a titanium nitride film.

19. The method of manufacturing the semiconductor device according to claim 12, wherein the third opening, the fourth opening, and the fifth opening have the same depth.

20. The method of manufacturing the semiconductor device according to claim 12, wherein, in (b), the semiconductor layer is patterned to form the first optical waveguide, the first semiconductor portion, and a third semiconductor portion, wherein the third semiconductor portion forms a portion of an optical modulator, wherein, in (d), the first opening, the second opening, and a seventh opening reaching the third semiconductor portion are formed in the first interlayer insulating film, wherein, in (e), the conductive film is formed in the first, second, and seventh openings and over the first interlayer insulating film, wherein, in (f), the conductive film is patterned to form the heater portion, the first coupling electrode, the second coupling electrode, and a third coupling electrode, wherein the third coupling electrode is formed continuously in the seventh opening and over the first interlayer insulating film and electrically coupled to the third semiconductor portion, wherein, in (g), the second interlayer insulating film is formed over the first interlayer insulating film so as to cover the heater portion, the first coupling electrode, the second coupling electrode, and the third coupling electrode, wherein, in (h), the third opening, the fourth opening, the fifth opening, and an eighth opening reaching the third coupling electrode are formed in the second interlayer insulating film, and wherein, in (i), the first conductive plug is formed in the third opening, the second conductive plug is formed in the fourth opening, the third conductive plug is formed in the fifth opening, and a fourth conductive plug is formed in the eighth opening.

* * * * *